(12) United States Patent
Kinoshita et al.

(10) Patent No.: US 8,129,897 B2
(45) Date of Patent: Mar. 6, 2012

(54) ORGANIC ELECTROLUMINESCENCE ELEMENT

(75) Inventors: Masaru Kinoshita, Kanagawa (JP); Manabu Tobise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 3 days.

(21) Appl. No.: 12/178,455

(22) Filed: Jul. 23, 2008

(65) Prior Publication Data
US 2009/0026939 A1 Jan. 29, 2009

(30) Foreign Application Priority Data
Jul. 27, 2007 (JP) ................................ 2007-196675

(51) Int. Cl.
*H01L 51/50* (2006.01)
(52) U.S. Cl. ....................................................... 313/504
(58) Field of Classification Search ................... 313/504
See application file for complete search history.

(56) References Cited

U.S. PATENT DOCUMENTS

| | | | | |
|---|---|---|---|---|
| 2002/0086180 A1* | 7/2002 | Seo et al. | ........................ | 428/690 |
| 2002/0093283 A1* | 7/2002 | Seo et al. | ........................ | 313/504 |
| 2002/0121860 A1* | 9/2002 | Seo et al. | ........................ | 313/506 |
| 2005/0168137 A1* | 8/2005 | Adamovich et al. | .......... | 313/504 |
| 2006/0063030 A1* | 3/2006 | Deaton et al. | ................. | 428/690 |
| 2007/0057630 A1 | 3/2007 | Nishita et al. | | |

FOREIGN PATENT DOCUMENTS

| | | |
|---|---|---|
| JP | 6-310275 A | 11/1994 |
| JP | 2001-189193 A | 7/2001 |
| JP | 2002-313583 A | 10/2002 |
| JP | 2003-123984 A | 4/2003 |
| JP | 2007-110102 A | 4/2007 |

OTHER PUBLICATIONS

Graded mixed-layer organic light-emitting devices, Chwang et al. Applied Physics Letters, vol. 80, No. 5, p. 725-727, Feb. 4, 2002.*
Kido et al., 'Multilayer White Light-Emitting Organic Electroluminescent Device', "Science", vol. 267, No. 3, pp. 1332-1334, (1995).
Japanese Office Action for Application No. 2007-196675 dated Sep. 27, 2011 (with English translation).

* cited by examiner

*Primary Examiner* — Toan Ton
*Assistant Examiner* — Andrew Coughlin
(74) *Attorney, Agent, or Firm* — Birch, Stewart, Kolasch & Birch, LLP

(57) ABSTRACT

The present invention provides an organic electroluminescence element having at least a light-emitting layer disposed between a pair of electrodes, wherein the light-emitting layer includes at least two electron transporting materials and a hole transporting host material, with at least one of the electron transporting materials being an electron transporting light-emitting material, and a total concentration of the at least two electron transporting materials in the light-emitting layer decreases from a cathode side toward an anode side.

8 Claims, 2 Drawing Sheets

ORGANIC ELECTROLUMINESCENCE ELEMENT

CROSS-REFERENCE TO RELATED APPLICATION

This application claims priority under 35 USC 119 from Japanese Patent Application No. 2007-196675, the disclosure of which is incorporated by reference herein.

BACKGROUND OF THE INVENTION

1. Field of the Invention

The present invention relates to an organic electroluminescence element. In particular, the invention relates to an organic electroluminescence element with high light-emission efficiency and excellent durability.

2. Description of the Related Art

An organic electroluminescence element (hereinafter, referred to as an "organic EL element" in some cases) is composed of a light-emitting layer or a plurality of organic functional layers containing a light-emitting layer, and a pair of electrodes sandwiching these layers. The organic EL element is a device for obtaining luminescence by utilizing at least either one of luminescence from excitons each of which is obtained by recombining an electron injected from a cathode with a hole injected from an anode to produce the exciton in the light-emitting layer, or luminescence from excitons of other molecules produced by energy transmission from at least one of the above-described excitons.

Heretofore, an organic EL element has been developed by using a laminate structure from integrated layers in which each layer is functionally differentiated, whereby brightness and device efficiency are remarkably improved. For example, "Science", vol. 267, No. 3, page 1332, (1995) discloses a two-layer laminated type device obtained by laminating a hole transport layer and a light-emitting layer also functioning as an electron transport layer; a three-layer laminated type device obtained by laminating a hole transport layer, a light-emitting layer, and an electron transport layer; and a four-layer laminated type device obtained by laminating a hole transport layer, a light-emitting layer, a hole blocking layer, and an electron transport layer.

However, many problems still remain for putting organic EL elements to practical use. First, there is a need to attain high light-emission efficiency, and second, there is a need to attain high drive durability. In particular, deterioration in quality during continuous driving is a most significant problem.

For example, Japanese Patent Application Laid-Open (JP-A) No. 2003-123984 discloses an attempt to dispose an interface layer of 0.1 nm to 5 nm as a barrier layer between a light-emitting layer and a hole transport layer and retard the migration of holes, to thereby control the migration balance between holes and electrons and enhance the external quantum efficiency. However, this means potentially involves a problem of lowering the brightness and increasing the driving voltage since the migration of all of the carriers is lowered, as well as a problem of lowering the drive durability, since the time that the carriers stay in the device is made longer.

Further, a configuration in which light emitting units each containing a light-emitting layer and a functional layer are stacked in a multi-layer structure (which is referred to as "multi-photon") is known. For example, JP-A No. 6-310275 discloses a configuration in which plural light-emitting units including an organic electroluminescence element are isolated by an insulating layer, and opposing electrodes are provided for each of the light emitting units. However, in this configuration, since the insulating layer and the electrode between the light emitting units hinder the extraction of emitted light, the light emitted from each of the light-emitting units cannot substantially be utilized sufficiently. Further, this is not a means for improving the low external quantum efficiency inherent to each of the light emitting units.

In the case of a polymer dispersion type light-emitting element, since a light-emitting layer generally has a monolayer configuration, light-emitting sites are dispersed in the light-emitting layer. Therefore, there has been a problem in that it is difficult to achieve a balance between injection and transport of a hole and an electron, whereby the recombination efficiency is reduced. As a means for improving this problem, JP-A No. 2001-189193 discloses that in a light-emitting layer, both the concentration of a light-emitting material and the concentration of a charge transport material are made low on the anode side and high on the cathode side, respectively, thereby causing light emission concentratedly in a region on the cathode side. Though this means is effective against peculiar problems in the polymer dispersion type light-emitting element, the light-emitting region is located in only a part of the region on the cathode side, and the whole of the light-emitting layer is not effectively utilized. Therefore, it may be said that this is not an overall enhancement of the light-emission efficiency.

Also, in the case where an organic EL element is of a laminate structure, carrier injectability is reduced due to a barrier between the respective layers, and there are problems of an increase in driving voltage and a reduction in durability. As a means for reducing such a barrier between the respective layers, JP-A No. 2002-313583 proposes to provide a gradation in the concentration of a hole injection material, an electron injection material, a hole transport material or an electron transport material, contained in the respective layers. In such a configuration, a light-emitting material in a light-emitting layer is disposed in a restricted region in the light-emitting layer which is formed of a bipolar mixed layer. Even in this configuration, light emission takes place only in the restricted region where the light-emitting material is disposed.

In designing a practically useful organic EL element, it is an extremely important problem to make high external quantum efficiency and high drive durability compatible with each other. This problem is a problem which is always required to be improved.

SUMMARY OF THE INVENTION

The present invention has been made in view of the above circumstances and provides an organic electroluminescence element with the following aspect.

An aspect of the invention provides an organic electroluminescence element having at least a light-emitting layer disposed between a pair of electrodes, wherein the light-emitting layer includes at least two electron transporting materials and a hole transporting host material, with at least one of the electron transporting materials being an electron transporting light-emitting material, and a total concentration of the at least two electron transporting materials in the light-emitting layer decreases from a cathode side toward an anode side.

The view shows a pattern in an inventive organic EL element No. 1 of Example 1.

Figure 2:
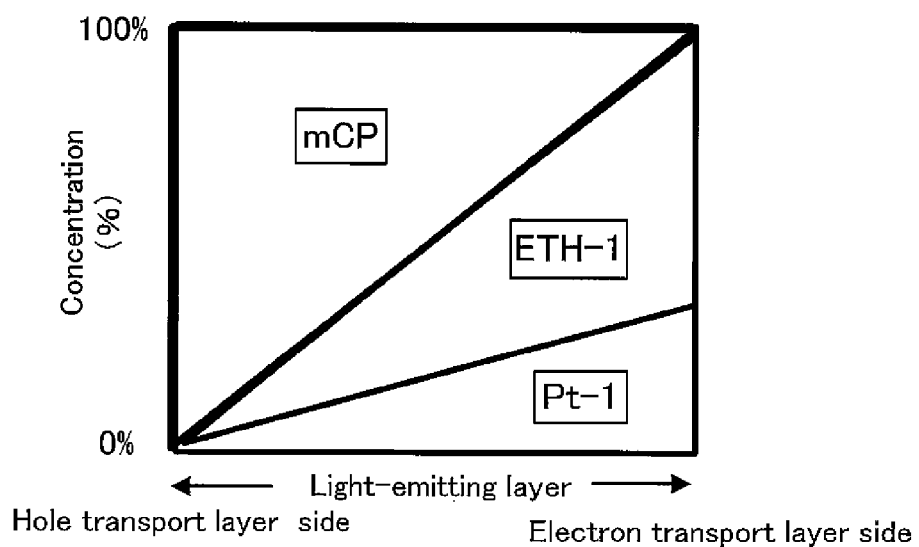

FIG. 2 is a conceptual view showing a concentration distribution of a light-emitting material and a host material in a light-emitting layer.

The view shows a pattern in an inventive organic EL element No. 2 of Example 1.

Figure 3:
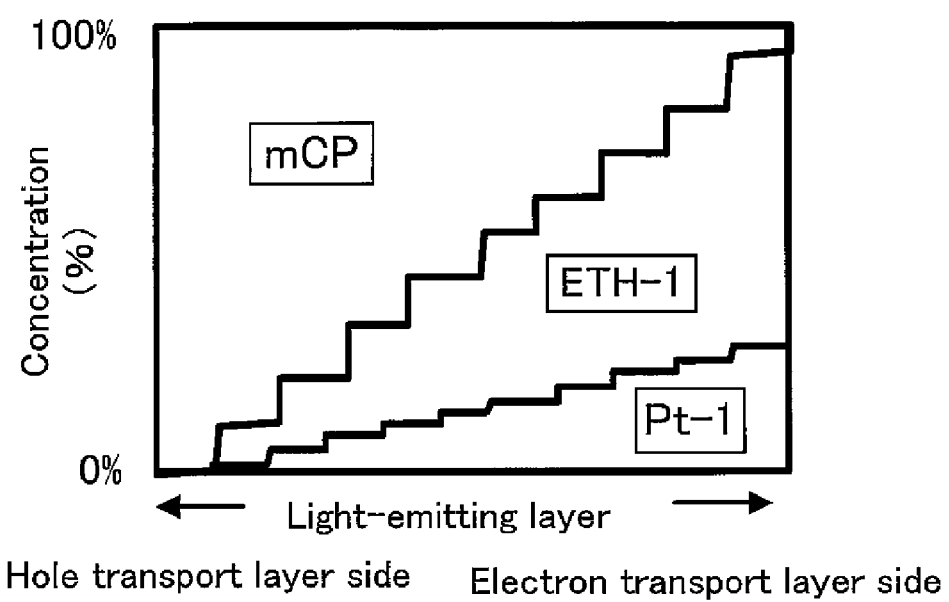

FIG. 3 is a conceptual view showing a concentration distribution of a light-emitting material and a host material in a light-emitting layer.

The view shows a pattern in an inventive organic EL element No. 5 of Example 4.

DETAILED DESCRIPTION OF THE INVENTION

An object of the present invention is to provide an organic EL element with high light-emission efficiency and excellent durability.

The object of the present invention described above has been solved by an organic electroluminescence element including at least a light-emitting layer disposed between a pair of electrodes, wherein the light-emitting layer includes at least two electron transporting materials and a hole transporting host material, with at least one of the electron transporting materials being an electron transporting light-emitting material, and a total concentration of the at least two electron transporting materials in the light-emitting layer decreases from a cathode side toward an anode side.

Preferably, the at least two electron transporting materials comprise the electron transporting light-emitting material and an electron transporting host material, and a ratio of a total concentration of the electron transporting light-emitting material and the electron transporting host material in an interface region of the light-emitting layer on the anode side relative to a total concentration of the electron transporting light-emitting material and the electron transporting host material in an interface region of the light-emitting layer on the cathode side (total concentration of electron transporting light-emitting material and electron transporting host material in interface region of light-emitting layer on anode side/ total concentration of electron transporting light-emitting material and electron transporting host material in interface region of light-emitting layer on cathode side) is from 0% to 50%.

Preferably, the total concentration of the electron transporting light-emitting material and the electron transporting host material is 30% by weight or less in the interface region of the light-emitting layer on the anode side.

Preferably, the total concentration of the electron transporting light-emitting material and the electron transporting host material is 30% by weight or more in the interface region of the light-emitting layer on the cathode side.

Preferably, the electron transporting light-emitting material is a phosphorescent light-emitting material.

Preferably, the phosphorescent light-emitting material is a metal complex having a tri- or higher-dentate ligand.

Preferably, the hole transporting host material is a carbazole derivative or an indole derivative.

Preferably, the hole transporting host material is 1,3-bis (carbazole-9-yl)benzene or a derivative thereof.

Preferably, the electron transporting host material is an azole derivative or an azine derivative.

Preferably, a peak wavelength of an emission spectrum is 430 nm or more, and less than 480 nm.

According to the invention, an organic EL element having high light-emission efficiency and excellent durability is provided.

Particularly, an organic EL element including a phosphorescent light-emitting material, having high light-emission efficiency, with no lowering of the light-emission efficiency even in a high current region, and having high light-emission efficiency in a wide range of current regions from a low current region to a high current region and excellent drive durability is provided.

The organic EL element of the invention is an organic electroluminescence element comprising at least a light-emitting layer between a pair of electrodes, wherein the light-emitting layer contains at least two electron transporting materials and a hole transporting host material, with at least one of the electron transporting materials being an electron transporting light-emitting material, and a total concentration of the at least two electron transporting materials in the light-emitting layer decreases from the cathode side toward the anode side.

A concentration gradation of the total concentration of the electron transporting materials is preferably such that the total concentration of the electron transporting materials in an interface region of the light-emitting layer on the anode side is from 0% to 50% relative to the total concentration of the electron transporting materials in the interface region on the cathode side, and more preferably from 0% to 20%.

In the specification of this application, the term "interface region of the light-emitting layer on the cathode side" is defined to refer to a region extending to a thickness, of 10% of the thickness of the whole of the light-emitting layer from the interface on the cathode side of the light-emitting layer; and the term "interface region of the light-emitting layer on the anode side" is defined to refer to a region extending to a thickness of 10% of the thickness of the whole of the light-emitting layer from the interface on the anode side of the light-emitting layer. Also, the concentration in that region is defined to refer to an average concentration in that region. Further, the concentration of each of the materials in the "interface region of the light-emitting layer on the cathode (or anode) side" can be measured by a method, for example, of time-of-flight secondary ion mass spectrometry (TOF-SIMS) or etching X-ray photoelectron spectroscopic analysis (XPS/ ESCA), etc.

In the invention, the term "concentration gradation" means that the concentration decreases or increases on the whole. The concentration may change continuously, or may change stepwise or in a wave-like manner. Alternatively, for example, in the case of a decreasing concentration gradation, even when a region where the concentration locally increases in the layer exists, the case where a generally decreasing concentration gradation is present should be construed to fall within the intended scope of this application.

As a result, in the invention, since the light-emitting layer uniformly emits light over the entire region of the light-emitting layer, the light-emission efficiency is improved, and further, a distribution of light-emission approaches that of an entire region emission which improves the durability. According to the gradation structure of the invention, it is considered that a mobility of electrons injected from a cathode to the light-emitting layer is suppressed as the electrons proceed toward the anode, and, as a result, recombination of holes and electrons that conventioally occurred only on a cathode side of the light-emitting layer occurs even in the central portion of the light-emitting layer. Heretofore, while JP-A No. 2002-313583, for example, proposes to provide a gradation in the concentration in each of the layers of a hole injection material, an electron injection material, a hole transporting material, or an electron transporting material contained in each of the layers as a means for reducing a barrier between each of the layers, it could not have been anticipated at all from the existent knowledge that light emission is possible over the entire region of the light-emitting layer to improve the light-emission efficiency and, at the same time, improve the drive durability, by providing gradation in the total concentration of the electron transporting materials in the light-emitting layer.

The total concentration of the electron transporting materials in an interface region of the light-emitting layer on the anode side is preferably 30% by weight or less, more preferably 25% by weight or less, and further preferably 20% by weight or less.

The total concentration of the electron transporting materials in an interface region of the light-emitting layer on the cathode side is preferably 30% by weight or more, more preferably 60% by weight or more, and even more preferably 80% by weight or more.

In the case where the total concentration of the electron transporting materials in the light-emitting layer exceeds 30% by weight in the interface region on the anode side, the amount of electrons coming out from the light-emitting layer to the anode side increases to lower the light-emission efficiency, which is not preferred. Further, in the case where the total concentration of the electron transporting materials in the light-emitting layer is lower than 30% by weight in the interface region on the cathode side, the amount of holes coming out from the light-emitting layer to the cathode side increases to lower the light-emission efficiency, which is not preferred.

Preferably, the electron transporting light-emitting material is a phosphorescent light-emitting material.

Preferably, the hole transporting host material in the present invention is a carbazole derivative or an indole derivative. More preferably, the hole transporting host material is mCP (1,3-bis(carbazole-9-yl)benzene) or a derivative thereof.

Preferably, the light-emitting material in the present invention is a blue light-emitting material.

1. Constitution of Organic EL Element

As an integration pattern of the organic compound layer according to the present invention, it is preferred that the layer includes a hole transport layer, a light-emitting layer, and an electron transport layer in this order from the anode side. Moreover, at least one of a hole injection layer between the hole transport layer and the anode or an electron transport intermediate layer between the light-emitting layer and the electron transport layer is provided. In addition, a hole transporting intermediate layer may be provided between the light-emitting layer and the hole transport layer, and similarly, an electron injection layer may be provided between the cathode and the electron transport layer.

The preferred modes of the organic compound layer in the organic electroluminescence element of the present invention are as follows. (1) An embodiment having a hole injection layer, a hole transport layer (the hole injection layer may also have the role of the hole transport layer), a hole transporting intermediate layer, a light-emitting layer, an electron transport layer, and an electron injection layer (the electron transport layer may also have the role of the electron injection layer) in this order from the anode side; (2) an embodiment having a hole injection layer, a hole transport layer (the hole injection layer may also have the role of the hole transport layer), a light-emitting layer, an electron transporting intermediate layer, an electron transport layer, and an electron injection layer (the electron transport layer may also have the role of the electron injection layer) in this order from the anode side; and (3) an embodiment having a hole injection layer, a hole transport layer (the hole injection layer may also have the role of the hole transport layer), a hole transporting intermediate layer, a light-emitting layer, an electron transporting intermediate layer, an electron transport layer, and an electron injection layer (the electron transport layer may also have the role of the electron injection layer) in this order from the anode side.

The above-described hole transporting intermediate layer preferably has at least either a function for accelerating the injection of holes into the light-emitting layer, or a function for blocking electrons.

Furthermore, the above-described electron transporting intermediate layer preferably has at least either a function for accelerating the injection of electrons into the light-emitting layer, or a function for blocking holes.

Moreover, at least one of the above-described hole transporting intermediate layer or the electron transporting intermediate layer preferably has a function for blocking excitons produced in the light-emitting layer.

In order to realize effectively the functions for accelerating the injection of holes, or the injection of electrons, and the functions for blocking holes, electrons, or excitons, it is preferred that the hole transporting intermediate layer and the electron transporting intermediate layer are adjacent to the light-emitting layer.

The respective layers mentioned above may be separated into a plurality of secondary layers.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode stacked to each other are provided. The light generated in the light-emitting layer repeats reflection and conducts oscillation between the multi-layered film mirror and the metal electrode as reflection plates.

In another preferred embodiment of the resonator structure, a transparent or semi-transparent electrode and a metal electrode function respectively as reflection plates on a transparent substrate in which light generated in the light-emitting layer repeats reflection and conducts oscillation therebetween.

For forming the resonance structure, an optical channel length determined based on the effective refractive index of two reflection plates, and the refractive index and the thickness of each of the layers between the reflection plates are controlled to optimal values for obtaining a desired resonance wavelength. A calculation formula in the case of the first embodiment is described in the specification of JP-A No. 9-180883, and the calculation formula in the case of the second embodiment is described in the specification of JP-A No. 2004-127795.

The respective layers constituting the organic compound layer can be suitably formed in accordance with any of a dry film-forming method such as a vapor deposition method or a sputtering method; a transfer method; a printing method; a coating method; an ink-jet method; or a spray method.

Hereinafter, the constituent components of the organic EL element of the invention are described in detail.

2. Light-Emitting Layer

The light-emitting layer is a layer having a function for receiving holes from the anode, the hole injection layer, the hole transport layer or the hole transporting intermediate layer, and receiving electrons from the cathode, the electron injection layer, the electron transport layer, or the electron transporting intermediate layer, and for providing a field for recombination of the holes with the electrons to emit a light.

The light-emitting layer in the present invention is characterized in that it includes at least two electron transporting materials, with at least one of the electron transporting materials being an electron transporting light-emitting material, and further includes a hole transporting host material; and a total concentration of the at least two electron transporting materials in the light-emitting layer decreases from a cathode side toward an anode side. Preferably, the electron transporting materials in the present invention include the electron transporting light-emitting material and an electron transporting host material.

(Electron Transporting Light-Emitting Material)

Among the at least two electron transporting materials, at least one of the electron transporting materials is a light-emitting material. Preferably, the electron transporting light-emitting material used in the present invention is a phosphorescent light-emitting material.

The phosphorescent light-emitting material used in the present invention is not particularly limited, but an ortho-metal complex or a porphyrin metal complex is preferred.

The ortho-metal complex referred to herein is a generic designation of a group of compounds described in, for instance, Akio Yamamoto, *Yuki Kinzoku Kagaku, Kiso to Oyo* ("*Organometallic Chemistry, Fundamentals and Applications*") (Shokabo, 1982), pages 150 and 232, and H. Yersin, *Photochemistry and Photophysics of Coordination Compounds* (Springer-Verlag, 1987), pages 71-77 and pages 135-146. The ortho-metal complex can be advantageously used as a light-emitting material because high brightness and excellent external quantum efficiency can be obtained.

As a ligand that forms the ortho-metal complex, various ligands can be cited and are described in the above-mentioned literature as well. Examples of preferable ligands include a 2-phenylpyridine derivative, a 7,8-benzoquinoline derivative, a 2-(2-thienyl)pyridine derivative, a 2-(1-naphtyl)pyridine derivative and a 2-phenylquinoline derivative. The derivatives may be substituted by a substituent as needs arise. Furthermore, the ortho-metal complex may have other ligands than the ligands mentioned above.

The ortho-metal complex used in the present invention can be synthesized according to various known processes such as those described in Inorg. Chem., 1991, vol. 30, page 1685; Inorg. Chem., 1988, vol. 27, page 3464; Inorg. Chem., 1994, vol. 33, page 545; Inorg. Chim. Acta, 1991, vol. 181, page 245; J. Organomet. Chem., 1987, vol. 335, page 293 and J. Am. Chem. Soc., 1985, vol. 107, pages 14 to 31.

Among the ortho-metal complexes, compounds which emit light from a triplet exciton can be preferably employed in the present invention from the viewpoint of improving external quantum efficiency.

Furthermore, among the porphyrin metal complexes, a porphyrin platinum complex is preferable.

The phosphorescent light-emitting materials may be used alone or in a combination of two or more of them. Furthermore, a fluorescent light-emitting material and a phosphorescent light-emitting material may be simultaneously used.

The electron transporting phosphorescent light-emitting material used in the present invention is particularly preferably a metal complex having a tri- or higher-dentate ligand.

The metal complex having a tri- or higher-dentate ligand used in the present invention is to be described.

An atom which coordinates to a metal ion in the metal complex is not particularly limited, but examples thereof preferably include an oxygen atom, a nitrogen atom, a carbon atom, a sulfur atom and a phosphorus atom, more preferably an oxygen atom, a nitrogen atom and a carbon atom, and even more preferably a nitrogen atom and a carbon atom.

The metal ion in the metal complex is not particularly limited, but a transition metal ion or a rare earth metal ion is preferable from the viewpoints of improving light-emission efficiency, improving durability and lowering driving voltage. More preferred is an iridium ion, a platinum ion, a gold ion, a rhenium ion, a tungsten ion, a rhodium ion, a ruthenium ion, an osmium ion, a palladium ion, a silver ion, a copper ion, a cobalt ion, a zinc ion, a nickel ion, a lead ion, an aluminum ion, a gallium ion or a rare earth metal ion (for example, a europium ion, a gadolinium ion, a terbium ion or the like), and even more preferred is an iridium ion, a platinum ion, a gold ion, a rhenium ion, a tungsten ion, a palladium ion, a zinc ion, an aluminum ion, a gallium ion, a europium ion, a gadolinium ion or a terbium ion. In the case where the metal complex is used for a light-emitting material, an iridium ion, a platinum ion, a rhenium ion, a tungsten ion, a europium ion, a gadolinium ion or a terbium ion is particularly preferred. In the case where the metal complex is used for a charge transporting material or a host material in a light-emitting layer, an iridium ion, a platinum ion, a palladium ion, a zinc ion, an aluminum ion or a gallium ion is particularly preferred.

The metal complex having a tri- or higher-dentate ligand in the present invention is preferably a metal complex having a tridentate to hexadentate ligand from the viewpoints of improving light-emission efficiency and durability. In the case where a metal ion is capable of forming a hexadentate ligand exemplified by an iridium ion, a metal complex having a tridentate ligand, a tetradentate ligand or a hexadentate ligand is preferable. In the case where a metal ion is capable of forming a tetradentate ligand exemplified by a platinum ion, a metal complex having a tridentate ligand or a tetradentate ligand is preferable, and a metal complex having a tetradentate ligand is more preferable.

The ligand of the metal complex in the present invention is preferably a chain ligand or cyclic ligand from the viewpoints of improving light-emission efficiency and improving durability. More preferred is a ligand having at least one nitrogen-containing heterocyclic ring which coordinates to a central metal (for example, $M^{11}$ in the compound represented by the formula (I) described below) through a nitrogen atom. Examples of the nitrogen-containing heterocyclic ring include a pyridine ring, a quinoline ring, a pyrimidine ring, a pyrazine ring, a pyrrole ring, an imidazole ring, a pyrazole ring, an oxazole ring, a thiazole ring, an oxadiazole ring, a thiadiazole ring, a triazole ring and the like. Among them, a 6-membered or a 5-membered nitrogen-containing heterocyclic ring is more preferred. The heterocyclic ring may form a condensed ring with another ring.

The chain ligand in the metal complex is defined as a ligand having no cyclic structure in the metal complex (for example, a ter-pyridyl ligand, 2,6-di-phenylpyridine ligand or the like). The cyclic ligand of the metal complex is defined to indicate that plural ligands in the metal complex combine with each other to form a closed structure (for example, a phthalocyanine ligand, a crown ether ligand and the like).

The metal complex in the present invention is preferably a compound represented by formula (I), (II) or (III), which are described below in detail.

In the first place, the compound represented by formula (I) is to be described.

Formula (I)

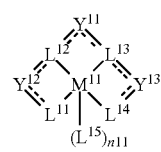

In the formula (I), $M^{11}$ represents a metal ion. $L^{11}$ to $L^{15}$ each represent a ligand which coordinates to $M^{11}$. An additional atomic group may exist among $L^{11}$ to $L^{14}$ to form a cyclic ligand. $L^{15}$ may combine with both $L^{11}$ and $L^{14}$ to form a cyclic ligand. $Y^{11}$, $Y^{12}$ and $Y^{13}$ each represent a linking group, a single bond or a double bond. In the case where $Y^{11}$, $Y^{12}$ and $Y^{13}$ each represent a linking group, the bond between $L^{11}$ and $Y^{12}$, and $L^{12}$, $L^{12}$ and $Y^{11}$, $Y^{11}$ and $L^{13}$, $L^{13}$ and $Y^{13}$, and $Y^{13}$ and $L^{14}$ each independently represent a single bond or a double bond. $n^{11}$ represents an integer of from 0 to 4. The bond between $M^{11}$ and $L^{11}$ to $L^{15}$ each may be a coordinate bond, an ionic bond or a covalent bond.

The compound represented by formula (I) is to be described in detail.

In formula (I), $M^{11}$ represents a metal ion. The metal ion is not particularly limited, but a divalent or trivalent metal ion is preferred. Examples of the divalent or trivalent metal ion preferably include a platinum ion, an iridium ion, a rhenium ion, a palladium ion, a rhodium ion, a ruthenium ion, a copper ion, a europium ion, a gadolinium ion and a terbium ion, more preferably a platinum ion, an iridium ion and a europium ion, and even more preferably a platinum ion and an iridium ion. Among them, a platinum ion is particularly preferred.

In formula (I), $L^{11}$, $L^{12}$, $L^{13}$ and $L^{14}$ each independently represent a ligand which coordinates to $M^{11}$. Examples of the atom which is contained in $L^{11}$, $L^{12}$, $L^{13}$ and $L^{14}$ and coordinates to $M^{11}$ preferably include a nitrogen atom, an oxygen atom, a sulfur atom, a carbon atom and a phosphorus atom, more preferably a nitrogen atom, an oxygen atom, a sulfur atom and a carbon atom, and even more preferably a nitrogen atom, an oxygen atom and a carbon atom.

The bond formed by $M^{11}$ and $L^{11}$, $L^{12}$, $L^{13}$ or $L^{14}$ may each independently be a covalent bond, an ionic bond or a coordinate bond. The term ligand in the present invention may include, for the sake of explanation, those formed by an ionic bond or a covalent bond besides a coordinate bond.

The ligand formed by $L^{11}$, $Y^{12}$, $L^{12}$, $Y^{11}$, $L^{13}$, $Y^{13}$ and $L^{14}$ is preferably an anionic ligand, wherein at least one anion is bonded to the metal. A number of the anion in the anionic ligand is preferably 1 to 3, more preferably 1 or 2, and even more preferably 2.

$L^{11}$, $L^{12}$, $L^{13}$ or $L^{14}$ which coordinates to $M^{11}$ through a carbon atom is not particularly limited, but examples thereof include independently an imino ligand, an aromatic carbon ring ligand (for example, a benzene ligand, a naphthalene ligand, an anthracene ligand, a phenanthrene ligand and the like), and a heterocyclic ligand (for example, a furan ligand, a thiophene ligand, a pyridine ligand, a pyrazine ligand, a pyrimidine ligand, a thiazole ligand, an oxazole ligand, a pyrrole ligand, an imidazole ligand, a pyrazole ligand, a condensed ring ligand body thereof (for example, a quinoline ligand, a benzothiazole ligand and the like) and a tautomor thereof.

$L^{11}$, $L^{12}$, $L^{13}$ or $L^{14}$ which coordinates to $M^{11}$ through a nitrogen atom is not particularly limited, but examples thereof include independently a nitrogen-containing heterocyclic ligand (for example, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, a condensed ring ligand body thereof (for example, a quinoline ligand, a benzoxazole ligand, a benzimidazole ligand and the like) and a tautomer thereof (the tautomer in the present invention is defined that the following examples are also regarded as the tautomer. For example, a 5-membered heterocyclic ligand of Compound (24) exemplified in Compound number [KA 24], a terminal 5-membered heterocyclic ligand of Compound (64) exemplified in Compound number [KA 28] and a 5-membered heterocyclic ligand of Compound (145) exemplified in Compound number [KA 37] in JP-A No. 2007-103493 are defined to be included in a pyrrole tautomer), and an amino ligand (an alkylamino ligand (having preferably 2 to 30 carbon atoms, more preferably 2 to 20 carbon atoms, and even more preferably 2 to 10 carbon atoms; for example, methylamino and the like), an arylamino ligand (for example, phenylamino and the like), an acylamino ligand (having preferably 2 to 30 carbon atoms, more preferably 2 to 20 carbon atoms, and even more preferably from 2 to 10 carbon atoms; for example, acetylamino, benzoylamino and the like), an alkoxycarbonylamino ligand (having preferably 2 to 30 carbon atoms, more preferably 2 to 20 carbon atoms, and even more preferably 2 to 12 carbon atoms; for example, methoxycarbonylamino and the like), an aryloxycarbonylamino ligand (having preferably 7 to 30 carbon atoms, more preferably 7 to 20 carbon atoms, and even more preferably 7 to 12 carbon atoms; for example, phenyloxycarbonylamino and the like), a sulfonylamino ligand (having preferably 1 to 30 carbon atoms, more preferably 1 to 20 carbon atoms, and even more preferably 1 to 12 carbon atoms; for example, methanesulfonylamino, benzenesulfonylamino and the like), an imino ligand and the like). These ligands may be further substituted.

$L^{11}$, $L^{12}$, $L^{13}$ or $L^{14}$ which coordinates to $M^{11}$ through an oxygen atom is not particularly limited, but examples thereof include independently an alkoxy ligand (having preferably 1 to 30 carbon atoms, more preferably 1 to 20 carbon atoms, and even more preferably 1 to 10 carbon atoms; for example, methoxy, ethoxy, butoxy, 2-ethylhexyloxy and the like), an aryloxy ligand (having preferably 6 to 30 carbon atoms, more preferably 6 to 20 carbon atoms, and even more preferably 6 to 12 carbon atoms; for example, phenyloxy, 1-naphthyloxy, 2-naphtyloxy and the like), a heterocyclic oxy ligand (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy and the like), an acyloxy ligand (having preferably 2 to 30 carbon atoms, more preferably 2 to 20 carbon atoms, and even more preferably 2 to 10 carbon atoms; for example, acetoxy, benzoyloxy and the like), a silyloxy ligand (having preferably 3 to 40 carbon atoms, more preferably 3 to 30 carbon atoms, and even more preferably 3 to 24 carbon atoms; for example, trimethylsilyloxy, triphenylsilyloxy and the like), a carbonyl ligand (for example, a ketone ligand, an ester ligand, an amido ligand and the like), and an ether ligand (for example, a dialkylether ligand, a diarylether ligand, a furyl ligand and the like). These ligands may be further substituted.

$L^{11}$, $L^{12}$, $L^{13}$ or $L^{14}$ which coordinates to $M^{11}$ through a sulfur atom is not particularly limited, but examples thereof include independently an alkylthio ligand (having preferably 1 to 30 carbon atoms, more preferably 1 to 20 carbon atoms, and even more preferably 1 to 12 carbon atoms; for example, methylthio, ethylthio and the like), an arylthio ligand (having preferably 6 to 30 carbon atoms, more preferably 6 to 20 carbon atoms, and even more preferably 6 to 12 carbon atoms; for example, phenylthio and the like), a heterocyclic thio ligand (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio and the like), a thiocarbonyl ligand (for example, a thioketone ligand, a thioester ligand and the like) and a thioether ligand (for example, a dialkylthioether ligand, a diarylthioether ligand, a thiofuryl ligand and the like). These ligands may be further substituted.

$L^{11}$, $L^{12}$, $L^{13}$ or $L^{14}$ which coordinates to $M^{11}$ through a phosphorus atom is not particularly limited, but examples thereof include independently a dialkylphosphino ligand, a diarylphosphino ligand, a trialkylphosphino ligand, a triarylphosphino ligand, a phosphinino ligand and the like. The ligands may be further substituted.

$L^{11}$ and $L^{14}$ each independently represent preferably an aromatic carbon ring ligand, an alkyloxy ligand, an aryloxy ligand, an ether ligand, an alkylthio ligand, an arylthio ligand, an alkylamino ligand, an arylamino ligand, an acylamino ligand, and a nitrogen-containing heterocyclic ligand (for example, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a condensed ring ligand body thereof (for example, a quinoline ligand, a quinoxaline ligand, a phthalazine ligand, a benzoxazole ligand, a benzimidazole ligand and the like) or a tautomer thereof, more preferably an aromatic carbon ring ligand, an aryloxy ligand, an arylthio ligand, an arylamino ligand, a pyridine ligand, a pyrazine ligand, a pyrazole ligand, an imidazole ligand, a condensed ring ligand body thereof (for example, a quinoline ligand, a quinoxaline ligand, a phthalazine ligand, a benzimidazole ligand and the like) or a tautomer thereof, and even more preferably an aromatic carbon ring ligand, an aryloxy ligand, an arylthio ligand, an arylamino ligand, a pyridine ligand, a pyrazine ligand, a pyrazole ligand, an imidazole ligand or a condensed ring ligand body thereof. Among them, an aromatic carbon ring ligand, an aryloxy ligand, a pyridine ligand, a pyrazine ligand, a pyrazole ligand, an imidazole ligand or a condensed ring ligand body thereof is particularly preferable.

$L^{12}$ and $L^{13}$ each independently represent preferably a ligand forming a coordinate bond with $M^{11}$. Examples of the ligand forming a coordinate bond with $M^{11}$ preferably include a pyridine ring, a pyrazine ring, a pyrimidine ring, a triazine ring, a thiazole ring, an oxazole ring, a pyrrole ring, a triazole ring, a condensed ring body thereof (for example, a quinoline ring, a quinoxaline ligand, a phthalazine ligand, a benzoxazole ring, a benzimidazole ring, an indolenine ring or the like) and a tautomer thereof, more preferably a pyridine ring, a pyrazine ring, a pyrimidine ring, a pyrrole ring, a condensed ring body thereof (for example, a quinoline ring, a quinoxaline ring, a phthalazine ring, an indolenine ring or the like) and a tautomer thereof, and even more preferably a pyridine ring, a pyrazine ring, a pyrimidine ring and a condensed ring body thereof (for example, a quinoline ring or the like). Among them, a pyridine ring or a condensed ringbody including a pyridine ring (for example, a quinoline ring and the like) is particularly preferable.

In formula (I), $L^{15}$ represents a ligand which coordinates to $M^{11}$. $L^{15}$ represents preferably a monodentate to tetradentate ligand, and more preferably an anionic monodentate to tetradentate ligand. The anionic monodentate to tetradentate ligand is not particularly limited, but preferred examples thereof include a halogen ligand, a 1,3-diketone ligand (for example, an acetylacetone ligand and the like), a monoanionic bidentate ligand including a pyridine ligand (for example, a picolinic acid ligand, a 2-(2-hydroxyphenyl)-pyridine ligand and the like) and a tetradentate ligand formed by $L^{11}$, $Y^{12}$, $L^{12}$, $Y^{11}$, $L^{13}$, $Y^{13}$ and $L^{14}$, more preferably a 1,3-diketone ligand (for example, an acetylacetone ligand, and the like), a monoanionic bidentate ligand including a pyridine ligand (for example, a picolinic acid ligand, a 2-(2-hydroxyphenyl)-pyridine ligand and the like), and a tetradentate ligand formed by $L^{11}$, $Y^{12}$, $L^{12}$, $Y^{11}$, $L^{13}$, $Y^{13}$ and $L^{14}$, and even more preferably a 1,3-diketone ligand (for example, an acetylacetone ligand, and the like) and a monoanionic bidentate ligand including a pyridine ligand (for example, a picolinic acid ligand, a 2-(2-hydroxyphenyl)-pyridine ligand, and the like). Among them, a 1,3-diketone ligand (for example, acetylacetone ligand and the like) is particularly preferable. The coordination numbers and ligand numbers do not exceed the coordination number of the metal. However, $L^{15}$ does not bond to both $L^{11}$ and $L^{14}$ to form a cyclic ligand with them.

In formula (I), $Y^{11}$, $Y^{12}$ and $Y^{13}$ each independently represent a linking group, a single bond or a double bond. The linking group is not particularly limited, but a linking group comprising atoms selected from carbon atom, nitrogen atom, oxygen atom, sulfur atom, silicon atom and phosphorus atom is preferable. Specific examples of the linking group are described below.

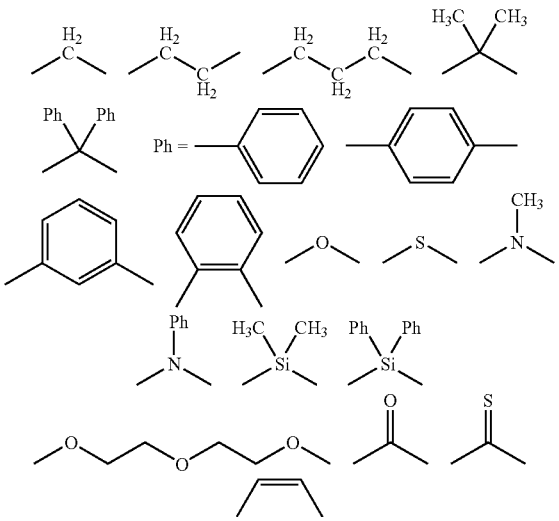

In the case where $Y^{11}$, $Y^{12}$ and $Y^{13}$ each represent a linking group, the bonds between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, or $Y^{13}$ and $L^{14}$ each independently represent a single bond or a double bond.

Preferably, $Y^{11}$, $Y^{12}$ and $Y^{13}$ each independently represent a single bond, a double bond, a carbonyl linking group, an alkylene linking group, an alkenylene group or an amino linking group. $Y^{11}$ is more preferably a single bond, an alkylene group or an amino linking group, and even more preferably an alkylene group. $Y^{12}$ and $Y^{13}$ each independently represent more preferably a single bond or an alkenylene group, and even more preferably a single bond.

The ring formed by $Y^{12}$, $L^{11}$, $L^{12}$, and $M^{11}$, the ring formed by $Y^{11}$, $L^{12}$, $L^{13}$ and $M^{11}$, and the ring formed by $Y^{13}$, $L^{13}$, $L^{14}$ and $M^{11}$ each preferably represent a 4- to 10-membered ring, more preferably a 5- to 7-membered ring, and even more preferably a 5- or 6-membered ring.

In formula (I), $n^{11}$ represents an integer of from 0 to 4. When $M^{11}$ is a metal having a coordination number of 4, $n^{11}$ represents 0. In the case where $M^{11}$ is a metal having a coordination number of 6, $n^{11}$ preferably represents 1 or 2, and more preferably 1. When $M^{11}$ is a metal having a coordination number of 6 and $n^{11}$ represents 1, $L^{15}$ represents a bidentate ligand. When $M^{11}$ is a metal having a coordination number of 6 and $n^{11}$ represents 2, $L^{15}$ represents a monodentate ligand. In the case where $M^{11}$ is a metal having a coordination number of 8, $n^{11}$ preferably represents 1 to 4, more preferably 1 or 2, and even more preferably 1. When $M^{11}$ is a metal having a coordination number of 8 and $n^{11}$ represents 1, $L^{15}$ represents a tetradentate ligand. When $M^{11}$ is a metal having a coordination number of 8 and $n^{11}$ represents 2, $L^{15}$ represents a bidentate ligand. When $n^{11}$ is 2 or more, plural $L^{15}$s may be the same or different from each other.

Preferable embodiment of the compound represented by formula (I) includes a compound represented by formulae (1), (2), (3), (4) or (5) described below.

The compound represented by the following formula (1) is to be described.

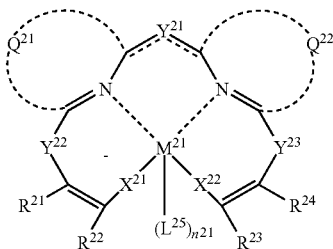

Formula (1)

In formula (1), $M^{21}$ represents a metal ion. $Y^{21}$ represents a linking group, a single bond or a double bond. $Y^{22}$ and $Y^{23}$ each represent a single bond or a linking group. $Q^{21}$ and $Q^{22}$ each represent an atomic group forming a nitrogen-containing heterocyclic ring. The bond between a ring formed by $Q^{21}$ and $Y^{21}$, and the bond between a ring formed by $Q^{22}$ and $Y^{21}$ each represents a single bond or a double bond. $X^{21}$ and $X^{22}$ each independently represent an oxygen atom, a sulfur atom, or a substituted or unsubstituted nitrogen atom. $R^{21}$, $R^{22}$, $R^{23}$ and $R^{24}$ each independently represent a hydrogen atom or a substituent. $R^{21}$ and $R^{22}$, and $R^{23}$ and $R^{24}$ may combine together to form a ring. $L^{25}$ represents a ligand which coordinates to $M^{21}$. $n^{21}$ represents an integer of from 0 to 4.

Formula (1) is to be described in detail.

In the formula (1) $M^{21}$ has the same meaning as $M^{11}$ in the above formula (I), and preferable range thereof is also the same.

$Q^{21}$ and $Q^{22}$ each independently represent an atomic group forming a nitrogen-containing heterocyclic ring (comprising a nitrogen atom which coordinates to $M^{21}$). The nitrogen-containing heterocyclic ring formed by $Q^{21}$ and $Q^{22}$ is not particularly limited, but examples thereof include a pyridine ring, a pyrazine ring, a pyrimidine ring, a pyridazine ring, a triazine ring, a pyrazole ring, an imidazole ring, a thiazole ring, an oxazole ring, a pyrrole ring, a triazole ring, a condensed ring body thereof (for example, a quinoline ring, a quinoxaline ring, a phthalazine ring, an indole ring, a benzoxazole ring, a benzimidazole ring, an indolenine ring or the like) and a tautomer thereof.

Preferred examples of the nitrogen-containing heterocyclic ring formed by $Q^{21}$ and $Q^{22}$ include a pyridine ring, a pyrazine ring, a pyrimidine ring, a pyridazine, a triazine ring, a pyrazole ring, an imidazole ring, an oxazole ring, a pyrrole ring, a condensed ring body thereof (for example, a quinoline ring, a quinoxaline ring, a phthalazine ring, an indole ring, a benzoxazole ring, a benzimidazole ring or the like) and a tautomer thereof, more preferably a pyridine ring, a pyrazine ring, a pyrimidine ring, an imidazole ring, a pyrrole ring, a condensed ring body thereof (for example, a quinoline ring or the like) and a tautomer thereof, and even more preferably a pyridine ring and a condensed ring body thereof (for example, a quinoline ring or the like). Among them, a pyridine ring is particularly preferable.

$X^{21}$ and $X^{22}$ each independently represent an oxygen atom, a sulfur atom, or a substituted or unsubstituted nitrogen atom, preferably an oxygen atom, a sulfur atom or a substituted nitrogen atom, and more preferably an oxygen atom or a sulfur atom. Among them, an oxygen atom is particularly preferable.

$Y^{21}$ has the same meaning as $Y^{11}$ in formula (I), and a similar preferable range.

$Y^{22}$ and $Y^{23}$ each independently represent a single bond or a linking group, and preferably a single bond. The linking group is not particularly limited, but examples thereof include a carbonyl linking group, a thiocarbonyl linking group, an alkylene group, an alkenylene group, an arylene group, a heteroarylene group, an oxygen atom linking group, a nitrogen atom linking group, a sulfur atom linking group and a linking group formed by a combination thereof.

Examples of the linking group represented by $Y^{22}$ or $Y^{23}$ preferably include a carbonyl linking group, an alkylene linking group and an alkenylene linking group, more preferably a carbonyl linking group and an alkenylene linking group, and even more preferably a carbonyl linking group.

$R^{21}$, $R^{22}$, $R^{23}$ and $R^{24}$ each independently represent a hydrogen atom or a substituent. The substituent is not particularly limited, but specific examples thereof include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentenyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, primidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenoxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxylcarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably 1 to 30 carbon atoms, more preferably 1 to 20 carbon atoms, and even more preferably 1 to 12 carbon atoms, for example, methanesulfonylamino, benzenesulfonylamino or the like), a sulfamoyl group (having preferably 0 to 30 carbon atoms, more preferably 0 to 20 carbon atoms, and even more preferably 0 to 12 carbon atoms; for example, sulfamoyl, methylsulfamoyl, dimethylsulfamoyl, phenylsulfamoyl or the like), a carbamoyl group (having preferably 1 to 30 carbon atoms, more preferably 1 to 20 carbon atoms, and even more preferably 1 to 12 carbon atoms; for example, carbamoyl, methylcarbamoyl, diethylcarbamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mereapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group (having preferably 1 to 30 carbon atoms, and more preferably 1 to 12 carbon atoms; examples of the heteroatom including a nitrogen atom, an oxygen atom and a sulfur atom; specific examples including an imidazolyl group, pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like), and a silyloxy group (having preferably 3 to 40 carbon atoms, more preferably 3 to 30 carbon atoms, and even more preferably 3 to 24 carbon atoms; for example, trimethylsilyloxy, triphenylsilyloxy or the like). These substituents may be further substituted.

Preferably, $R^{21}$, $R^{22}$, $R^{23}$ and $R^{24}$ each independently represent an alkyl group, an aryl group or a group forming a ring structure by combining $R^{21}$ and $R^{22}$ or $R^{23}$ and $R^{24}$ (for example, a benzo condensed ring, a pyridine condensed ring or the like), more preferably a group forming a ring structure by combining by $R^{21}$ and $R^{22}$ or $R^{23}$ and $R^{24}$ (for example, a benzo condensed ring, a pyridine condensed ring or the like).

$L^{25}$ has the same meaning as $L^{15}$ in the above formula (I) and a similar preferable range.

$n^{21}$ has the same meaning as $n^{11}$ in the above formula (I), and a similar preferable range.

In formula (1), a metal complex in which the rings formed by $Q^{21}$ or $Q^{22}$ are each a pyridine ring, and $Y^{21}$ represents a linking group; a metal complex in which the rings formed by $Q^{21}$ or $Q^{22}$ are each a pyridine ring, $Y^{21}$ represents a single bond or a double bond, and $X^{21}$ and $X^{22}$ each represent a sulfur atom, or a substituted or unsubstituted nitrogen atom; or a metal complex in which the rings formed by $Q^{21}$ and $Q^{22}$ are each a nitrogen-containing 5-membered heterocyclic ring or a nitrogen-containing 6-membered ring including two or more nitrogen atoms is preferred.

Preferred embodiment of the compound represented by the formula (1) described above is a compound represented by the following formula (1-A).

Formula (1-A)

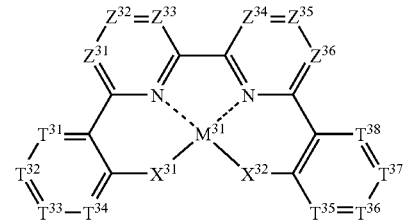

Formula (1-A) is to be described.

In formula (1-A), $M^{31}$ has the same meaning as $M^{11}$ in the above formula (I) and a similar preferable range.

$Z^{31}$, $Z^{32}$, $Z^{33}$, $Z^{34}$, $Z^{35}$ and $Z^{36}$ each independently represent preferably a substituted or unsubstituted carbon atom or a nitrogen atom, and more preferably a substituted or unsubstituted carbon atom. The substituent on the carbon atom includes a group explained for $R^{21}$ in the above formula (1). $Z^{31}$ and $Z^{32}$, $Z^{32}$ and $Z^{33}$, $Z^{33}$ and $Z^{34}$, $Z^{34}$ and $Z^{35}$ or $Z^{35}$ and $Z^{36}$ may combine together through a linking group to form a condensed ring (for example, a benzo condensed ring, a pyridine condensed ring or the like). Furthermore $Z^{31}$ and $T^{31}$ or $Z^{36}$ and $T^{38}$ may combine together through a linking group to form a condensed ring (for example, a benzo condensed ring, a pyridine condensed ring or the like).

Examples of the substituents on the carbon atom preferably include an alkyl group, an alkoxy group, an alkylamino group, an aryl group, a group forming a condensed ring (for example, a benzo condensed ring, a pyridine condensed ring or the like), and a halogen atom, more preferably an alkylamino group, an aryl group, and a group forming a condensed ring (for example, a benzo condensed ring, a pyridine condensed ring or the like), and even more preferably an aryl group and a group forming a condensed ring (for example, a benzo condensed ring, a pyridine condensed ring or the like).

Among them, a group forming a condensed ring (for example, a benzo condensed ring, a pyridine condensed ring or the like) is particularly preferable.

$T^{31}$, $T^{32}$, $T^{33}$, $T^{34}$, $T^{35}$, $T^{36}$, $T^{37}$ and $T^{38}$ each independently represent a substituted or unsubstituted carbon atom or a nitrogen atom, and more preferably a substituted or unsubstituted carbon atom. The substituent on the carbon atom includes a group explained for $R^{21}$ in the above formula (1). $T^{31}$ and $T^{32}$, $T^{32}$ and $T^{33}$, $T^{33}$ and $T^{34}$, $T^{35}$ and $T^{36}$, $T^{36}$ and $T^{37}$, or $T^{37}$ and $T^{38}$ may combine together through a linking group to form a condensed ring (for example, a benzo condensed ring, a pyridine condensed ring or the like).

The substituents on the carbon atom preferably include an alkyl group, an alkoxy group, an alkylamino group, an aryl group, a group forming a condensed ring (for example, a benzo condensed ring, a pyridine condensed ring or the like) and a halogen atom, more preferably an aryl group, a group forming a condensed ring (for example, a benzo condensed ring, a pyridine condensed ring or the like) and a halogen atom, and even more preferably an aryl group and a halogen atom. Among them, an aryl group is particularly preferable.

$X^{31}$ and $X^{32}$ each have the same meaning as $X^{21}$ and $X^{22}$ in formula (1) described above and a similar preferable range.

The compound represented by the following formula (2) is to be described.

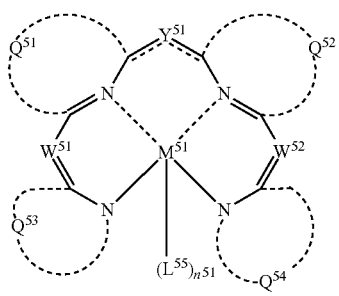

Formula (2)

In formula (2), $M^{51}$ has the same meaning as $M^{11}$ in the above formula (I) and a similar preferable range.

$Q^{51}$ and $Q^{52}$ each have the same meaning as $Q^{21}$ and $Q^{22}$ in the above formula (1) and a similar preferable range.

$Q^{53}$ and $Q^{54}$ each independently represent a group forming a nitrogen-containing heterocyclic ring (including a nitrogen atom which coordinates to $M^{51}$). The nitrogen-containing heterocyclic ring formed by $Q^{53}$ or $Q^{54}$ is not particularly limited, but examples thereof include tautomers of pyrrole derivatives (for example, a 5-membered heterocyclic ligand: Compound (24) exemplified in Compound number [KA 24], a terminal 5-membered heterocyclic ligand: Compound (64) exemplified in Compound number [KA 28], and a 5-membered heterocyclic ligand: Compound (145) exemplified in Compound number [KA 37] described in JP-A No. 2007-103493), a tautomer of imidazole derivatives (for example, a 5-membered heterocyclic ligand: Compound (29) exemplified in Compound number [KA 24] described in JP-A No. 2007-103493), tautomers of thiazole derivatives (for example, a 5-membered heterocyclic ligand: Compound (30) exemplified in Compound number [KA 24] described in JP-A No. 2007-103493) and tautomers of oxazole derivatives (for example, a 5-membered heterocyclic ligand: Compound (31) exemplified in Compound number [KA 24] described in JP-A No. 2007-103493), more preferably tautomers of pyrrole derivatives, tautomers of imidazole derivatives and tautomers of thiazole derivatives, and even more preferably tautomers of pyrrole derivatives and tautomers of imidazole derivatives. Among them, tautomers of pyrrole derivatives are particularly preferable.

$Y^{51}$ has the same meaning as $Y^{11}$ in formula (I) and a similar preferable range.

$L^{55}$ has the same meaning as $L^{15}$ in formula (I) and a similar preferable range.

$n^{51}$ has the same meaning as $n^{11}$ in formula (I) and a similar preferable range.

$W^{51}$ and $W^{52}$ each independently represent a substituted or unsubstituted carbon atom, or a nitrogen atom, more preferably an unsubstituted carbon atom or a nitrogen atom, and even more preferably an unsubstituted carbon atom.

The compound represented by the following formula (3) is to be described.

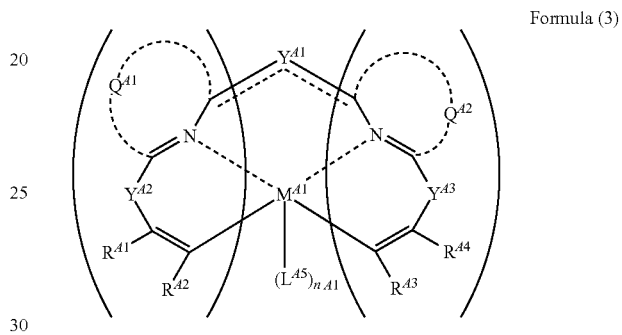

Formula (3)

In formula (3), $M^{41}$, $Q^{41}$, $Q^{42}$, $Y^{41}$, $Y^{42}$, $Y^{43}$, $R^{41}$, $R^{42}$, $R^{43}$, $R^{44}$, $L^{45}$ and $n^{41}$ each have the same meaning as $M^{21}$, $Q^{21}$, $Q^{22}$, $Y^{21}$, $Y^{22}$, $Y^{23}$, $R^{21}$, $R^{22}$, $R^{23}$, $R^{24}$, $L^{25}$ and $n^{21}$ in the above formula (1) respectively and a similar preferable range.

Preferred embodiment of the compound represented by formula (3) is a compound represented by the following formula (3-B).

The compound represented by formula (3-B) is to be described.

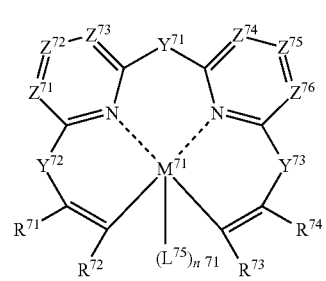

Formula (3-B)

In formula (3-B), $M^{71}$ has the same meaning as $M^{11}$ in the above formula (I) and a similar preferable range.

$Y^{71}$, $Y^{72}$ and $Y^{73}$ each have the same meaning as $Y^{21}$, $Y^{22}$ and $Y^{23}$ in formula (1) respectively and a similar preferable range.

$L^{75}$ has the same meaning as $L^{15}$ in the above formula (I) and a similar preferable range.

$n^{71}$ has the same meaning as $n^{11}$ in the above formula (I) and a similar preferable range.

$Z^{71}$, $Z^{72}$, $Z^{73}$, $Z^{74}$, $Z^{75}$ and $Z^{76}$ each independently represent a substituted or unsubstituted carbon atom or a nitrogen atom, more preferably a substituted or unsubstituted carbon atom. Examples of the substituent on the carbon atom include a group explained for $R^{21}$ in the above formula (1). $R^{71}$ and $R^{72}$, or $R^{73}$ and $R^{74}$ may combine together through a linking group to form a ring (for example, a benzene ring or a pyridine ring). $R^{71}$ to $R^{74}$ each have the same meaning as $R^{21}$ to $R^{24}$ in the above formula (1) and a similar preferable range.

Preferred embodiment of the compound represented by formula (3-B) is a compound represented by the following formula (3-C). The compound represented by formula (3-C) is to be described.

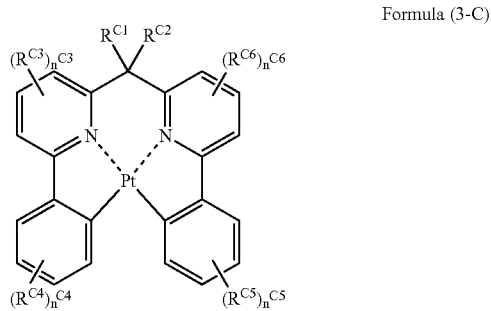

Formula (3-C)

In the formula (3-C), $R^{C1}$ and $R^{C2}$ each independently represent a hydrogen atom or a substituent. Examples of the substituent include an alkyl group, an aryl group, a heterocyclic group (these groups may be substituted furthermore. In this case, for the substituent thereof, the groups described as the substituent represented by $R^{21}$ in the above formula (1) can be applied), and a halogen atom, which are explained as the substituent represented by $R^{21}$ to $R^{24}$ in the above formula (1). The substituent represented by $R^{C3}$, $R^{C4}$, $R^{C5}$ or $R^{C6}$ has the same meaning as the substituent represented by $R^{21}$ to $R^{24}$ in the above formula (1). $n^{C3}$ and $n^{C6}$ each represent an integer of from 0 to 3, and $n^{C4}$ and $n^{C5}$ each represent an integer of 0 to 4. In the case where there are plural $R^{C3}$s, $R^{C4}$s, $R^{C5}$s or $R^{C6}$s, the plural $R^{C3}$s, $R^{C4}$s, $R^{C5}$s or $R^{C6}$s may be the same or different, and may form a ring by linking each other. $R^{C3}$, $R^{C4}$, $R^{C5}$ and $R^{C6}$ each preferably represent an alkyl group, an aryl group, a heteroaryl group, a cyano group or a halogen atom.

The compound represented by formula (4) is to be described.

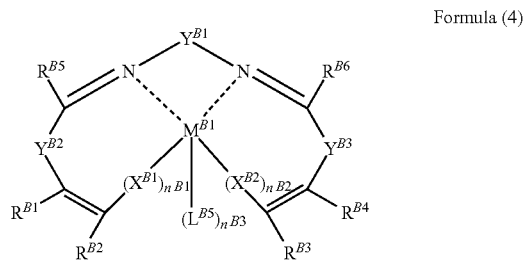

Formula (4)

In formula (4), $M^{B1}$, $Y^{B2}$, $Y^{B3}$, $R^{B1}$, $R^{B2}$, $R^{B3}$, $R^{B4}$, $L^{B5}$, $n^{B3}$, $X^{B1}$ and $X^{B2}$ each have the same meaning as $M^{21}$, $Y^{22}$, $Y^{23}$, $R^{21}$, $R^{22}$, $R^{23}$, $R^{24}$, $L^{25}$, $n^{21}$, $X^{21}$ and $X^{22}$ in the above formula (1) respectively and a similar preferable range.

$Y^{B1}$ represents a linking group and has the same meaning as $Y^{21}$ in the above formula (1). Preferably, $Y^{B1}$ represents a vinylene group substituted at 1- and 2-position thereof, a phenylene ring, a pyridine ring, a pyrazine ring, a pyrimidine ring or an alkylene group having 2 to 8 carbon atoms.

$R^{B5}$ and $R^{B6}$ each independently represent a hydrogen atom or a substituent. Examples of the substituent include an alkyl group, an aryl group, and a heterocyclic group, which are explained as the substituent represented by $R^{21}$ to $R^{24}$ in the above formula (1). With proviso, however, $Y^{B1}$ does not bond with $R^{B5}$ or $R^{B6}$. $n^{B1}$ and $n^{B2}$ each independently represent 0 or 1.

Preferred embodiment of the compound represented by formula (4) described above is a compound represented by the following formula (4-A).

The compound represented by formula (4-A) is be described.

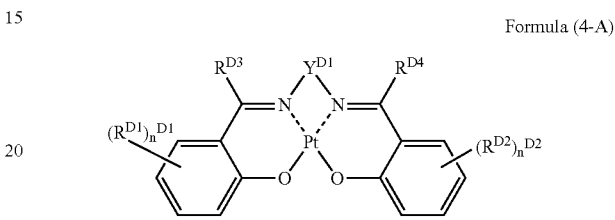

Formula (4-A)

In formula (4-A), $R^{D3}$ and $R^{D4}$ each independently represent a hydrogen atom or a substituent. $R^{D1}$ and $R^{D2}$ each represent a substituent. The substituent represented by $R^{D1}$, $R^{D2}$, $R^{D3}$ or $R^{D4}$ has the same meaning as the substituent represented by $R^{B5}$ or $R^{B6}$ in the above formula (4) and a similar preferable range. $n^{D1}$ and $n^{D2}$ each represent an integer of from 0 to 4. In the case where there are plural $R^{D1}$s and $R^{D2}$s, the plural $R^{D1}$s and $R^{D2}$s may be the same or different, and may combine together to form a ring. $Y^{D1}$ represents a vinylene group substituted at 1- and 2-position thereof, a phenylene ring, a pyridine ring, a pyrazine ring, a pyrimidine ring or an alkylene group having 1 to 8 carbon atoms.

The compound represented by the following formula (5) is to be described.

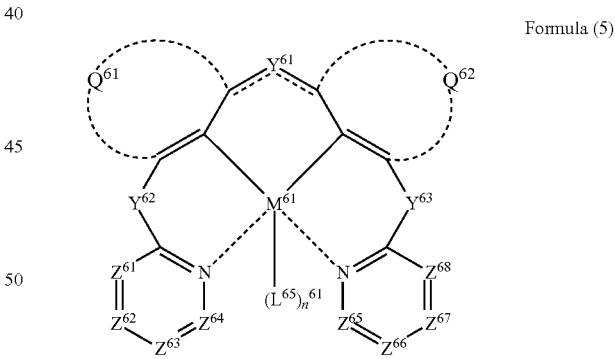

Formula (5)

In the formula (5), $M^{61}$ has the same meaning as $M^{11}$ in the above formula (I) and a similar preferable range.

$Q^{61}$ and $Q^{62}$ each independently represent a group forming a ring. The ring formed by $Q^{61}$ or $Q^{62}$ is not particularly limited, but examples thereof include a benzene ring, a pyridine ring, a pyridazine ring, a pyrimidine ring, a thiophene ring, an isothiazole ring, a furan ring, an isoxazole ring and a condensed ring body thereof.

The ring formed by $Q^{61}$ or $Q^{62}$ is preferably a benzene ring, a pyridine ring, a thiophene ring, a thiazole ring or a condensed ring body thereof, more preferably a benzene ring, a pyridine ring or a condensed ring body thereof, and even more preferably a benzene ring or a condensed ring body thereof.

$Y^{61}$ has the same meaning as $Y^{11}$ in the above formula (I) and a similar preferable range.

$Y^{62}$ a $Y^{63}$ independently represent a linking group or a single bond. The linking group is not particularly limited, but examples thereof include a carbonyl linking group, a thiocarbonyl linking group, an alkylene group, an alkenylene group, an arylene group, a heteroarylene group, an oxygen atom linking group, a nitrogen atom linking group and a linking group formed by a combination thereof.

$Y^{62}$ $Y^{63}$ independently represent preferably a single bond, a carbonyl linking group, an alkylene linking group, an alkenylene group, more preferably a single bond or an alkenylene group, and even more preferably a single bond.

$L^{65}$ has the same meaning as $L^{15}$ in the above formula (I) and a similar preferable range.

$n^{61}$ has the same meaning as $n^{11}$ in the above formula (I) and a similar preferable range.

$Z^{61}, Z^{62}, Z^{63}, Z^{64}, Z^{65}, Z^{66}, Z^{67}$ and $Z^{68}$ each independently represent a substituted or unsubstituted carbon atom, or a nitrogen atom, and preferably a substituted or unsubstituted carbon atom. Examples of the substituent on the carbon atom include the groups explained for $R^{21}$ in the above formula (1). Furthermore, $Z^{61}$ and $Z^{62}$, $Z^{62}$ and $Z^{63}$, $Z^{63}$ and $Z^{64}$, $Z^{65}$ and $Z^{66}$, $Z^{66}$ and $Z^{67}$, and $Z^{67}$ and $Z^{68}$ each may combine each other through a linking group to form a condensed ring (for example, a benzo condensed ring, a pyridine condensed ring or the like). The ring formed by $Q^{61}$ or $Q^{62}$ each may form a ring by combining with $Z^{61}$ or $Z^{68}$ respectively through a linking group.

Specific examples of the substituent on the carbon atom preferably include an alkyl group, an alkoxy group, an alkylamino group, an aryl group, a group forming a condensed ring (for example, benzo condensed ring, a pyridine condensed ring or the like) or a halogen atom, more preferably an alkylamino group, an aryl group, or a group forming a condensed ring (for example, a benzo condensed ring, a pyridine condensed ring or the like), and even more preferably an aryl group or a group forming a condensed ring (for example, a benzo condensed ring, a pyridine condensed ring or the like). Among them, a group forming a condensed ring (for example, a benzo condensed ring, a pyridine condensed ring or the like) is particularly preferable.

Preferable embodiment of the metal complex having a tridentate ligand in the present invention is a compound represented by the following formula (II).

The compound represented by formula (II) is to be described.

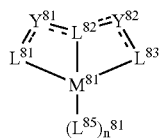

Formula (II)

In the formula (II), $M^{81}$ has the same meaning as $M^{11}$ in the above formula (I) and a similar preferable range.

$L^{81}, L^{82}$ and $L^{83}$ each have the same meaning as $L^{11}, L^{12}$ and $L^{14}$ in the above formula (I) and a similar preferable range.

$Y^{81}$ and $Y^{82}$ each have the same meaning as $Y^{12}$ and $Y^{13}$ in the above formula (I) and a similar preferable range.

$L^{85}$ represents a ligand which cordinates to $M^{81}$. $L^{85}$ preferably represents a monodentate to tridentate ligand, and more preferably an anionic monodentate to tridentate ligand. The anionic monodentate to tridentate ligand is not particularly limited, but specific examples thereof preferably include a halogen ligand, a tridentate ligand formed by $L^{81}, Y^{81}, L^{82}, Y^{82}$ and $L^{83}$, more preferably a tridentate ligand formed by $L^{81}, Y^{81}, L^{82}, Y^{82}$ and $L^{83}$. $L^{85}$ does not link to $L^{81}$ or $L^{83}$ without interposition of a metal. The coordination numbers and ligand numbers do not exceed the coordination number of the metal.

$n^{81}$ represents an integer of from 0 to 5. In the case where $M^{81}$ is a metal having a coordination number of 4, and $n^{81}$ is 1, $L^{85}$ represents a monodentate ligand. In the case where $M^{81}$ is a metal having a coordination number of 6, n81 is preferably an integer of from 1 to 3, more preferably 1 or 3, and even more preferably 1. When $M^{81}$ is a metal having a coordination number of 6, and $n^{81}$ is 1, $L^{85}$ represents a tridentate ligand. When $M^{81}$ is a metal having a coordination number of 6, and $n^{81}$ is 2, $L^{85}$ represents one monodentate ligand and one tridentate ligand. When $M^{81}$ is a metal having a coordination number of 6, and $n^{81}$ is 3, $L^{85}$ represents a monodentate ligand. In the case where $M^{81}$ is a metal having a coordination number of 8, $n^{81}$ is preferably an integer of 1 to 5, more preferably 1 or 2, and even more preferably 1. When $M^{81}$ is a metal having a coordination number of 8, and $n^{81}$ is 1, $L^{85}$ represents a pentadentate ligand. When $M^{81}$ is a metal having a coordination number of 8, and $n^{81}$ is 2, $L^{85}$ represents one tridentate ligand and one bidentate ligand. When $M^{81}$ is a metal having a coordination number of 8, and $n^{81}$ is 3, $L^{85}$ represents one tridentate ligand and two monodentate ligands, or two bidentate ligands and one monodentate ligand. When $M^{81}$ is a metal having a coordination number of 8, and $n^{81}$ is 4, $L^{85}$ represents one bidentate ligand and three monodentate ligands. When $M^{81}$ is a metal having a coordination number of 8, and $n^{81}$ is 5, $L^{85}$ represents five monodentate ligands. When $n^{81}$ is 2 or more, plural $L^{85}$s may be the same or different from each other.

Preferable embodiment of the above formula (II) includes that in formula (II), $L^{81}, L^{82}$ and $L^{83}$ each represent an aromatic carbon ring or a heterocyclic ring which coordinates to $M^{81}$ through a carbon atom or a nitrogen-containing heterocyclic ring which coordinates to $M^{81}$ through a nitrogen atom, and at least one of $L^{81}, L^{82}$ or $L^{83}$ is a nitrogen-containing heterocyclic ring. The aromatic carbon ring or heterocyclic ring which coordinates through a carbon atom and the nitrogen-containing heterocyclic ring which coordinates through a nitrogen atom include similar examples as explained for the ligand which coordinates to $M^{11}$ through a carbon atom or a nitrogen atom in the above formula (I) and preferable ranges thereof are also similar. $Y^{81}$ and $Y^{82}$ each represent preferably a single bond or a methylene group.

Other preferable embodiments of the compound represented by the above formula (II) are a compound represented by formula (II-A) and a compound represented by (II-B) described below.

The compound represented by formula (II-A) is to be described.

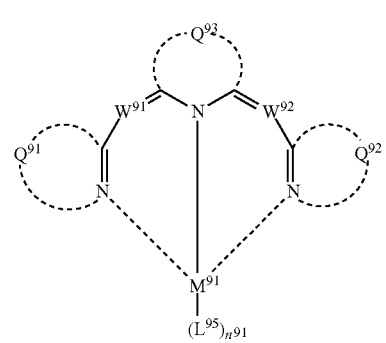

Formula (II-A)

In the formula (II-A), $M^{91}$ has the same meaning as $M^{81}$ in the above formula (II) and a similar preferable range.

$Q^{91}$ and $Q^{92}$ each represent a group forming a nitrogen-containing heterocyclic ring (including a nitrogen atom which coordinates to $M^{91}$). The nitrogen-containing heterocyclic ring formed by $Q^{91}$ or $Q^{92}$ is not particularly limited, but examples thereof include a pyridine ring, a pyrazine ring, a pyrimidine ring, a pyridazine ring, a triazine ring, a thiazole ring, an oxazole ring, a pyrrole ring, a pyrazole ring, an imidazole ring, a triazole ring, a condensed ring body thereof (for example, a quinoline ring, a benzoxazole ring, a benzimidazole ring, an indolenine ring or the like) and a tautomer thereof.

Examples of the nitrogen-containing heterocyclic ring formed by $Q^{91}$ or $Q^{92}$ preferably include a pyridine ring, a pyrazole ring, a thiazole ring, an imidazole ring, a pyrrole ring, a condensed ring body thereof (for example, a quinoline ring, a benzthiazole ring, a benzimidazole ring, indolenine ring or the like) and a tautomer thereof, more preferably a pyridine ring, a pyrrole ring, a condensed ring body thereof (for example, a quinoline ring or the like), and a tautomer thereof, and even more preferably a pyridine ring, and a condensed ring body thereof (for example, a quinoline ring or the like). Among them, a pyridine ring is particularly preferred.

$Q^{93}$ represents a group forming a nitrogen-containing heterocyclic ring (including a nitrogen atom which coordinates to $M^{91}$). The nitrogen-containing heterocyclic ring formed by $Q^{93}$ is not particularly limited, but examples thereof preferably include a tautomer of a pyrrole ring, imidazole ring, and triazole ring, and a condensed ring body thereof (for example, a benzpyrrole or the like), and more preferably a tautomer of pyrrole ring and a tautomer of a condensed ring body having a pyrrole ring (for example, a benzpyrrole or the like).

$W^{91}$ and $W^{92}$ each have the same meaning as $W^{51}$ and $W^{52}$ in the above formula (2) and a similar preferable range.

$L^{95}$ has the same meaning as $L^{85}$ in formula (II) described above and a similar preferable range.

$n^{91}$ has the same meaning as $n^{81}$ in formula (II) described above and a similar preferable range.

The compound represented by the following formula (II-B) is to be described.

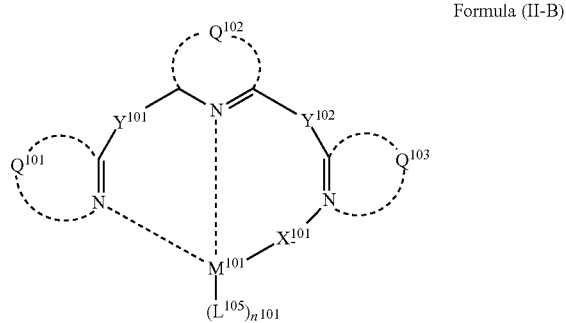

Formula (II-B)

In the formula (II-B), $M^{101}$ has the same meaning as $M^{81}$ in the above formula (II) and a similar preferable range.

$Q^{102}$ has the same meaning as $Q^{21}$ in formula (1) described above and a similar preferable range.

$Q^{101}$ has the same meaning as $Q^{91}$ in formula (II-A) described above and a similar preferable range.

$Q^{103}$ represents a group forming an aromatic ring. The aromatic ring formed by $Q^{103}$ is not particularly limited, but examples thereof preferably include a benzene ring, a furan ring, a thiophene ring, a pyrrole ring, and a condensed ring body thereof (for example, a naphthalene ring, a benzofuran ring, a benzothiophene ring, an indole ring or the like), more preferably a benzene ring and a condensed ring body containing a benzene ring (for example, a naphthalene ring or the like), and particularly preferably a benzene ring.

$Y^{101}$ and $Y^{102}$ each have the same meaning as $Y^{22}$ in formula (1) described above and a similar preferable range.

$L^{105}$ has the same meaning as $L^{85}$ in formula (II) described above and a similar preferable range.

$n^{101}$ has the same meaning as $n^{81}$ in formula (II) described above and a similar preferable range.

$X^{101}$ has the same meaning as $X^{21}$ in formula (1) described above and a similar preferable range.

Another preferred embodiment of the metal complex having a tridentate ligand in the present invention is a compound represented by the following formula (II-C).

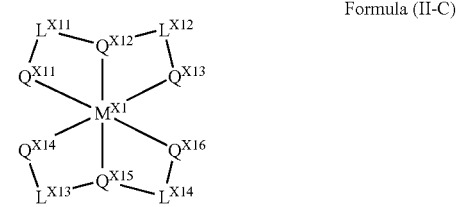

Formula (II-C)

In the formula (II-C), $M^{X1}$ represents a metal ion. $Q^{X11}$ to $Q^{X16}$ represent an atom which coordinates to $M^{X1}$ or an atomic group containing an atom which coordinates to $M^{X1}$. $L^{X11}$ to $L^{X14}$ each represent a single bond, a double bond or a linking group. Namely, an atomic group formed by $Q^{X11}$-$L^{X11}$-$Q^{X12}$-$L^{X12}$-$Q^{X13}$, and an atomic group formed by $Q^{X14}$-$L^{X13}$-$Q^{X15}$-$L^{X14}$-$Q^{X16}$ are each a tridentate ligand.

The bond between $M^{X1}$ and $Q^{X11}$ to $Q^{X16}$ may be a coordinate bond, an ionic bond or a covalent bond.

The compound represented by formula (II-C) is to be described in detail.

In formula (II-C), $M^{X1}$ represents a metal ion. The metal ion is not particularly limited, but is preferably a monovalent to trivalent metal ion, more preferably a divalent or a trivalent metal ion, and even more a trivalent metal ion. Specific examples thereof include a platinum ion, an iridium ion, a rhenium ion, a palladium ion, a rhodium ion, a ruthenium ion, a copper ion, a europium ion, a gadolinium ion and a terbium ion, more preferably an iridium ion and a europium ion, and even more preferably an iridium ion.

$Q^{X11}$ to $Q^{X16}$ each represent an atom which coordinates to $M^{X1}$ or an atomic group containing an atom which coordinates to $M^{X1}$.

In the case where $Q^{X11}$ to $Q^{X16}$ each represent an atom which coordinates to $M^{X1}$, specific examples of the atom include a carbon atom, a nitrogen atom, an oxygen atom, a silicon atom, a phosphorus atom and a sulfur atom, preferably a nitrogen atom, an oxygen atom, a sulfur atom and a phosphorus atom, and more preferably a nitrogen atom and an oxygen atom.

In the case where $Q^{X11}$ to $Q^{X16}$ each represent an atomic group containing an atom which coordinates to $M^{X1}$, examples of an atomic group containing a carbon atom which coordinates to $M^{X1}$ include an imino group, an aromatic hydrocarbon ring group (for example, benzene, naphthalene or the like), a heterocyclic group (for example, thiophene, pyridine, pyrazine, pyrimidine, pyridazine, triazine, thiazole, oxazole, pyrrole, imidazole, pyrazole, triazole or the like), a condensed ring thereof, and a tautomer thereof.

Examples of an atomic group containing a nitrogen atom which coordinates to $M^{X1}$ include a nitrogen-containing heterocyclic group (for example, pyridine, pyrazine, pyrimidine, pyridazine, triazine, thiazole, oxazole, pyrrole, imidazole, pyrazole, or triazole or the like), an amino group including an alkylamino group (having preferably 2 to 30 carbon atoms, more preferably 2 to 20 carbon atoms, and even more preferably 2 to 10 carbon atoms; for example, methylamino), an arylamino group (for example, phenylamino), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms and even more preferably 2 to 12 carbon atoms; for example, methoxycarbonylamino or the like), an aryloxycarbonylamino group (having preferably 7 to 30 carbon atoms, more preferably 7 to 20 carbon atoms and even more preferably 7 to 12 carbon atoms; for example, phenyloxycarbonylamino or the like), and a sulfonylamino group (having preferably 1 to 30 carbon atoms, more preferably 1 to 20 carbon atoms, and even more preferably 1 to 12 carbon atoms; for example, methanesulfonylamino, benzenesulfonylamino or the like), an imino group and the like.

These groups may be further substituted.

Examples of the atomic group containing an oxygen atom which coordinates to $M^{X1}$ include an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, primidyloxy, quinolyloxy, or the like), an acyloxy group (having preferably 2 to 30 carbon atoms, more preferably 2 to 20 carbon atoms, and even more preferably 2 to 10 carbon atoms; for example, acetoxy, benzoyloxy or the like), a silyloxy group (having preferably 3 to 40 carbon atoms, more preferably 3 to 30 carbon atoms, and even more preferably 3 to 24 carbon atoms; for example, trimethylsilyloxy, triphenysilyloxy or the like), a carbonyl group (for example, a ketone group, an ester group, an amido group or the like), an ether group (for example, a dialkylether group, a diarylether group, a furyl group or the like) and the like.

Examples of the atomic group containing a silicon atom which coordinates to $M^{X1}$ include an alkylsilyl group (having preferably 3 to 30 carbon atoms; for example, trimethylsilyl group or the like), an arylsilyl group (having preferably 18 to 30 carbon atoms; for example, triphenylsilyl group or the like) and the like. These groups may be further substituted.

Examples of the atomic group containing a sulfur atom which coordinates to $M^{X1}$ include an alkylthio group (having preferably 1 to 30 carbon atoms, more preferably 1 to 20 carbon atoms, and even more preferably 1 to 12 Carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a thiocarbonyl group (for example, a thioketone group, a thioester group or the like), a thioether group (for example, a dialkylthioether group, a diarylthioether group, a thiofuryl group or the like) and the like.

Examples of the atomic group containing a phosphorus atom which coordinates to $M^{X1}$ include a dialkylphosphino group, a diarylphosphino group, a trialkylphosphine group, a triarylphosphine group, a phosphinine group and the like. These groups may be further substituted.

Preferable examples of the atomic group represented by $Q^{X11}$ to $Q^{X16}$ include an aromatic hydrocarbon ring group which coordinates to $M^{X1}$ through a carbon atom, an aromatic heterocyclic ring group which coordinates to $M^{X1}$ through a carbon atom, a nitrogen-containing aromatic heterocyclic group which coordinates to $M^{X1}$ through a nitrogen atom, an alkyloxy group, an aryloxy group, an alkylthio group, an arylthio group, and a dialkylphosphino group, more preferably an aromatic hydrocarbon ring group which coordinates to $M^{X1}$ through a carbon atom, an aromatic heterocyclic ring group which coordinates to $M^{X1}$ through a carbon atom, and a nitrogen-containing aromatic heterocyclic ring group which coordinates to $M^{X1}$ through a nitrogen atom.

The bond between $M^{X1}$ and $Q^{X11}$ to $Q^{X16}$ may be a coordinate bond, an ionic bond or a covalent bond.

In the formula (II-C), $L^{X11}$ to $L^{X14}$ each represent a single bond, a double bond or a linking group. The linking group is not particularly limited, but preferable is a linking group comprising atoms selected from carbon, nitrogen, oxygen, sulfur and silicon. Examples of the linking group are shown below, but the invention is not limited to these examples.

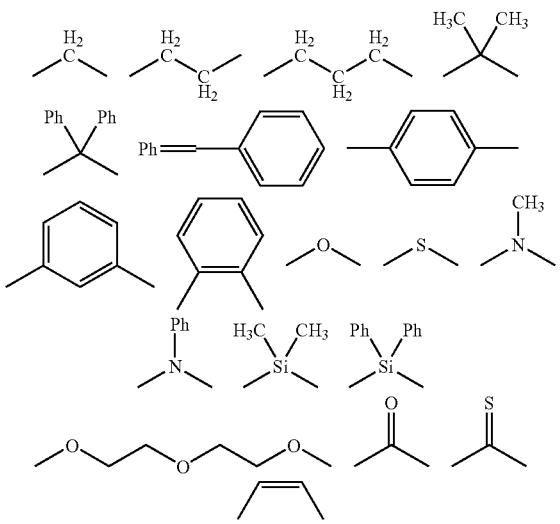

These linking groups may be substituted further with other substituents. As the substituent thereof, the substituents described as substituents represented by $R^{21}$ to $R^{24}$ in the above formula (2) can be applied, and preferable range of the substituent is similar. $L^{X11}$ to $L^{X14}$ each preferably represent a single bond, a dimethylmethylene group or a dimethylsilylene group.

Among the compound represented by formula (II-C), a compound represented by the following formula (X2) is preferred, and more preferred is a compound represented by formula (X3) described below.

In the first place, the compound represented by formula (X2) is to be described.

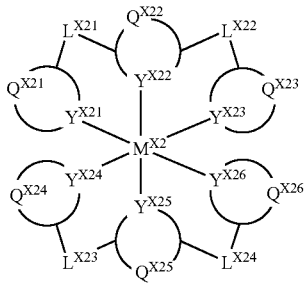

Formula (X2)

In formula (X2), $M^{X2}$ represents a metal ion. $Y^{X21}$ to $Y^{X26}$ each represent an atom which coordinates to $M^{X2}$. $Q^{X21}$ to $Q^{X26}$ represent an atomic group forming an aromatic ring or an aromatic heterocyclic ring with $Y^{X21}$ to $Y^{X26}$, respectively. $L^{X21}$ to $L^{X24}$ each represent a single bond, a double bond or a linking group. The bond between $M^{X2}$ and $Y^{X21}$ to $Y^{X26}$ may be either a coordination bond or a covalent bond.

The compound represented by formula (X2) is to be described in detail.

In the formula (X2), $M^{X2}$ has the same meaning as $M^{X1}$ in the above formula (II-C) and a similar preferable range. $Y^{X21}$ to $Y^{X26}$ each represent an atom which coordinates to $M^{X2}$. The bond between $Y^{X21}$ to $Y^{X26}$ and $M^{X2}$ may be a coordinate bond, an ionic bond or a covalent bond. Examples of $Y^{X21}$ to $Y^{X26}$ include a carbon atom, a nitrogen atom, an oxygen atom, a sulfur atom, a phosphorus atom and a silicon atom, and preferably a carbon atom and a nitrogen atom. $Q^{X21}$ to $Q^{X26}$ represent an atomic group forming an aromatic hydrocarbon ring or an aromatic heterocyclic ring containing $Y^{X21}$ to $Y^{X26}$, respectively. Examples of the aromatic hydrocarbon ring or the aromatic heterocyclic ring include a benzene ring, a pyridine ring, a pyrazine ring, a pyrimidne ring, a pyridazine ring, a triazine ring, a pyrrole ring, a pyrazole ring, an imidazole ring, a triazole ring, an oxazole ring, a thiazole ring, an oxadiazole ring, a thiadiazole ring, a thiophene ring, and a furan ring, more preferably a benzene ring, a pyridine ring, a pyrazine ring, a pyrimidine ring, a pyrazole ring, an imidazole ring and a triazole ring, and even more preferably a benzene ring, a pyridine ring, a pyrazine ring, a pyrazole ring and a triazole ring. Among them, a benzene ring and a pyridine ring are particularly preferable. These may have further a condensed ring or a substituent.

$L^{X21}$ to $L^{X24}$ each have the same meaning as $L^{X11}$ to $L^{X14}$ in the above formula (II-C) and a similar preferable range.

The compound represented by the above formula (II-C) is more preferably a compound represented by the following formula (X3). Formula (X3) is to be described.

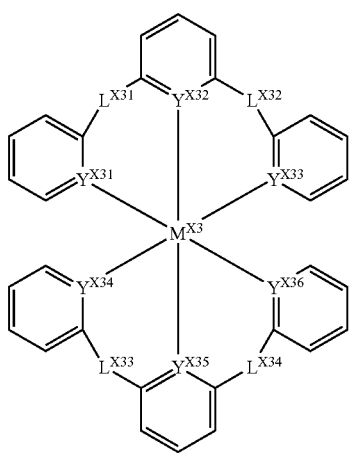

Formula (X3)

In formula (X3), $M^{X3}$ represents a metal ion. $Y^{X31}$ to $Y^{X36}$ each represent a carbon atom, a nitrogen atom or a phosphorus atom. $L^{X31}$ to $L^{X34}$ each represent a single bond, a double bond or a linking group. The bond between $M^{X3}$ and $Y^{X31}$ to $Y^{X36}$ each may be a coordinate bond, an ionic bond or a covalent bond.

$M^{X3}$ has the same meaning as $M^{X1}$ in the above formula (II-C) and a similar preferable range. $Y^{X31}$ to $Y^{X36}$ represent an atom which coordinates to $M^{X3}$. Examples of $Y^{X31}$ to $Y^{X36}$ include a carbon atom, a nitrogen atom and a phosphorus atom, and more preferably a carbon atom and a nitrogen atom. $L^{X31}$ to $L^{X34}$ each have the same meaning as $L^{X11}$ to $L^{X14}$ in the above formula (II-C) and a similar preferable range.

Specific examples of the compound represented by the above formula (I) or the formula (II) include Compound Nos. (1) to (247) described in JP-A No. 20007-103493, but the present invention is not limited to those examples.

Among the compounds described above, however, such compounds are more preferable that the compounds having a ligand selected from a tetradentate ligand containing dipyridyl or phenanthroline as the partial structure, a Schiff base type tetradentate ligand, a phenylbipyridyl tridentate ligand, a diphenylpyridine tridentate ligand and a terpyridine tridentate ligand are excluded.

(Synthesis of Metal Complexes According to the Present Invention)

The metal complexes [compounds represented by the above formula (I), (1), (1-A), (2), (3), (3-B), (3-C), (4), (4-A), (5), (II), (II-A), (II-B), (II-C), (X2) and (X3)] according to the present invention can be synthesized according to various manners.

For example, the compounds can be obtained by reacting a ligand or its dissociated product with a metal compound, in the presence or absence of a solvent (e.g., a halogen solvent, an alcohol solvent, an ether solvent, an ester solvent, a ketone solvent, a nitrile solvent, an amide solvent, a sulfone solvent, a sulfoxide solvent, water or the like), in the presence or absence of a base (various inorganic or organic base, for example, sodium methoxide, potassium t-butoxy, triethylamine, potassium carbonate or the like), at room temperature or below, or by heating (in addition to an ordinary heating, a method of heating by means of microwave is also effective).

A reaction time that is applied in synthesizing the metal complex according to the present invention varies depending on activity of raw materials, and there is no particular limitation as to the reaction time, but preferably the reaction time is in a range of from 1 minute to 5 days, more preferably in a range of from 5 minutes to 3 days, and even more preferably in a range of from 10 minutes to 1 day.

A reaction temperature that is applied in synthesizing the metal complex according to the present invention varies depending on reaction activity, and there is no particular limitation as to the reaction temperature, but preferably the reaction temperature is in a range of from 0° C. to 300° C., more preferably in a range of from 5° C. to 250° C., and even more preferably in a range of from 10° C. to 200° C.

The metal complex in the present invention (e.g., compounds represented by the above formula (I), (1), (1-A), (2), (3), (3-B), (3-C), (4), (4-A), (5), (II), (II-A), (II-B), (II-C), (X2) or (X3)) can be prepared by selecting properly a ligand comprising a partial structure of the intended complex.

For example, the compound represented by formula (1-A) can be synthesized by adding 6,6'-bis(2-hydroxyphenyl)-2,2'-bipyridyl ligand or a derivative thereof (for example, 2,9-bis(2-hydroxyphenyl)-1,10-phenanthroline ligand, 2,9-bis(2-hydroxylphenyl)-4,7-diphenyl-1,10-phenanthroline ligand, 6,6'-bis(2-hydroxy-5-tert-butylphenyl)-2,2'-bipyridyl ligand or the like) preferably in an amount of 0.1 equivalents to 10 equivalents, more preferably 0.3 equivalents to 6 equivalents and even more preferably 0.5 equivalents to 4 equivalents based on a metal compound used. In the synthetic method of the compound represented by formula (I-A), the reaction solvent, the reaction time and the reaction temperature are each similar to that in the above-described synthetic method for the metal complex according to the invention.

The derivatives of 2,2'-bis(2-hydroxyphenyl)-2,2'-bipyridyl ligand can be synthesized according to various conventional methods. For example, they can be synthesized by subjecting a 2,2-bipyridyl derivative (for example, 1,10-phenanthroline or the like) and a anisole derivative (for example, 4-fluoroanisole or the like) to a reaction according to the method described in Journal of Organic Chemistry, 741, 11 (1946). Alternatively, they can be synthesized by subjecting a halogenated 2,2'-bipyridyl derivative (for example, 2,9-dibromo-1,10-phenanthroline or the like) and a 2-methoxyphenyl boronic acid derivative (for example, 2-methoxy-5-fluorophenyl boronic acid or the like) as starting materials, to the Suzuki coupling reaction, followed by elimination of the methyl group as a protective group (according to the method described in Journal of Organic Chemistry, 741, 11 (1946), or the method of heating in the presence of pyridine hydrochloride or the like). Alternatively, they can be synthesized by subjecting a 2,2'-bipyridyl boronic acid derivative (for example, 6,6'-bis(4,4,5,5-tetramethyl-1,3,2-dioxaboryl)-2,2'-bipyridy or the like) and a halogenated anisole derivative (for example, 2-bromoanisole or the like) as starting materials, to the Suzuki coupling reaction, followed by elimination of the methyl group as a protective group (according to the method described in Journal of Organic Chemistry, 741, 11 (1946), the method of heating in the presence of pyridine hydrochloride or the like).

The compound represented by the following formula (III) is to be described.

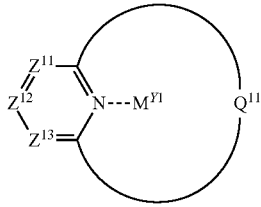

Formula (III)

In formula (III), $Q^{11}$ represents an atomic group forming a nitrogen-containing heterocyclic ring. $Z^{11}$, $Z^{12}$ and $Z^{13}$ each represent a substituted or unsubstituted carbon atom, or a nitrogen atom. $M^{Y1}$ represents a metal ion which may have a ligand further.

In formula (III), $Q^{11}$ represents an atomic group forming a nitrogen-containing heterocyclic ring containing two carbon atoms bonded to $Q^{11}$ and a nitrogen atom bonded directly to the carbon atom. A number of the member in the nitrogen-containing heterocyclic ring formed by $Q^{11}$ is not particularly limited, but is preferably from 12 to 20, more preferably from 14 to 16, and even more preferably 16.

$Z^{11}$, $Z^{12}$ and $Z^{13}$ each independently represent a substituted or unsubstituted carbon atom or a nitrogen atom. With respect to the combination of $Z^{11}$, $Z^{12}$ and $Z^{13}$, at least one of $Z^{11}$, $Z^{12}$ and $Z^{13}$ is preferably a nitrogen atom.

Examples of the substituents on the carbon atom include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentinyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl, or the like), an amino group (having preferably 0 to 30 carbon atoms, more preferably 0 to 20 carbon atoms, and even more preferably 0 to 10 carbon atoms: for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pridyloxy, pyrazyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably from 1 to 30 carbon atoms, more preferably from 1 to 20 carbon atoms, and even more preferably from 1 to 12 carbon atoms; for example, methanesulfonylamino, benzenesulfonylamino or the like), a sulfamoyl group (having preferably 0 to 30 carbon atoms, more preferably 0 to 20 carbon atom, and even more preferably 0 to 12 carbon atoms; for example, sulfamoyl, methylsulfmoyl, dimethylsulfamoyl, phenylsulfamoyl or the like), an carbamoyl group (having preferably 1 to 30 carbon atoms, more preferably 1 to 20 carbon atoms, and even more preferably 1 to 12 carbon atoms; for example, carbamoyl, methylcarbamoyl, diethylcarbamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mercapto group, a halogen atom (for example, a fluorine atom, a chlorine atom, a bromine atom, or an iodide atom), a cyano group, a sulfo group, a carboxy group, a nitro group, a hydroxamic acid group, a sulfino group, a hydrazino group, an imino group, a heterocyclic group (having preferably 1 to 30 carbon atoms and more preferably 1 to 12 carbon atoms; examples of the heteroatom including a nitrogen atom, an oxygen atom and a sulfur atom; the specific examples including an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atom, more preferably 3 to 30 carbon atoms, and even more preferably 3 to 24; for example, trimethylsilyl, triphenylsilyl and the like), and a silyloxy group (having preferably 3 to 40 carbon atoms, more preferably 3 to 30 carbon atoms, and even more preferably 3 to 24 carbon atoms; for example, trimethylsilyloxy, triphenylsilyloxy and the like). These substituents may be substituted further with other substituents.

Among the substituents described above, examples of the substituent on the carbon atom include preferably an alkyl group, an aryl group, a heterocyclic group and a halogen atom, more preferably an aryl group and a halogen atom, and even more preferably a phenyl group and a fluorine atom.

Examples of the substituent on the nitrogen atom include the same substituents as explained for the substituent on the carbon atom and have similar preferable range.

In formula (III), $M^{Y1}$ represents a metal ion which may have a ligand further. Preferably, $M^{Y1}$ is a metal ion having no additional ligand.

The metal ion represented by $M^{Y1}$ is not particularly limited, but a divalent or a trivalent metal ion is preferred. Examples of the divalent and trivalent metal ions include preferably a cobalt ion, a magnesium ion, a zinc ion, a palladium ion, a nickel ion, a copper ion, a platinum ion, a lead ion, an aluminum ion, an iridium ion, and a europium ion, more preferably a cobalt ion, a magnesium ion, a zinc ion, a palladium ion, a nickel ion, a copper ion, a platinum ion, and a lead ion, and even m-ore preferably a copper ion and a platinum ion. Among them, a platinum ion is particularly preferred. $M^{Y1}$ may be bonded or not bonded to an atom included in $Q^{11}$, but preferably bonded to the atom.

The ligand which can be coordinated to $M^{Y1}$ further is not particularly limited, but a monodentate or bidentate ligand is preferred, and more preferred is a bidentate ligand. The atom which coordinates is not particularly limited, but examples thereof include preferably an oxygen atom, a sulfur atom, a nitrogen atom, a carbon atom and a phosphorus atom, more preferably an oxygen atom, a nitrogen atom and a carbon atom, and even more preferably an oxygen atom and a nitrogen atom.

Preferable examples of the compound represented by the above formula (III) include a compound represented by formula (a) to (j) and a tautomer thereof described below.

Examples of the compound represented by formula (III) include preferably a compound represented by formula (a) or (b) and a tautomer thereof, and more preferably a compound represented by formula (b) and a tautomer thereof.

Furthermore, examples of the compound represented by formula (III) include preferably a compound represented by formula (c) or (g).

Examples of the compound represented by formula (c) preferably include a compound represented by formula (d) and a tautomer thereof, a compound represented by formula (e) and a tautomer thereof and a compound represented by formula (f) or a tautomer thereof, more preferably a compound represented by formula (d) or a tautomer thereof, and a compound represented by formula (e) or a tautomer thereof, and even more preferably a compound represented by formula (d) and a tautomer thereof.

Examples of the compound represented by formula (g) preferably include a compound represented by formula (h) and a tautomer thereof, a compound represented by formula (i) and a tautomer thereof, a compound represented by formula (j) and a tautomer thereof, more preferably a compound represented by formula (h) and a tautomer thereof, a compound represented by formula (i) and a tautomer thereof, and even more preferably a compound represented by formula (h) and a tautomer thereof.

The compound represented by formula (a) to (j) is to be described below in detail.

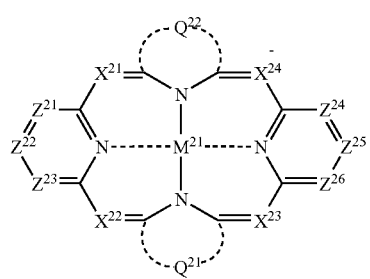

Formula (a)

The compound represented by formula (a) is to be described. In formula (a), $Z^{21}, Z^{22}, Z^{23}, Z^{24}, Z^{25}, Z^{26}$ and $M^{21}$ each have the same meaning as $Z^{11}, Z^{12}, Z^{13}, Z^{11}, Z^{12}, Z^{13}$ and $M^{Y1}$ in the above formula (III) respectively and a similar preferable range.

$Q^{21}$ and $Q^{22}$ each represent a group forming a nitrogen-containing heterocyclic ring. The nitrogen-containing heterocyclic ring formed by $Q^{21}$ or $Q^{22}$ is not particularly limited, but examples thereof include preferably a pyrrole ring, an imidazole ring, a triazole ring, a condensed ring body thereof (for example, benzpyrrole) and a tautomer thereof (for example, in formula (b) described later, a nitrogen-containing 5-membered ring wherein $R^{43}$ and $R^{44}$, or $R^{45}$ and $R^{46}$ are substituted is defined as the tautomer of pyrrole), and more preferably a pyrrole ring and a condensed ring body containing a pyrrole ring (e.g., benzpyrrole).

$X^{21}$, $X^{22}$, $X^{23}$ and $X^{24}$ each independently represent a substituted or unsubstituted carbon atom, or a nitrogen atom, more preferably an unsubstituted carbon atom or a nitrogen atom, and even more preferably a nitrogen atom.

The compound represented by the following formula (b) is to be described.

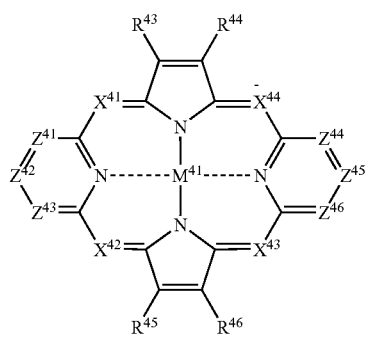

Formula (b)

In formula (b) $Z^{41}$, $Z^{42}$, $Z^{43}$, $Z^{44}$, $Z^{45}$, $Z^{46}$, $X^{41}$, $X^{42}$, $X^{43}$, $X^{44}$ and $M^{41}$ each have the same meaning as $Z^{21}$, $Z^{22}$, $Z^{23}$, $Z^{24}$, $Z^{25}$, $Z^{26}$, $X^{21}$, $X^{22}$, $X^{23}$, $X^{24}$ and $M^{21}$ in the above formula (a) respectively and a similar preferable range.

$R^{43}$, $R^{44}$, $R^{45}$ and $R^{46}$ each independently represent a hydrogen atom, an alkyl group or an aryl group explained as the substituent for $Z^{11}$ or $Z^{12}$ in the above formula (III), or a group forming a ring structure formed by combining $R^{43}$ and $R^{44}$, or $R^{45}$ and $R^{46}$ (for example, benzo condensed ring, pyridine condensed ring or the like), more preferably an alkyl group, an aryl group, or a group forming a ring structure formed by combining $R^{43}$ and $R^{44}$, or $R^{45}$ and $R^{46}$ (for example, benzo condensed ring, pyridine condensed ring or the like), and even more preferably a group forming a ring structure formed by $R^{43}$ and $R^{44}$, or $R^{45}$ and $R^{46}$ (for example, benzo condensed ring, pyridine condensed ring and the like).

$R^{43}$, $R^{44}$, $R^{45}$ and $R^{46}$ each independently represent a hydrogen atom or a substituent. Examples of the substituent include a group explained as the substituent on the carbon atom for $Z^{11}$ or $Z^{12}$ in the above formula (III).

The compound represented by the following formula (c) is to be described.

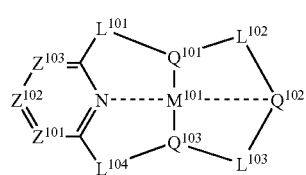

Formula (c)

In formula (c), $Z^{101}$, $Z^{102}$ and $Z^{103}$ each independently represent a substituted or unsubstituted carbon atom or a nitrogen atom. Preferably, at least one of $Z^{101}$, $Z^{102}$ and $Z^{103}$ is a nitrogen atom.

$L^{101}$, $L^{102}$, $L^{103}$ and $L^{104}$ each independently represent a single bond or a linking group. The linking group is not particularly limited, but examples thereof include a carbonyl linking group, an alkylene group, an alkenylene group, an arylene group, a heteroarylene group, a nitrogen-containing heterocyclic linking group, an oxygen atom linking group, an amino linking group, an imino linking group, a carbonyl linking group, a linking group formed by a combination thereof and the like.

$L^{101}$, $L^{102}$, $L^{103}$ and $L^{104}$ each independently represent a single bond, an alkylene group, an alkenylene group, an amino linking group, or an imino linking group, more preferably a single bond, an alkylene group, an alkenylene group, or an imino linking group, and even more preferably a single bond or an alkylene group.

$Q^{101}$ and $Q^{103}$ each independently represent a group which coordinates to $M^{101}$ through a carbon atom, a group which coordinates to $M^{101}$ through a nitrogen atom, a group which coordinates to $M^{101}$ through a phosphorus atom, a group which coordinates to $M^{101}$ through an oxygen atom or a group which coordinates to $M^{101}$ through a sulfur atom.

Examples of the group which coordinates to $M^{101}$ through a carbon atom include an aryl group which coordinates through a carbon atom, a 5-membered heteroaryl group which coordinates through a carbon atom, and a 6-membered heteroaryl group which coordinates through a carbon atom, more preferably an aryl group which coordinates through a carbon atom, a 5-membered nitrogen-containing heteroaryl group which coordinates through a carbon atom and a 6-membered nitrogen-containing heteroaryl group which coordinates through a carbon atom, and even more preferably an aryl group which coordinates through a carbon atom.

Examples of the group which coordinates to $M^{101}$ through a nitrogen atom include a nitrogen-containing 5-membered heteroaryl group which coordinates through a nitrogen atom and a nitrogen-containing 6-membered heteroaryl group which coordinates through a nitrogen atom, and more preferably a nitrogen-containing 6-membered heteroaryl group which coordinates through a nitrogen atom.

Examples of the group which coordinates to $M^{101}$ through a phosphorus atom include an alkylphosphine group c which coordinates through a phosphorus atom, an arylphosphine group which coordinates through a phosphorus atom, an alkoxyphosphine group which coordinates through a phosphorus atom, an aryloxyphosphine group which coordinates through a phosphorus atom, a heteroaryloxyphosphine group which coordinates through a phosphorus atom, a phosphinine group which coordinates through a phosphorus atom, and a phosphole group which coordinates to a phosphorus atom, and more preferably an alkylphosphine group which coordinates through a phosphorus atom, and an arylphosphine group which coordinates through a phosphorus atom.

Examples of the group which coordinates to $M^{101}$ through an oxygen atom include preferably an oxy group and a carbonyl group which coordinates through an oxygen atom, and more preferably an oxy group.

Examples of the group which coordinates to $M^{101}$ through a sulfur atom include preferably a sulfide group, a thiophene group, and a thiazole group, and more preferably a thiophene group.

Examples of $Q^{101}$ and $Q^{103}$ preferably include a group which coordinates to $M^{101}$ through a carbon atom, a group which coordinates to $M^{101}$ through a nitrogen atom, and a group which coordinates to $M^{101}$ through an oxygen atom, more preferably a group which coordinates to $M^{101}$ through a carbon atom and a group which coordinates to $M^{101}$ through a nitrogen atom, and even more preferably a group which coordinates to $M^{101}$ through a carbon atom.

$Q^{102}$ represents a group which coordinates to $M^{101}$ through a nitrogen atom, a group which coordinates to $M^{101}$ through a phosphorus atom, a group which coordinates to $M^{101}$ through an oxygen atom or a group which coordinates to $M^{101}$ through a sulfur atom, and preferably a group which coordinates to $M^{101}$ through a nitrogen atom.

$M^{101}$ has the same meaning as $M^{11}$ in the above formula (I) and a similar preferable range.

The compound represented by formula (d) is to be described.

Formula (d)

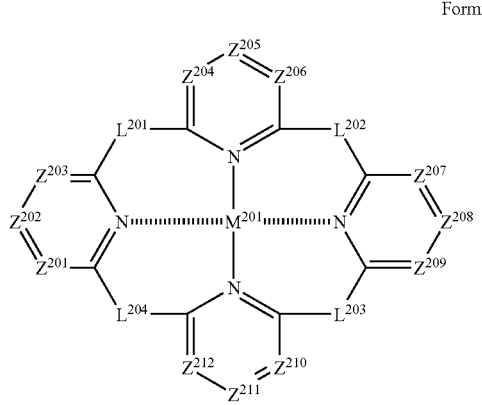

In formula (d), $Z^{201}$, $Z^{202}$, $Z^{203}$, $Z^{207}$, $Z^{208}$, $Z^{209}$, $L^{201}$, $L^{202}$, $L^{203}$, $L^{204}$ and $M^{201}$ each have the same meaning as $Z^{101}$, $Z^{102}$, $Z^{103}$, $Z^{101}$, $Z^{102}$, $Z^{103}$, $L^{101}$, $L^{102}$, $L^{103}$, $L^{104}$ and $M^{101}$ in the above formula (c) respectively, and a similar preferable range. $Z^{204}$, $Z^{205}$, $Z^{206}$, $Z^{210}$, $Z^{211}$ and $Z^{212}$ each represent a substituted or unsubstituted carbon atom, or a nitrogen atom, and more preferably a substituted or unsubstituted carbon atom.

The compound represented by formula (e) is to be described.

Formula (e)

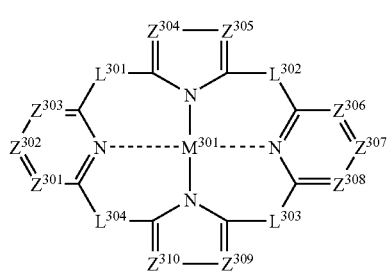

In formula (e), $Z^{301}$, $Z^{302}$, $Z^{303}$, $Z^{304}$, $Z^{305}$, $Z^{306}$, $Z^{307}$, $Z^{308}$, $Z^{309}$, $Z^{310}$, $L^{301}$, $L^{302}$, $L^{303}$, $L^{304}$ and $M^{301}$ each have the same meaning as $Z^{201}$, $Z^{202}$, $Z^{203}$, $Z^{204}$, $Z^{206}$, $Z^{207}$, $Z^{208}$, $Z^{209}$, $Z^{210}$, $Z^{212}$, $L^{101}$, $L^{102}$, $L^{103}$, $L^{104}$ and $M^{101}$ in the above formulae (d) and (c) respectively, and a similar preferable range.

The compound represented by formula (f) is to be described.

Formula (f)

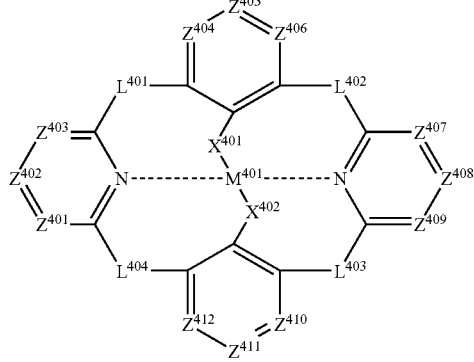

In formula (f), $Z^{401}$, $Z^{402}$, $Z^{403}$, $Z^{404}$, $Z^{405}$, $Z^{406}$, $Z^{407}$, $Z^{408}$, $Z^{409}$, $Z^{410}$, $Z^{411}$, $Z^{412}$, $L^{401}$, $L^{402}$, $L^{403}$, $L^{404}$ and $M^{401}$ each have the same meaning as $Z^{201}$, $Z^{202}$, $Z^{203}$, $Z^{204}$, $Z^{205}$, $Z^{206}$, $Z^{207}$, $Z^{208}$, $Z^{209}$, $Z^{210}$, $Z^{211}$, $Z^{212}$, $L^{101}$, $L^{102}$, $L^{103}$, $L^{104}$ and $M^{101}$ in the above formulae (d) and (c) respectively, and a similar preferable range.

$X^{401}$ and $X^{402}$ each independently represent an oxygen atom, a substituted or unsubstituted nitrogen atom, or a sulfur atom, preferably an oxygen atom or a substituted nitrogen atom, and more preferably an oxygen atom.

The compound represented by formula (g) is to be described.

Formula (g)

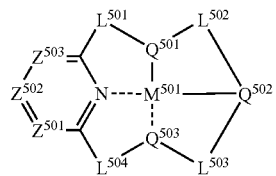

In formula (g), $Z^{501}$, $Z^{502}$, $Z^{503}$, $L^{501}$, $L^{502}$, $L^{503}$, $L^{504}$, $Q^{501}$, $Q^{502}$, $Q^{503}$ and $M^{501}$ each have the same meaning as $Z^{101}$, $Z^{102}$, $Z^{103}$, $L^{101}$, $L^{102}$, $L^{103}$, $L^{104}$, $Q^{101}$, $Q^{103}$, $Q^{102}$ and $M^{101}$ in the above formula (c) respectively, and a similar preferable range.

The compound represented by formula (h) is to be described.

Formula (h)

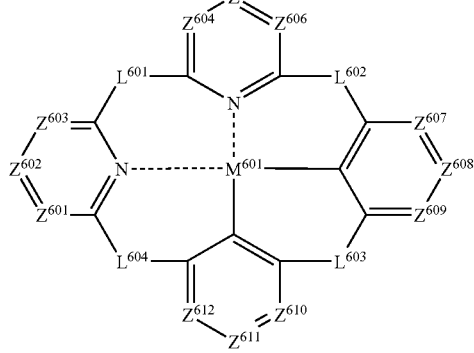

In formula (h), $Z^{601}$, $Z^{602}$, $Z^{603}$, $Z^{604}$, $Z^{605}$, $Z^{606}$, $Z^{607}$, $Z^{608}$, $Z^{609}$, $Z^{610}$, $Z^{611}$, $Z^{612}$, $L^{601}$, $L^{602}$, $L^{603}$, $L^{604}$ and $M^{601}$ each have the same meaning as $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$ and $M^{101}$ in the above formulae (d) and (c) respectively, and a similar preferable range.

The compound represented by formula (i) is to be described.

Formula (i)

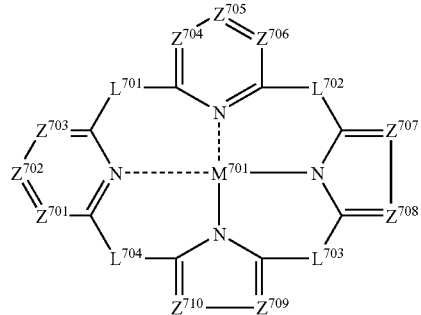

In the formula (i), $Z^{701}$, $Z^{702}$, $Z^{703}$, $Z^{704}$, $Z^{705}$, $Z^{706}$, $Z^{707}$, $Z^{708}$, $Z^{709}$, $Z^{710}$, $L^{701}$, $L^{702}$, $L^{703}$, $L^{704}$ and $M^{701}$ each have the same meaning as $Z^{201}$, $Z^{202}$, $Z^{203}$, $Z^{207}$, $Z^{208}$, $Z^{209}$, $Z^{204}$, $Z^{206}$, $Z^{210}$, $Z^{212}$, $L^{101}$, $L^{102}$, $L^{103}$, $L^{104}$ and $M^{101}$ in the above formulae (d) and (c) respectively, and a similar preferable range.

The compound represented by formula (j) is to be described.

Formula (j)

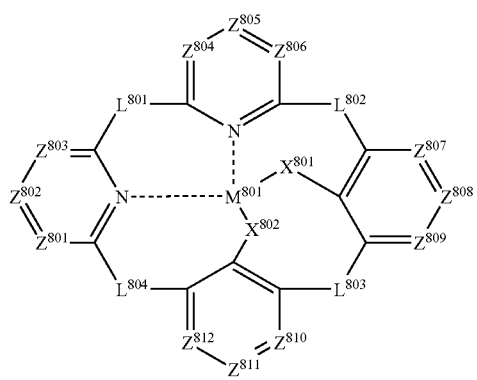

In formula (j), $Z^{801}$, $Z^{802}$, $Z^{803}$, $Z^{804}$, $Z^{805}$, $Z^{806}$, $Z^{807}$, $Z^{808}$, $Z^{809}$, $Z^{810}$, $Z^{811}$, $Z^{812}$, $Z^{801}$, $Z^{802}$, $Z^{803}$, $L^{804}$, $M^{801}$, $X^{801}$ and $X^{802}$ each have the same meaning as $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$, $M^{101}$, $X^{401}$ and $X^{402}$ in the above formulae (d), (c) and (f) respectively, and a similar preferable range.

Specific examples of the compound represented by formula (III) include Compound Nos. (2) to (8), Compound Nos. (15) to (20), Compound Nos. (27) to (32), Compound Nos. (36) to (38), Compound Nos. (42) to (44), Compound Nos. (50) to (52), and Compound Nos. (57) to (154) described in JP-W No. 2006-526278, but the present invention is not limited to these examples.

Furthermore, preferred examples of the metal complex in the present invention include a compound represented by formulae (A-1), (B-1), (C-1), (D-1), (E-1) or (F-1) described below. Formula (A-1) is to be described.

Formula (A-1)

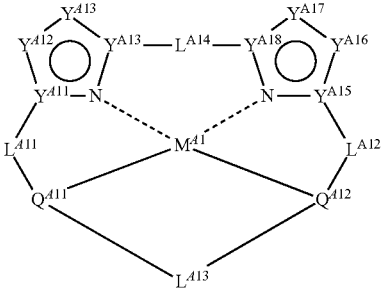

In formula, (A-1), $M^{41}$ represents a metal ion. $Y^{411}$, $Y^{414}$, $Y^{415}$ and $Y^{418}$ each independently represent a carbon atom or a nitrogen atom. $Y^{412}$, $Y^{413}$, $Y^{416}$ and $Y^{417}$ each independently represent a substituted or unsubstituted carbon atom, a substituted or unsubstituted nitrogen atom, an oxygen atom, or a sulfur atom. $L^{A11}$, $L^{A12}$, $L^{A13}$ and $L^{A14}$ each represent a linking group. These linking groups may have the same or different structures. $Q^{A11}$ and $Q^{A12}$ each represent a partial structure having an atom which bonds to $M^{41}$ with a coordinate bond, an ionic bond or a covalent bond.

The compound represented by formula (A-1) is to be described in detail.

$M^{41}$ represents a metal ion. The metal ion is not particularly limited, but examples thereof preferably include a divalent metal ion, more preferably $Pt^{2+}$, $Pd^{2+}$, $Cu^{2+}$, $Ni^{2+}$, $Co^{2+}$, $Zn^{2+}$, $Mg^{2+}$ and $Pb^{2+}$, and even more preferably $Pt^{2+}$ and $Cu^{2+}$. Among them, $Pt^{2+}$ is particularly preferable.

$Y^{411}$, $Y^{414}$, $Y^{415}$ and $Y^{418}$ each independently represent a carbon atom or a nitrogen atom. Preferably, $Y^{411}$, $Y^{414}$, $Y^{415}$ and $Y^{418}$ represent a carbon atom.

$Y^{412}$, $Y^{413}$, $Y^{416}$ and $Y^{417}$ each independently represent a substituted or unsubstituted carbon atom, a substituted or unsubstituted nitrogen atom, an oxygen atom or a sulfur atom. Preferably $Y^{412}$, $Y^{413}$, $Y^{416}$ and $Y^{417}$ represent a substituted or unsubstituted carbon atom or a substituted or unsubstituted nitrogen atom.

$L^{A11}$, $L^{A12}$, $L^{A13}$ and $L^{A14}$ each represent a divalent linking group. Examples of the divalent linking group represented by $L^{A11}$, $L^{A12}$, $L^{A13}$ or $L^{A14}$ include preferably a single bond and a linking group comprising carbon, nitrogen, silicon, sulfur, oxygen, germanium or phosphorus, more preferably a single bond, a substituted or unsubstituted carbon atom, a substituted or unsubstituted nitrogen atom, a substituted silicon atom, an oxygen atom, a sulfur atom, a divalent aromatic hydrocarbon ring group and a divalent aromatic heterocyclic group, and even more preferably a single bond, a substituted or unsubstituted carbon atom, a substituted or unsubstituted nitrogen atom, a substituted silicon atom, a divalent aromatic hydrocarbon ring group and a divalent aromatic heterocyclic group. Among them, a single bond and a substituted or unsubstituted methylene group are particularly preferable. Examples of the divalent linking group represented by $L^{A11}$, $L^{A12}$, $L^{A13}$ or $L^{A14}$ are described below.

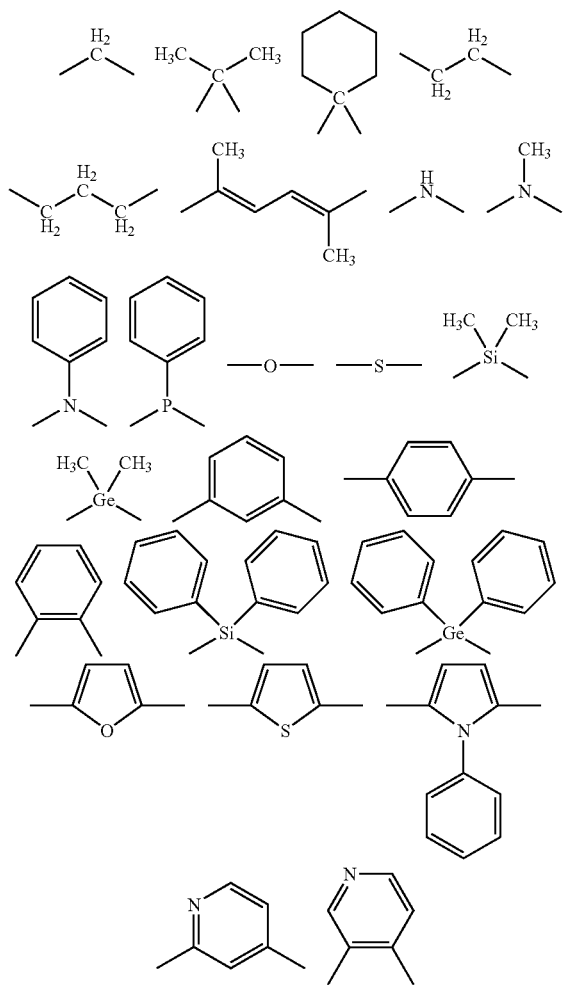

The divalent linking group represented by $L^{A11}$, $L^{A12}$, $L^{A13}$ or $L^{A14}$ may be substituted further with other substituents. Examples of the substituent to be introduced thereto include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl or the like), an alkynyl group (having preferably 2 to 30 carbon atoms, more preferably 2 to 20 carbon atoms, and even more preferably 2 to 10 carbon atoms; for example, propargyl, 3-pentinyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), a sulfonylamino group (having preferably 1 to 30 carbon atoms, more preferably 1 to 20 carbon atoms, and even more preferably 1 to 12 carbon atoms; for example, methanesulfonylamino, benzenesulfonylamino or the like), a sulfamoyl group (having preferably 0 to 30 carbon atoms, more preferably 0 to 20 carbon atoms, and even more preferably 0 to 12 carbon atoms; for example, sulfamoyl, methylsulfamoyl, dimethylsulfamoyl, phenylsulfamoyl or the like), a carbamoyl group (having preferably 1 to 30 carbon atoms, more preferably 1 to 20 carbon atoms, and even more preferably 1 to 12 carbon atoms; for example, carbamoyl, methylcarbamoyl, diethylcabamoyl, phenylcarbamoyl or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a sulfonyl group (having preferably 1 to 30 carbon atoms, more preferably 1 to 20 carbon atoms, and even more preferably 1 to 12 carbon atoms; for example, mesyl, tosyl or the like), a sulfinyl group (having preferably 1 to 30 carbon atoms, more preferably 1 to 20 carbon atoms, and even more preferably 1 to 12 carbon atoms; for example, methanesulfinyl, benzenesulfinyl or the like), a ureido group (having preferably 1 to 30 carbon atoms, more preferably 1 to 20 carbon atoms, and even more preferably 1 to 12 carbon atoms; for example, ureido, methylureido, phenylureido or the like), a phosphoric amido group (having preferably 1 to 30 carbon atoms, more preferably 1 to 20 carbon atoms, and even more preferably 1 to 12 carbon atoms; for example, diethylphosphoric amido, phenylphosphoric amido or the like), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, a heterocyclic group (having preferably 1 to 30 carbon atoms, and, more preferably 1 to 12 carbon atoms; examples of the heteroatom including a nitrogen atom, an oxygen atom and a sulfur atom; for example, an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like), and a silyloxy group (having preferably 3 to 40 carbon atoms, more preferably 3 to 30 carbon atoms, and even more preferably 3 to 24 carbon atoms; for example, trimethylsilyloxy, triphenyl-silyloxy or the like).

These substituents may be substituted further with other substituents. Examples of the substituent preferably include an alkyl group, an aryl group, a heterocyclic group, a halogen atom and a silyl group, more preferably an alkyl group, an aryl group, a heterocyclic ring group and a halogen atom, and even more preferably an alkyl group, an aryl group, an aromatic heterocyclic group and a fluorine atom.

$Q^{411}$ and $Q^{412}$ each represent a partial structure containing an atom which bonds to $M^{41}$ with a coordinate bond, an ionic bond or a covalent bond. $Q^{411}$ and $Q^{412}$ each independently represent preferably a group which bonds to $M^{41}$ through a carbon atom, a group which bonds to $M^{41}$ through a nitrogen atom, a group which bonds to $M^{41}$ through a silicon atom, a group which bonds to $M^{41}$ through a phosphorus atom, a group which bonds to $M^{41}$ through a oxygen atom or a group which bonds to $M^{41}$ through a sulfur atom, more preferably a group which bonds to $M^{41}$ through a carbon atom, a group which bonds to $M^{41}$ through a nitrogen atom, a group which bonds to $M^{41}$ through an oxygen atom or a group which bonds to $M^{41}$ through a sulfur atom, and even more preferably a group which bonds to $M^{41}$ through a carbon atom or a group which bonds to $M^{41}$ through a nitrogen atom. Among them, a group which bonds to $M^{41}$ through a carbon atom is particularly preferable.

Examples of the group which bonds through a carbon atom include preferably an aryl group which bonds through a carbon atom, a heteroaryl group having a 5-membered ring which bonds through a carbon atom and a heteroaryl group having a 6-membered ring which bonds through a carbon atom, more preferably an aryl group which bonds through a carbon atom, a heteroaryl group having a nitrogen-containing 5-membered ring which bonds through a carbon atom and a heteroaryl group having a nitrogen-containing 6-membered ring which bonds through a carbon atom, and particularly preferably an aryl group which bonds through a carbon atom.

Examples of the group which bonds through a nitrogen atom include a substituted amino group and a heteroaryl group having a nitrogen-containing 5-membered ring which bonds through a nitrogen atom, and particularly preferably a heteroaryl group having a nitrogen-containing 5-membered ring which bonds through a nitrogen atom.

Examples of the group which bonds through a phosphorus atom include preferably a substituted phosphino group. Examples of the group which bonds through a silicon atom include preferably a substituted silyl group. Examples of the group which bonds through an oxygen atom include preferably an oxy group. Examples of the group which bonds through a sulfur atom include preferably a sulfide group.

The compound represented by the above formula (A-1) is more preferably a compound represented by formula (A-2), (A-3) or (A-4) described below.

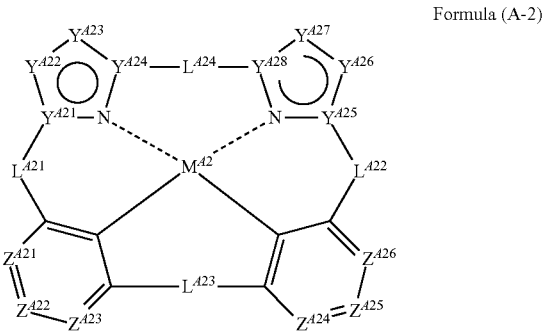

Formula (A-2)

In formula (A-2), $M^{42}$ represents a metal ion. $Y^{421}$, $Y^{424}$, $Y^{425}$ and $Y^{428}$ each independently represent a carbon atom or a nitrogen atom. $Y^{422}$, $Y^{423}$, $Y^{426}$ and $Y^{427}$ each independently represent a substituted or unsubstituted carbon atom, a substituted or unsubstituted nitrogen atom, an oxygen atom, or a sulfur atom. $L^{421}$, $L^{422}$, $L^{423}$ and $L^{424}$ each represent a linking group. $Z^{421}$, $Z^{422}$, $Z^{423}$, $Z^{424}$, $Z^{425}$ and $Z^{426}$ each independently represent a nitrogen atom, or a substituted or unsubstituted carbon atom.

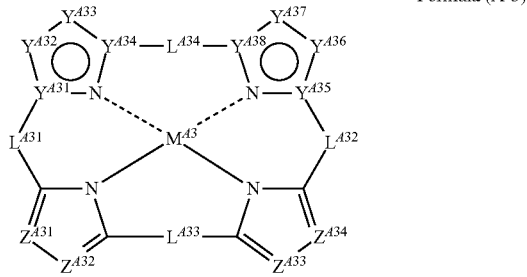

Formula (A-3)

In formula (A-3), $M^{43}$ represents a metal ion. $Y^{431}$, $Y^{434}$, $Y^{435}$ and $Y^{438}$ each independently represent a carbon atom, or a nitrogen atom. $Y^{432}$, $Y^{433}$, $Y^{436}$ and $Y^{437}$ each independently represent a substituted or unsubstituted carbon atom, a substituted or unsubstituted nitrogen atom, an oxygen atom or a sulfur atom. $L^{431}$, $L^{432}$, $L^{433}$ and $L^{434}$ each represent a linking group. $Z^{431}$, $Z^{432}$, $Z^{433}$ and $Z^{434}$ each independently represent a nitrogen atom, or a substituted or unsubstituted carbon atom.

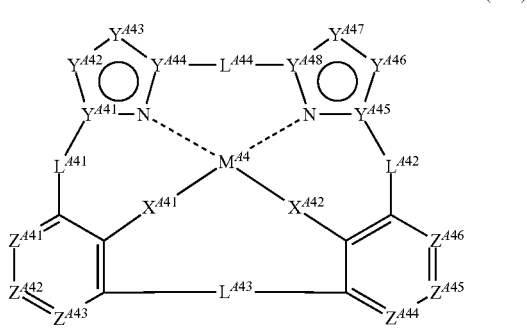

Formula (A-4)

In formula (A-4), $M^{A4}$ represents a metal ion. $Y^{A41}$, $Y^{A44}$, $Y^{A45}$ and $Y^{A48}$ each independently represent a carbon atom or a nitrogen atom. $Y^{A42}$, $Y^{A43}$, $Y^{A46}$ and $Y^{A47}$ each independently represent a substituted or unsubstituted carbon atom, a substituted or unsubstituted nitrogen atom, an oxygen atom, or a sulfur atom. $L^{A41}$, $L^{A42}$, $L^{A43}$ and $L^{A44}$ each represent a linking group. $Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. $X^{A41}$ and $X^{A42}$ each independently represent an oxygen atom, a sulfur atom, or a substituted or unsubstituted nitrogen atom.

The compound represented by formula (A-2) is to be described in detail.

$M^{A2}$, $Y^{A21}$, $Y^{A24}$, $Y^{A25}$, $Y^{A28}$, $Y^{A22}$, $Y^{A23}$, $Y^{A26}$, $Y^{A27}$, $Y^{A21}$, $Y^{A22}$, $L^{A23}$ and $L^{A24}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in the formula (A-1) respectively, and a similar preferable range.

$Z^{A21}$, $Z^{A22}$, $Z^{A23}$, $Z^{A24}$, $Z^{A25}$ and $Z^{A26}$ each independently represent a nitrogen atom, or a substituted or unsubstituted carbon atom. Preferably, $Z^{A21}$, $Z^{A22}$, $Z^{A23}$, $Z^{A24}$, $Z^{A25}$ and $Z^{A26}$ each independently represent a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (A-3) is to be described in detail. $M^{A3}$, $Y^{A31}$, $Y^{A34}$, $Y^{A35}$, $Y^{A38}$, $Y^{A32}$, $Y^{A33}$, $Y^{A36}$, $Y^{A37}$, $L^{A31}$, $L^{A32}$, $L^{A33}$, and $L^{A34}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in the above formula (A-1) respectively, and a similar preferable range.

$Z^{A31}$, $Z^{A32}$, $Z^{A33}$ and $Z^{A34}$ each independently represent a nitrogen atom, or a substituted or unsubstituted carbon atom. $Z^{A31}$, $Z^{A32}$, $Z^{A33}$ and $Z^{A34}$ are each preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (A-4) is to be described in detail.

$M^{A4}$, $Y^{A41}$, $Y^{A44}$, $Y^{A45}$, $Y^{A48}$, $Y^{A42}$, $Y^{A43}$, $Y^{A46}$, $Y^{A47}$, $L^{A41}$, $L^{A42}$, $L^{A43}$ and $L^{A44}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in the above formula (A-1) respectively, and a similar preferable range. $Z^{A41}$, $Z^{A42}$, $Z^{A43}$, $Z^{A44}$, $Z^{A45}$ and $Z^{A46}$ each independently represent a nitrogen atom, or a substituted or unsubstituted carbon atom. Preferably, $Z^{A41}$, $Z^{A42}$, $Z^{A43}$, $Z^{A44}$, $Z^{A45}$ and $Z^{A46}$ are each independently a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

$X^{A41}$ and $X^{A42}$ each independently represent an oxygen atom, a sulfur atom, or a substituted or unsubstituted nitrogen atom.

Preferably, $X^{A41}$ and $X^{A42}$ each independently represent an oxygen atom or a sulfur atom, and more preferably an oxygen atom.

Specific examples of the compound represented by formula (A-1) include Compound Nos. (A1) to (A80) described in JP-A No. 2007-103493, but the present invention is not limited to these examples.

Preferred compounds among the metal complexes according to the present invention include a compound represented by the following formula (B-1).

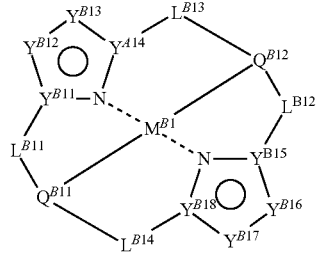

Formula (B-1)

In formula (B-1), $M^{B1}$ represents a metal ion. $Y^{B11}$, $Y^{B14}$, $Y^{B15}$ and $Y^{B18}$ each independently represent a carbon atom or a nitrogen atom. $Y^{B12}$, $Y^{B13}$, $Y^{B16}$ and $Y^{B17}$ each independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ each represent a linking group. $Q^{B11}$ and $Q^{B12}$ each represent a partial structure containing an atom which bonds to $M^{B1}$ with a covalent bond.

Formula (B-1) is to be described in detail.

In formula (B-1), $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ each have the same meaning as $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$ in the above formula (A-1) respectively and a similar preferable range.

The compound represented by formula (B-1) is more preferably a compound represented by the following formula (B-2), (B-3) or (B-4).

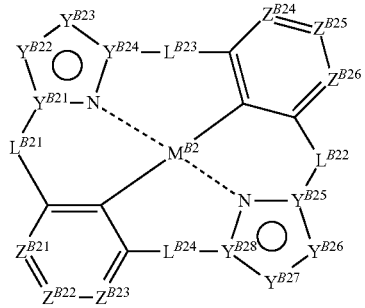

Formula (B-2)

In formula (B-2), $M^{B2}$ represents a metal ion. $Y^{B21}$, $Y^{B24}$, $Y^{B25}$ and $Y^{B28}$ each independently represent a carbon atom or a nitrogen atom. $Y^{B22}$, $Y^{B23}$, $Y^{B26}$ and $Y^{B27}$ each independently represent a substituted or unsubstituted carbon atom, a substituted or unsubstituted nitrogen atom, an oxygen atom, or a sulfur atom. $L^{B21}$, $L^{B22}$, $L^{B23}$ and $L^{B24}$ each represent a linking group. $Z^{B21}$, $Z^{B22}$, $Z^{B23}$, $Z^{B24}$, $Z^{B25}$ and $Z^{B26}$ each independently represent a nitrogen atom, or a substituted or unsubstituted carbon atom.

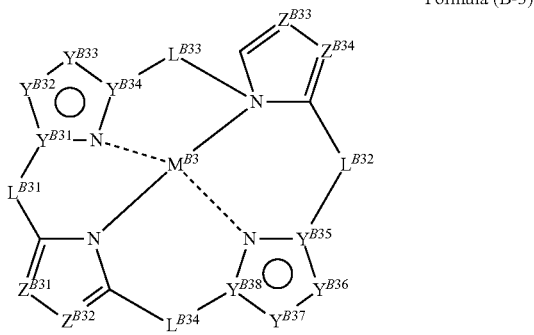

Formula (B-3)

In formula (B-3), $M^{B3}$ represents a metal ion. $Y^{B31}$, $Y^{B34}$, $Y^{B35}$ and $Y^{B38}$ each independently represent a carbon atom or a nitrogen atom. $Y^{B32}$, $Y^{B33}$, $Y^{B36}$ and $Y^{B37}$ each independently represent a substituted or unsubstituted carbon atom, a substituted or unsubstituted nitrogen atom, an oxygen atom, or a sulfur atom. $L^{B31}$, $L^{B32}$, $L^{B33}$ and $L^{B34}$ each represent a linking group. $Z^{B31}$, $Z^{B32}$, $Z^{B33}$ and $Z^{B34}$ each independently represent a nitrogen atom, or a substituted or unsubstituted carbon atom.

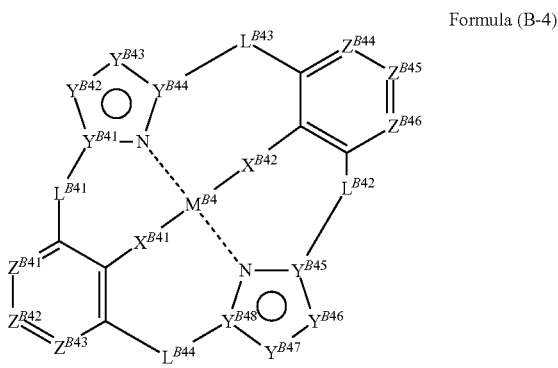

Formula (B-4)

In formula (B-4), $M^{B4}$ represents a metal ion. $Y^{B41}$, $Y^{B44}$, $Y^{B45}$ and $Y^{B48}$ each independently represent a carbon atom or a nitrogen atom. $Y^{B42}$, $Y^{B43}$, $Y^{B46}$ and $Y^{B47}$ each independently represent a substituted or unsubstituted carbon atom, a substituted or unsubstituted nitrogen atom, an oxygen atom, or a sulfur atom. $L^{B41}$, $L^{B42}$, $L^{B43}$ and $L^{B44}$ each represent a linking group. $Z^{B41}$, $Z^{B42}$, $Z^{B43}$, $Z^{B44}$, $Z^{B45}$ and $Z^{B46}$ each independently represent a nitrogen atom, or a substituted or unsubstituted carbon atom. $X^{B41}$ and $X^{B42}$ each independently represent an oxygen atom, a sulfur atom, or a substituted or unsubstituted nitrogen atom.

The compound represented by formula (B-2) is to be described in detail.

In formula (B-2), $M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the above formula (B-1) respectively, and a similar preferable range.

$Z^{B21}$, $Z^{B22}$, $Z^{B23}$, $Z^{B24}$, $Z^{B25}$ and $Z^{B26}$ each independently represent a nitrogen atom, or a substituted or unsubstituted carbon atom. $Z^{B21}$, $Z^{B22}$, $Z^{B23}$, $Z^{B24}$, $Z^{B25}$ and $Z^{B26}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (B-3) is to be described in detail.

In formula (B-3), $M^{B3}$, $Y^{B31}$, $Y^{B34}$, $Y^{B35}$, $Y^{B38}$, $Y^{B32}$, $Y^{B33}$, $Y^{B36}$, $Y^{B37}$, $L^{B31}$, $L^{B32}$, $L^{B33}$ and $L^{B34}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in formula (B-1) respectively, and a similar preferable range. $Z^{B31}$, $Z^{B32}$, $Z^{B33}$ and $Z^{B34}$ each independently represent a nitrogen atom, or a substituted or unsubstituted carbon atom. $Z^{B31}$, $Z^{B32}$, $Z^{B33}$ and $Z^{B34}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

The compound represented by formula (B-4) is to be described in detail.

In formula (B-4), $M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$ and $L^{B44}$ each have the same meaning as $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in the above formula (B-1) respectively, and a similar preferable range.

$Z^{B41}$, $Z^{B42}$, $Z^{B43}$, $Z^{B44}$, $Z^{B45}$ and $Z^{B46}$ each independently represent a nitrogen atom, or a substituted or unsubstituted carbon atom. $Z^{B41}$, $Z^{B42}$, $Z^{B43}$, $Z^{B44}$, $Z^{B45}$ and $Z^{B46}$ each represent preferably a substituted or unsubstituted carbon atom, and more preferably an unsubstituted carbon atom. As the substituent on the carbon atom, the substituent for the divalent linking group represented by $L^{A11}$, $L^{A12}$, $L^{A13}$ or $L^{A14}$ in the above formula (A-1) can be applied.

$X^{B41}$ and $X^{B42}$ each independently represent an oxygen atom, a sulfur atom, or a substituted or unsubstituted nitrogen atom. $X^{B41}$ and $X^{B42}$ each preferably represent an oxygen atom or a sulfur atom, and more preferably an oxygen atom.

Specific examples of the compound represented by the formula (B-1) include Compound Nos. (B1) to (B55) described in JP-A No. 2007-103493, but the present invention is not limited to these compounds.

One of the preferable compounds among the metal complexes in the present invention is a compound represented by the following formula (C-1).

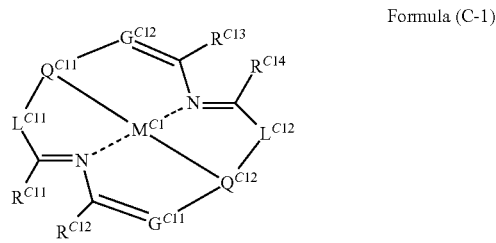

Formula (C-1)

In formula (C-1), $M^{C1}$ represents a metal ion. $R^{C11}$ and $R^{C12}$ each independently represent a hydrogen atom, a substituent forming a 5-membered ring by combining each other or a substituent which does not link together. $R^{C13}$ and $R^{C14}$ each independently represent a hydrogen atom, a substituent forming a 5-membered ring by combining each other or a substituent which does not link together. $G^{C11}$ and $G^{C12}$ each independently represent a nitrogen atom, or a substituted or unsubstituted carbon atom. $L^{C11}$ and $L^{C12}$ each represent a linking group. $Q^{C11}$ and $Q^{C12}$ each represent a partial structure containing an atom which bonds to $M^{C1}$ with a coordination bond, an ionic bond or a covalent bond.

Formula (C-1) is to be described in detail.

In formula (C-1), $M^{C1}$, $L^{C11}$, $L^{C12}$, $Q^{C11}$ and $Q^{C12}$ each have the same meaning as $M^{A1}$, $L^{A11}$, $L^{A12}$, $Q^{A11}$ and $Q^{A12}$ in the above formula (A-1) respectively and a similar preferable range.

$G^{C21}$ and $G^{C22}$ each independently represent a nitrogen atom or a substituted or unsubstituted carbon atom, preferably a nitrogen atom or an unsubstituted carbon atom, and more preferably a nitrogen atom. $R^{C11}$ and $R^{C12}$ each independently represent a hydrogen atom or a substituent. $R^{C11}$ and $R^{C12}$ may link together to form a 5-membered ring. $R^{C13}$ and $R^{C14}$ each independently represent a hydrogen atom or a substituent. $R^{C13}$ and $R^{C14}$ may link together to form a 5-membered ring.

Examples of the substituent represented by $R^{C11}$, $R^{C12}$, $R^{C13}$ or $R^{C14}$ include an alkyl group (having preferably 1 to 30 carbon atoms, more preferably 1 to 20 carbon atoms, and even more preferably 1 to 10 carbon atoms; for example, methyl, ethyl, iso-propyl, tert-butyl, n-octyl, n-decyl, n-hexadecyl, cyclopropyl, cyclopentyl, cyclohexyl, or the like), an alkenyl group (having preferably 2 to 30 carbon atoms, more preferably 2 to 20 carbon atoms, and even more preferably 2 to 10 carbon atoms; for example, vinyl, allyl, 2-butenyl, 3-pentenyl, or the like), an alkynyl group (having preferably 2 to 30 carbon atoms, more preferably 2 to 20 carbon atoms, and even more preferably 2 to 10 carbon atoms; for example, propargyl, 3-pentinyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl, anthranyl or the like), an amino group (having preferably 0 to 30 carbon atoms, more preferably 0 to 20 carbon atoms, and even more preferably 0 to 10 carbon atoms; for example, amino, methylamino, dimethylamino, diethylamino, dibenzylamino, diphenylamino, ditolylamino or the like), an alkoxy group (having preferably 1 to 30 carbon atoms, more preferably 1 to 20 carbon atoms, and even more preferably 1 to 10 carbon atoms; for example, methoxy, ethoxy, butoxy, 2-ethylhexyloxy or the like), an aryloxy group (having preferably 6 to 30 carbon atoms, more preferably 6 to 20 carbon atoms, and even more preferably 6 to 12 carbon atoms; for example, phenyloxy, 1-naphthyloxy, 2-naphthyloxy or the like), a heterocyclic oxy group (having preferably 1 to 30 carbon atoms, more preferably 1 to 20 carbon atoms, and even more preferably 1 to 12 carbon atoms; for example, pyridyloxy, pyrazinyloxy, pyrimidyloxy, quinolyloxy or the like), an acyl group (having preferably 1 to 30 carbon atoms, more preferably 1 to 20 carbon atoms, and even more preferably 1 to 12 carbon atoms; for example, acetyl, benzoyl, formyl, pivaloyl or the like), an alkoxycarbonyl group (having preferably 2 to 30 carbon atoms, more preferably 2 to 20 carbon atoms, and even more preferably 2 to 12 carbon atoms; for example, methoxycarbonyl, ethoxycarbonyl or the like), an aryloxycarbonyl group (having preferably 7 to 30 carbon atoms, more preferably 7 to 20 carbon atoms, and even more preferably 7 to 12 carbon atoms; for example, phenyloxycarbonyl or the like), an acyloxy group (having preferably 2 to 30 carbon atoms, more preferably 2 to 20 carbon atoms, and even more preferably 2 to 10 carbon atoms; for example, acetoxy, benzoyloxy or the like), an acylamino group (having preferably 2 to 30 carbon atoms, more preferably 2 to 20 carbon atoms, and even more preferably 2 to 10 carbon atoms; for example, acetylamino, benzoylamino or the like), an alkoxycarbonylamino group (having preferably 2 to 30 carbon atoms, more preferably 2 to 20 carbon atoms, and even more preferably 2 to 12 carbon atoms; for example, methoxycarbonylamino or the like), an aryloxycarbonylamino group (having preferably 7 to 30 carbon atoms, more preferably 7 to 20 carbon atoms, and even more preferably 7 to 12 carbon atoms; for example, phenyloxycarbonylamino or the like), an alkylthio group (having preferably 1 to 30 carbon atoms, more preferably 1 to 20 carbon atoms, and even more preferably 1 to 12 carbon atoms; for example, methylthio, ethylthio or the like), an arylthio group (having preferably 6 to 30 carbon atoms, more preferably 6 to 20 carbon atoms, and even more preferably 6 to 12 carbon atoms; for example, phenylthio or the like), a heterocyclic thio group (having preferably 1 to 30 carbon atoms, more preferably 1 to 20 carbon atoms, and even more preferably 1 to 12 carbon atoms; for example, pyridylthio, 2-benzimidazolylthio, 2-benzoxazolylthio, 2-benzthiazolylthio or the like), a halogen atom (for example, a fluorine atom, a chlorine atom, a bromine atom, or an iodine atom), a cyano group, a heterocyclic group (having preferably 1 to 30 carbon atoms, and more preferably 1 to 12 carbon atoms; examples of the heteroatom including a nitrogen atom, an oxygen atom and a sulfur atom; for example, an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group or the like), a silyl group (having preferably 3 to 40 carbon atoms, more preferably 3 to 30 carbon atoms, and even more preferably 3 to 24 carbon atoms; for example, trimethylsilyl, triphenylsilyl or the like) and a silyloxy group (having preferably 3 to 40 carbon atoms, more preferably 3 to 30 carbon atoms and even more preferably 3 to 24 carbon atoms; for example, trimethylsilyloxy, triphenylsilyloxy or the like).

Preferred examples of the substituent represented by $R^{C11}$, $R^{C12}$, $R^{C13}$ or $R^{C14}$ include an alkyl group, an aryl group, a group forming a 5-membered ring by combining $R^{C11}$ and $R^{C12}$, or $R^{C13}$ and $R^{C14}$, and more preferably a group forming a 5-membered ring by combining $R^{C11}$ and $R^{C12}$, or $R^{C13}$ and $R^{C14}$.

The compound represented by formula (C-1) is preferably a compound represented by the following formula (C-2).

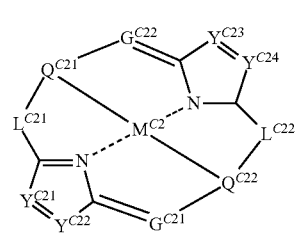

Formula (C-2)

In formula (C-2), $M^{C2}$ represents a metal ion.

$Y^{C21}$, $Y^{C22}$, $Y^{C23}$ and $Y^{C24}$ each independently represent a nitrogen atom, or a substituted or unsubstituted carbon atom. $G^{C21}$ and $G^{C22}$ each independently represent a nitrogen atom, or a substituted or unsubstituted carbon atom. $L^{C21}$ and $L^{C22}$ each represent a linking group. $Q^{C21}$ and $Q^{C22}$ each represent a partial structure containing an atom which bonds to $M^{C2}$ with a coordination bond, an ionic bond or a covalent bond.

Formula (C-2) is to be described in detail.

In the formula (C-2), $M^{C2}$, $L^{C21}$, $L^{C22}$, $Q^{C21}$, $Q^{C22}$, $G^{C21}$ and $G^{C22}$ each have the same meaning as $M^{C1}$, $L^{C11}$, $L^{C12}$, $Q^{C11}$, $Q^{C12}$, $G^{C11}$ and $G^{C12}$ in the above formula (C-1) respectively and a similar preferable range.

$Y^{C21}$, $Y^{C22}$, $Y^{C23}$ and $Y^{C24}$ each independently represent a nitrogen atom, or a substituted or unsubstituted carbon atom, more preferably a substituted or unsubstituted carbon atom, and even more preferably an unsubstituted carbon atom.

The compound represented by formula (C-2) is preferably a compound represented by the following formula (C-3), (C-4) or (C-5).

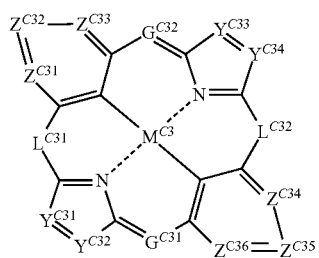

Formula (C-3)

In formula (C-3), $M^{C3}$ represents a metal ion.

$Y^{C31}$, $Y^{C32}$, $Y^{C33}$ and $Y^{C34}$ each independently represent a nitrogen atom, or a substituted or unsubstituted carbon atom. $G^{C31}$ and $G^{C32}$ each independently represent a nitrogen atom, or a substituted or unsubstituted carbon atom. $L^{C31}$ and $L^{C32}$ each represent a linking group. $Z^{C31}$, $Z^{C32}$, $Z^{C33}$, $Z^{C34}$, $Z^{C35}$ and $Z^{C36}$ each independently represent a nitrogen atom, or a substituted or unsubstituted carbon atom.

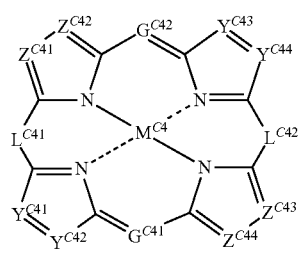

Formula (C-4)

In formula (C-4), $M^{C4}$ represents a metal ion. $Y^{C41}$, $Y^{C42}$, $Y^{C43}$ and $Y^{C44}$ each independently represent a nitrogen atom, or a substituted or unsubstituted carbon atom. $G^{C41}$ and $G^{C42}$ each independently represent a nitrogen atom, or a substituted or unsubstituted carbon atom. $L^{C41}$ and $L^{C42}$ each represent a linking group. $Z^{C41}$, $Z^{C42}$, $Z^{C43}$ and $Z^{C44}$ each independently represent a nitrogen atom, or a substituted or unsubstituted carbon atom.

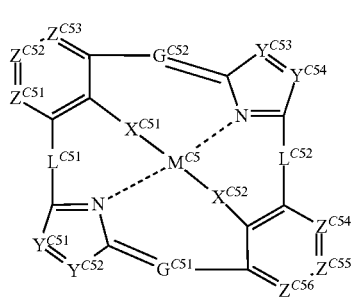

Formula (C-5)

In formula (C-5), $M^{C5}$ represents a metal ion.

$Y^{C51}$, $Y^{C52}$, $Y^{C53}$ and $Y^{C54}$ each independently represent a nitrogen atom, or a substituted or unsubstituted carbon atom. $G^{C51}$ and $G^{C52}$ each independently represent a nitrogen atom, or a substituted or unsubstituted carbon atom. $L^{C51}$ and $L^{C52}$ each represent a linking group. $Z^{C51}$, $Z^{C52}$, $Z^{C53}$, $Z^{C54}$, $Z^{C55}$ and $Z^{C56}$ each independently represent a nitrogen atom, or a substituted or unsubstituted carbon atom. $X^{C51}$ and $X^{C52}$ each independently represent an oxygen atom, a sulfur atom, or a substituted or unsubstituted nitrogen atom.

The compound represented by formula (C-3) is to be described in detail.

In the formula (C-3), $M^{C3}$, $L^{C31}$, $L^{C32}$, $G^{C31}$ and $G^{C32}$ each have the same meaning as $M^{C1}$, $L^{C11}$, $L^{C12}$, $G^{C11}$ and $G^{C12}$ in the above formula (C-1) respectively and a similar preferable range.

$Z^{C31}$, $Z^{C32}$, $Z^{C33}$, $Z^{C34}$, $Z^{C35}$ and $Z^{C36}$ each independently represent a nitrogen atom, or a substituted or unsubstituted carbon atom. $Z^{C31}$, $Z^{C32}$, $Z^{C33}$, $Z^{C34}$, $Z^{C35}$ and $Z^{C36}$ each preferably represent a substituted or unsubstituted carbon atom, and more preferably an unsubstituted carbon atom.

The compound represented by formula (C-4) is to be described in detail.

In formula (C-4), $M^{C4}$, $L^{C41}$, $L^{C42}$, $G^{C41}$ and $G^{C42}$ each have the same meaning as $M^{C1}$, $L^{C11}$, $L^{C12}$, $G^{C11}$ and $G^{C12}$ in the above formula (C-1) respectively and a similar preferable range.

$Z^{C41}$, $Z^{C42}$, $Z^{C43}$ and $Z^{C44}$ each independently represent a nitrogen atom, or a substituted or unsubstituted carbon atom. $Z^{C41}$, $Z^{C42}$, $Z^{C43}$ and $Z^{C44}$ each preferably represent a substituted or unsubstituted carbon atom, and more preferably an unsubstituted carbon atom.

The compound represented by formula (C-5) is to be described in detail.

$M^{C5}$, $L^{C51}$, $L^{C52}$, $G^{C51}$ and $G^{C52}$ each have the same meaning as $M^{C1}$, $L^{C11}$, $L^{C12}$, $G^{C11}$ and $G^{C12}$ in the above formula (C-1) respectively, and a similar preferable range.

$Z^{C51}$, $Z^{C52}$, $Z^{C53}$, $Z^{C54}$, $Z^{C55}$ and $Z^{C56}$ each independently represent a nitrogen atom, or a substituted or unsubstituted carbon atom. $Z^{C51}$, $Z^{C52}$, $Z^{C53}$, $Z^{C54}$, $Z^{C55}$ and $Z^{C56}$ each represent preferably a substituted or unsubstituted carbon atom, and more preferably an unsubstituted carbon atom.

$X^{C51}$ and $X^{C52}$ each independently represent an oxygen atom, a sulfur atom, or a substituted or unsubstituted nitrogen atom. $X^{C51}$ and $X^{C52}$ each represent preferably an oxygen atom or a sulfur atom, and more preferably an oxygen atom.

Specific examples of the compound represented by formula (C-1) include Compound Nos. (C1) to (C63) described in JP-A No. 2007-103493, but the present invention is not limited to these examples.

One of the preferable compounds among the metal complexes in the present invention is a compound represented by the following formula (D-1).

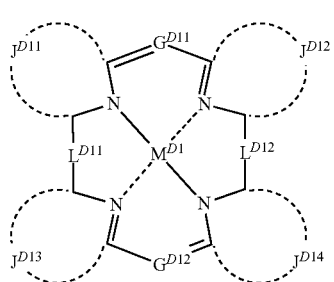

Formula (D-1)

In formula (D-1), $M^{D1}$ represents a metal ion.

$G^{D11}$ and $G^{D12}$ each independently represent a nitrogen atom, or a substituted or unsubstituted carbon atom. $J^{D11}$, $J^{D12}$, $J^{D13}$ and $J^{D14}$ each represent an atomic group necessary for forming a 5-membered ring. $L^{D11}$ and $L^{D12}$ each represent a linking group.

Formula (D-1) is to be described in detail.

In the formula (D-1), $M^{D1}$, $L^{D11}$ and $L^{D12}$ each have the same meaning as $M^{A1}$, $L^{A11}$ and $L^{A12}$ in the above formula (A-1) respectively and a similar preferable range.

$G^{D11}$ and $G^{D12}$ each have the same meaning as $G^{C11}$ and $G^{C12}$ in the above formula (C-1) respectively and a similar preferable range.

$J^{D11}$, $J^{D12}$, $J^{D13}$ and $J^{D14}$ each represent an atomic group necessary for forming a nitrogen-containing 5-membered hetero cyclic ring with the atomic group to which that links.

The compound represented by formula (D-1) is preferably a compound represented by the following formula (D-2), (D-3) or (D-4).

Formula (D-2)

In formula (D-2), $M^{D2}$ represents a metal ion.

$G^{D21}$ and $G^{D22}$ each independently represent a nitrogen atom, or a substituted or unsubstituted carbon atom.

$Y^{D21}$, $Y^{D22}$, $Y^{D23}$ and $Y^{D24}$ each independently represent a nitrogen atom, or a substituted or unsubstituted carbon atom.

$X^{D21}$, $X^{D22}$, $X^{D23}$ and $X^{D24}$ each independently represent an oxygen atom, a sulfur atom, —$NR^{D21}$— or —$C(R^{D22})R^{D23}$—.

$R^{D21}$, $R^{D22}$ and $R^{D23}$ each independently represent a hydrogen atom or a substituent. $L^{D21}$ and $L^{D22}$ each represent a linking group.

Formula (D-3)

In formula (D-3), $M^{D3}$ represents a metal ion.

$G^{D31}$ and $G^{D32}$ each independently represent a nitrogen atom or a substituted or unsubstituted carbon atom.

$Y^{D31}$, $Y^{D32}$, $Y^{D33}$ and $Y^{D34}$ each independently represent a nitrogen atom, or a substituted or unsubstituted carbon atom.

$X^{D31}$, $X^{D32}$, $X^{D33}$ and $X^{D34}$ each independently represent an oxygen atom, a sulfur atom, —$NR^{D31}$— or —$C(R^{D32})R^{D33}$—.

$R^{D31}$, $R^{D32}$ and $R^{D33}$ each independently represent a hydrogen atom or a substituent. $L^{D31}$ and $L^{D32}$ each represent a linking group.

Formula (D-4)

In formula (D-4), $M^{D4}$ represents a metal ion.

$G^{D41}$ and $G^{D42}$ each independently represent a nitrogen atom, or a substituted or unsubstituted carbon atom.

$Y^{D41}$, $Y^{D42}$, $Y^{D43}$ and $Y^{D44}$ each independently represent a nitrogen atom, or a substituted or unsubstituted carbon atom.

$X^{D41}$, $X^{D42}$, $X^{D43}$ and $X^{D44}$ each independently represent an oxygen atom, a sulfur atom, —$NR^{D41}$— or —$C(R^{D42})R^{D43}$—. $R^{D41}$, $R^{D42}$ and $R^{D43}$ each independently represent a hydrogen atom or a substituent. $L^{D41}$ and $L^{D42}$ each represent a linking group.

The compound represented by formula (D-2) is to be described in detail.

$M^{D2}$, $L^{D21}$, $L^{D22}$, $G^{D21}$ and $G^{D22}$ each have the same meaning as $M^{D1}$, $L^{D11}$, $L^{D12}$, $G^{D11}$ and $G^{D12}$ in the above formula (D-1) respectively and a similar preferable range.

$Y^{D21}$, $Y^{D22}$, $Y^{D23}$ and $Y^{D24}$ each independently represent a nitrogen atom, or a substituted or unsubstituted carbon atom, preferably a substituted or unsubstituted carbon atom, and more preferably an unsubstituted carbon atom.

$X^{D21}$, $X^{D22}$, $X^{D23}$ and $X^{D24}$ each independently represent an oxygen atom, a sulfur atom, —$NR^{D21}$— or —$C(R^{D22})R^{D23}$—, preferably a sulfur atom, —$NR^{D21}$— or —$C(R^{D22})R^{D23}$—, more preferably —$NR^{D23}$— or —$C(R^{D22})R^{D23}$—, and even more preferably, —$NR^{D21}$—.

$R^{D21}$, $R^{D22}$ and $R^{D23}$ each independently represent a hydrogen atom or a substituent. Examples of the substituent represented by $R^{D21}$, $R^{D22}$ or $R^{D23}$ include an alkyl group (having preferably 1 to 20 carbon atoms, more preferably 1 to 12 carbon atoms, and even more preferably 1 to 8 carbon atoms; for example, methyl, ethyl, iso-propyl, tert-butyl, n-octyl, n-decyl, n-hexadecyl, cyclopropyl, cyclopentyl, cyclohexyl or the like), an alkenyl group (having preferably 2 to 20 carbon atoms, more preferably 2 to 12 carbon atoms, and even more preferably 2 to 8 carbon atoms; for example, vinyl, allyl, 2-butenyl, 3-pentenyl or the like), an alkynyl, group (having preferably 2 to 20 carbon atoms, more preferably 2 to 12 carbon atoms, and even more preferably 2 to 8 carbon atoms; for example, propargyl, 3-pentinyl or the like), an aryl group (having preferably 6 to 30 carbon atoms, more preferably 6 to 20 carbon atoms, and even more preferably 6 to 12 carbon atoms; for example, phenyl, p-methylphenyl, naphthyl or the like), a substituted carbonyl group (having preferably 1 to 20 carbon atoms, more preferably 1 to 16 carbon atoms, and even more preferably 1 to 12 carbon atoms; for example, acetyl, benzoyl, methoxycarbonyl, phenyloxycarbonyl, dimethylaminocarbonyl, phenylaminocarbonyl or the like), a substituted sulfonyl group (having preferably 1 to 20 carbon atoms, more preferably 1 to 16 carbon atoms, and even more preferably 1 to 12 carbon atoms; for example, mesyl, tosyl or the like), and a heterocyclic group (an aliphatic heterocyclic group and an aromatic heterocyclic group are included. Preferred is a heterocyclic group comprising oxygen, sulfur or nitrogen, having preferably 1 to 50 carbon atoms, more preferably 1 to 30 carbon atoms, and even more preferably 2 to 12 carbon atoms. Examples thereof include an imidazolyl group, a pyridyl group, a furyl group, a piperidyl group, a morpholino group, a benzoxazolyl group, a triazolyl group and the like). $R^{D21}$, $R^{D22}$ and $R^{D23}$ are each preferably an alkyl group, an aryl group or an aromatic heterocyclic group, more preferably an alkyl group or an aryl group, and even more preferably an aryl group.

The compound represented by formula (D-3) is to be described in detail.

$M^{D3}$, $L^{D31}$, $L^{D32}$, $G^{D31}$ and $G^{D32}$ in formula (D-3) each have the same meaning as $M^{D1}$, $L^{D11}$, $L^{D12}$, $G^{D11}$ and $G^{D12}$ in the above formula (D-1) respectively and a similar preferable range.

$X^{D31}$, $X^{D32}$, $X^{D33}$ and $X^{D34}$ each have the same meaning as $X^{D21}$, $X^{D22}$, $X^{D23}$ and $X^{D24}$ in the above formula (D-2) respectively and a similar preferable range.

$Y^{D31}$, $Y^{D32}$, $Y^{D33}$ and $Y^{D34}$ each have the same meaning as $Y^{D21}$, $Y^{D22}$, $Y^{D23}$ and $Y^{D24}$ in the above formula (D-2) respectively and a similar preferable range.

The compound represented by formula (D-4) is to be described in detail.

$M^{D4}$, $L^{D41}$, $L^{D42}$, $G^{D41}$ and $G^{D42}$ in the formula (D-4) each have the same meaning as $M^{D1}$, $L^{D11}$, $L^{D12}$, $G^{D11}$ and $G^{D12}$ in the above formula (D-1) respectively and a similar preferable range.

$X^{D41}$, $X^{D42}$, $X^{D43}$ and $X^{D44}$ each have the same meaning as $X^{D21}$, $X^{D22}$, $X^{D23}$ and $X^{D24}$ in the above formula (D-2) respectively and a similar preferable range. $Y^{D41}$, $Y^{D42}$, $Y^{D43}$ and $Y^{D44}$ each have the same meaning as $Y^{D21}$, $Y^{D22}$, $Y^{D23}$ and $Y^{D24}$ in the above formula (D-2) respectively and a similar preferable range.

Specific examples of the compound represented by formula (D-1) include Compound Nos. (D1) to (D24) described in JP-A No. 2007-103493, but the present invention is not limited to these compounds.

One of the preferable compounds among the metal complexes according to the present invention is a compound represented by the following formula (E-1).

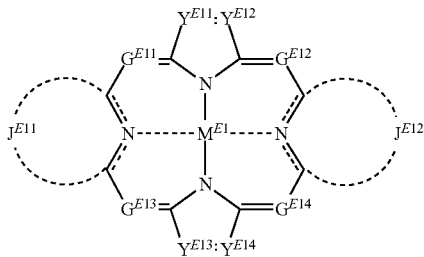

Formula (E-1)

In formula (E-1), $M^{E1}$ represents a metal ion. $J^{E11}$ and $J^{E12}$ each represent an atomic group necessary for forming a 5-membered ring. $G^{E11}$, $G^{E12}$, $G^{E13}$ and $G^{E14}$ each independently represent a nitrogen atom, or a substituted or unsubstituted carbon atom. $Y^{E11}$, $Y^{E12}$, $Y^{E13}$ and $Y^{E14}$ each independently represent a nitrogen atom, or a substituted or unsubstituted carbon atom.

The compound represented by formula (E-1) is to be described in detail.

$M^{E1}$ in formula (E-1) has the same meaning as $M^{A1}$ in the above formula (A-1) and a similar preferable range. $G^{E11}$, $G^{E12}$, $G^{E13}$ and $G^{E14}$ each have the same meaning as $G^{C11}$ and $G^{C12}$ in the above formula (C-1), and a similar preferable range.

$J^{E11}$ and $J^{E12}$ each have the same meaning as $J^{D12}$ to $J^{D14}$ in the above formula (D-1), and a similar preferable range. $Y^{E11}$, $Y^{E12}$, $Y^{E13}$ and $Y^{E14}$ each have the same meaning as $Y^{C21}$ to $Y^{C24}$ in the above formula (C-2), and a similar preferable range.

The compound represented by formula (E-1) is preferably a compound represented by the following formula (E-2) or formula (E-3).

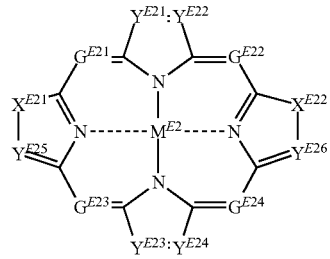

Formula (E-2)

In formula (E-2), $M^{E2}$ represents a metal ion. $G^{E21}$, $G^{E22}$, $G^{E23}$ and $G^{E24}$ each independently represent a nitrogen atom, or a substituted or unsubstituted carbon atom. $Y^{E21}$, $Y^{E22}$, $Y^{E23}$, $Y^{E24}$, $Y^{E25}$ and $Y^{E26}$ each independently represent a nitrogen atom, or a substituted or unsubstituted carbon atom.

$X^{E21}$ and $X^{E22}$ each independently represent an oxygen atom, a sulfur atom, —$NR^{E21}$— or —$C(R^{E22})R^{E23}$—. $R^{E21}$, $R^{E22}$ and $R^{E23}$ each independently represent a hydrogen atom or a substituent.

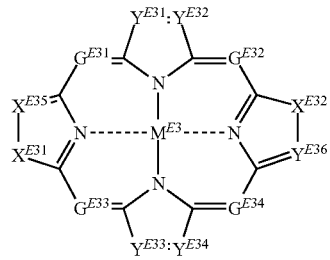

Formula (E-3)

In formula (E-3), $M^{E3}$ represents a metal ion. $G^{E31}$, $G^{E32}$, $G^{E33}$ and $G^{E34}$ each independently represent a nitrogen atom, or a substituted or unsubstituted carbon atom. $Y^{E31}$, $Y^{E32}$, $Y^{E33}$, $Y^{E34}$, $Y^{E35}$ and $Y^{E36}$ each independently represent a nitrogen atom, or a substituted or unsubstituted carbon atom. $X^{E31}$ and $X^{E32}$ each independently represent an oxygen atom, a sulfur atom, —$NR^{E31}$— or —$C(R^{E32})R^{E33}$—. $R^{E53}$, $R^{E32}$ and $R^{B33}$ each independently represent a hydrogen atom or a substituent.

The compound represented by formula (E-2) is to be described in detail.

$M^{E2}$, $G^{E21}$, $G^{E22}$, $G^{E23}$, $G^{E24}$, $Y^{E21}$, $Y^{E22}$, $Y^{E23}$ and $Y^{E24}$ in the formula (E-2) each have the same meaning as $M^{E1}$, $G^{E11}$, $G^{E12}$, $G^{E13}$, $G^{E14}$, $Y^{E11}$, $Y^{E12}$, $Y^{E13}$ and $Y^{E14}$ in the above formula (E-1) respectively, and a similar preferable range. $X^{E21}$ and $X^{E22}$ each have the same meaning as $X^{D21}$ and $X^{D22}$ in the above formula (D-2) and a similar preferable range.

The compound represented by formula (E-3) is to be described in detail.

$M^{E3}$, $G^{E31}$, $G^{E32}$, $G^{E33}$, $G^{E34}$, $Y^{E31}$, $Y^{E32}$, $Y^{E33}$ and $Y^{E34}$ in the formula (E-3) each have the same meaning as $M^{E1}$, $G^{E11}$, $G^{E12}$, $G^{E13}$, $G^{E14}$, $Y^{E11}$, $Y^{E12}$, $Y^{E13}$ and $Y^{E14}$ in the above formula (E-1) respectively, and a similar preferable range. $X^{E31}$ and $X^{E32}$ each have the same meaning as $X^{E21}$ and $X^{E22}$ in the above formula (E-2) and a similar preferable range.

Specific examples of the compound represented by formula (E-1) include Compound Nos. (E1) to (E15) described in JP-A No. 2007-103493, but the present invention is not limited to these compounds.

One of the preferable compounds among the metal complexes according to the present invention is a compound represented by the following formula (F-1).

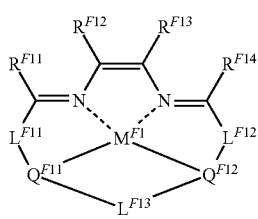

Formula (F-1)

In formula (F-1), $M^{F1}$ represents a metal ion. $L^{F11}$, $L^{F12}$ and $L^{F13}$ each represent a linking group. $R^{F11}$, $R^{F12}$, $R^{F13}$ and $R^{F14}$ each independently represent a hydrogen atom or a substituent. $R^{F11}$ and $R^{F12}$, $R^{F12}$ and $R^{F13}$, or $R^{F13}$ and $R^{F14}$ may combine each other to form a ring if possible, wherein the ring formed by $R^{F11}$ and $R^{F12}$, or $R^{F13}$ and $R^{F14}$ is a 5-membered ring. $Q^{F11}$ and $Q^{F12}$ each represent a partial structure containing an atom which bonds to $M^{F1}$ with a coordination bond, an ionic bond or a covalent bond.

The compound represented by formula (F-1) is to be described in detail.

$M^{F1}$, $L^{F11}$, $L^{F12}$, $L^{F13}$, $Q^{F11}$ and $Q^{F12}$ in formula (F-1) each have the same meaning as $M^{41}$, $L^{A11}$, $L^{A12}$, $L^{A13}$, $Q^{A11}$ and $Q^{A12}$ in the formula (A-1) respectively, and a similar preferable range. $R^{F11}$, $R^{F12}$, $R^{F13}$ and $R^{F14}$ each independently represent a hydrogen atom or a substituent. $R^{F11}$ and $R^{F12}$, $R^{F12}$ and $R^{F13}$, or $R^{F13}$ and $R^{F14}$ may combine each other to form a ring if possible, wherein the ring formed by $R^{F11}$ and $R^{F12}$, or $R^{F13}$ and $R^{F14}$ is a 5-membered ring As the substituent represented by $R^{F11}$, $R^{F12}$, $R^{F13}$ or $R^{F14}$, the substituent explained as the substituent represented by $R^{C11}$ to $R^{C14}$ in the above formula (C-1) can be respectively applied. $R^{F11}$, $R^{F12}$, $R^{F13}$ and $R^{F14}$ are preferably a group forming a 5-membered ring by combining $R^{F11}$ and $R^{F12}$, or $R^{F13}$ and $R^{F14}$, or a group forming an aromatic ring by combining $R^{F12}$ and $R^{F13}$.

The compound represented by formula (F-1) is preferably a compound represented by the following formula (F-2), (F-3) or (F-4).

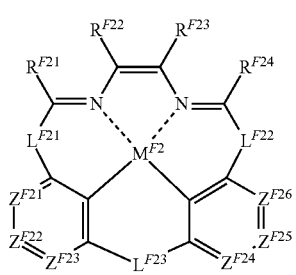

Formula (F-2)

In formula (F-2), $M^{F2}$ represents a metal ion. $L^{F21}$, $L^{F22}$ and $L^{F23}$ each represent a linking group. $R^{F21}$, $R^{F22}$, $R^{F23}$ and $R^{F24}$ each represent a substituent. $R^{F21}$ and $R^{F22}$, $R^{F22}$ and $R^{F23}$, or $R^{F23}$ and $R^{F24}$ may combine each other to form a ring, if possible, wherein the ring formed by $R^{F21}$ and $R^{F22}$ or $R^{F23}$ and $R^{F24}$ is a 5-membered ring. $Z^{F21}$, $Z^{F22}$, $Z^{F23}$, $Z^{F24}$, $Z^{F25}$ and $Z^{F26}$ each independently represent a nitrogen atom, or a substituted or unsubstituted carbon atom.

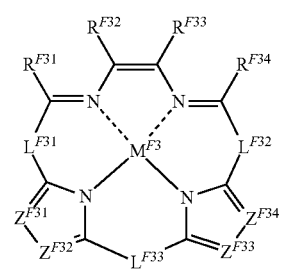

Formula (F-3)

In formula (F-3), $M^{F3}$ represents a metal ion. $L^{F31}$, $L^{F32}$ and $L^{F33}$ each represent a linking group. $R^{F31}$, $R^{F32}$, $R^{F33}$ and $R^{F34}$ each represent a substituent. $R^{F31}$ and $R^{F32}$, $R^{F32}$ and $R^{F33}$, or $R^{F33}$ and $R^{F34}$ may combine each other to form a ring if possible, wherein the ring formed by $R^{F31}$ and $R^{F32}$, or $R^{F33}$ and $R^{F34}$ is a 5-membered ring. $Z^{F31}$, $Z^{F32}$, $Z^{F33}$ and $Z^{F34}$ each independently represent a nitrogen atom, or a substituted or unsubstituted carbon atom.

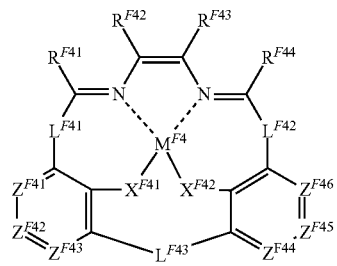

Formula (F-4)

In formula (F-4), $M^{F4}$ represents a metal ion. $L^{F41}$, $L^{F42}$ and $L^{F43}$ each represent a linking group. $R^{F41}$, $R^{F42}$, $R^{F43}$ and $R^{F44}$ represent a substituent. $R^{F41}$ and $R^{F42}$, $R^{F42}$ and $R^{F43}$, or $R^{F43}$ and $R^{F44}$ may combine each other to form a ring, if possible, wherein the ring formed by $R^{F41}$ and $R^{F42}$, or $R^{F43}$ and $R^{F44}$ is a 5-membered ring. $Z^{F41}$, $Z^{F42}$, $Z^{F43}$, $Z^{F44}$, $Z^{F45}$ and $Z^{F46}$ each independently represent a nitrogen atom or a substituted or unsubstituted carbon atom. $X^{F41}$ and $X^{F42}$ each independently represent an oxygen atom, a sulfur atom, or a substituted or unsubstituted nitrogen atom.

The compound represented by formula (F-2) is to be described in detail.

$M^{F2}$, $L^{F21}$, $L^{F22}$, $L^{F23}$, $R^{F21}$, $R^{F22}$, $R^{F23}$ and $R^{F24}$ each have the same meaning as $M^{F1}$ $L^{F11}$, $L^{F12}$, $L^{F13}$, $R^{F11}$, $R^{F12}$, $R^{F13}$ and $R^{F14}$ in the above formula (F-1) respectively and a similar preferable range. $Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom. $Z^{F21}$, $Z^{F22}$, $Z^{F23}$, $Z^{F24}$, $Z^{F25}$ and $Z^{F26}$ each represent preferably a substituted or unsubstituted carbon atom, and more preferably an unsubstituted carbon atom. As the substituent on the carbon atom, the substituent for the divalent linking group represented by $L^{411}$, $L^{412}$, $L^{413}$ or $L^{414}$ in the above formula (A-1) can be applied.

The compound represented by formula (F-3) is to be described in detail.

$M^{F3}$, $L^{F31}$, $L^{F32}$, $L^{F33}$, $R^{F31}$, $R^{F32}$, $R^{F33}$ and $R^{F34}$ in formula (F-3) each have the same meaning as $M^{F1}$, $L^{F11}$, $L^{F12}$, $L^{F13}$, $R^{F11}$, $R^{F12}$, $R^{F13}$ and $R^{F14}$ in the formula (F-1) respectively, and a similar preferable range. $Z^{F31}$, $Z^{F32}$, $Z^{F33}$ and $Z^{F34}$ each independently represent a nitrogen atom, or a substituted or unsubstituted carbon atom. $Z^{F31}$, $Z^{F32}$, $Z^{F33}$ and $Z^{F34}$ each represent preferably a substituted or unsubstituted carbon atom, and more preferably an unsubstituted carbon atom. As the substituent on the carbon atom, the substituent for the divalent linking group represented by $L^{411}$, $L^{412}$, $L^{413}$ or $L^{414}$ in the above formula (A-1) can be applied.

The compound represented by formula (F-4) is to be described in detail.

$M^{F4}$, $L^{F41}$, $L^{F42}$, $L^{F43}$, $R^{F41}$, $R^{F42}$, $R^{F43}$ and $R^{F44}$ in the formula (F-4) each have the same meaning as $M^{F1}$, $L^{F11}$, $L^{F12}$, $L^{F13}$, $R^{F11}$, $R^{F12}$, $R^{F13}$ and $R^{F14}$ in the above formula (F-1) respectively, and a similar preferable range.

$Z^{F41}$, $Z^{F42}$, $Z^{F43}$, $Z^{F44}$, $Z^{F45}$ and $Z^{F46}$ each independently represent a nitrogen atom, or a substituted or unsubstituted carbon atom. $Z^{F41}$, $Z^{F42}$, $Z^{F43}$, $Z^{F44}$, $Z^{F45}$ and $Z^{F46}$ each represent preferably a substituted or unsubstituted carbon atom, and more preferably an unsubstituted carbon atom. As the substituent on the carbon atom, the substituent for the divalent linking group represented by $L^{411}$, $L^{412}$, $L^{413}$ or $L^{414}$ in the above formula (A-1) can be applied.

$X^{F41}$ and $X^{F42}$ each independently represent an oxygen atom, a sulfur atom, or a substituted or unsubstituted nitrogen atom. $X^{F41}$ and $X^{F42}$ each preferably represent an oxygen atom or a sulfur atom, and more preferably an oxygen atom.

Specific examples of the compound represented by formula (F-1) include Compound Nos. (F1) to (F52) described in JP-A No. 2007-103493, but the present invention is not limited to these compounds.

The compounds represented by formula (A-1) to (F-1) described above can be prepared according to methods well known in the art.

(Electron Transporting Host Material)

As the electron transporting host material used in the present invention, it is preferred that an electron affinity Ea of the host material is from 2.5 eV to 3.5 eV, more preferably from 2.6 eV to 3.4 eV, and even more preferably from 2.8 eV to 3.3 eV in view of improvements in durability and decrease in driving voltage. Furthermore, it is preferred that an ionization potential Ip of the host material is from 5.7 eV to 7.5 eV, more preferably from 5.8 eV to 7.0 eV, and even more preferably from 5.9 eV to 6.5 eV in view of improvements in durability and decrease in driving voltage.

Specific examples of the electron transporting host material include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromacyclic tetracarboxylic anhydrides of naphthalene, perylene or the like, phthalocyanine, derivatives thereof (which may form a condensed ring with another ring), and a variety of metal complexes represented by metal complexes of 8-quinolinol derivatives, metal phthalocyanine, and metal complexes having benzoxazole or benzothiazole as the ligand.

Preferable electron transporting host materials are azole derivatives (benzimidazole derivatives, imidazopyridine derivatives and the like), and azine derivatives (pyridine derivatives, pyrimidine derivatives, triazine derivatives and the like). Among these, metal complex compounds thereof are more preferred in the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, a platinum ion or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Organometallic Chemistry—Fundamental and Application—)" authored by Akio Yamamoto, published by Shokabo Publishing Co., Ltd. in 1982; and the like.

The ligands are preferably nitrogen-containing heterocyclic ligands (having preferably 1 to 30 carbon atoms, more preferably 2 to 20 carbon atoms, and particularly preferably 3 to 15 carbon atoms), and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazinyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting host material include compounds described, for example, in JP-A Nos. 2002-235076, 2004-214179, 2004-221062, 2004-221065, 2004-221068, 2004-327313 and the like.

Specific examples of the electron transporting host material include the following materials, but it should be noted that the present invention is not limited thereto.

E-1

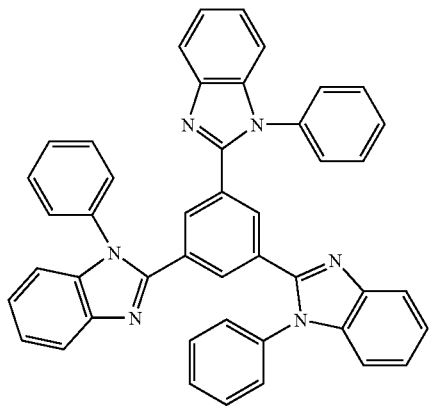

E-2

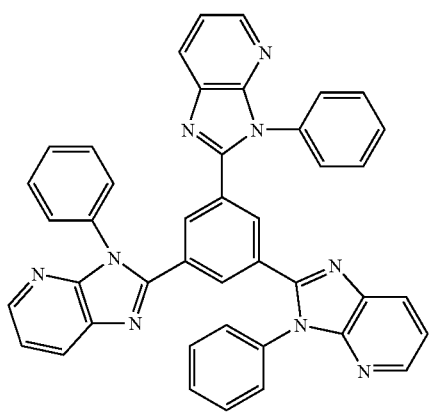

E-3

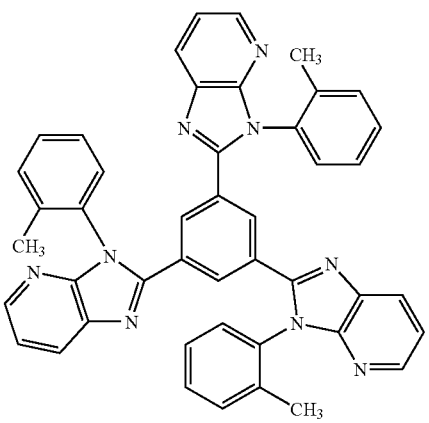

E-4

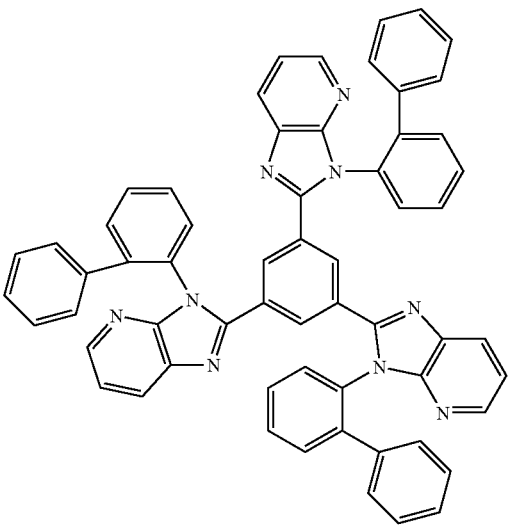

E-5

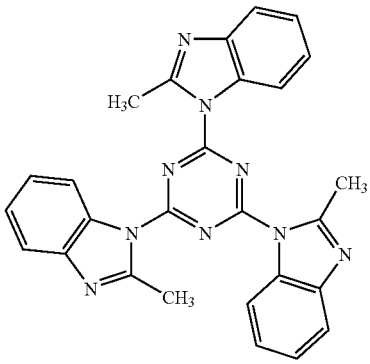

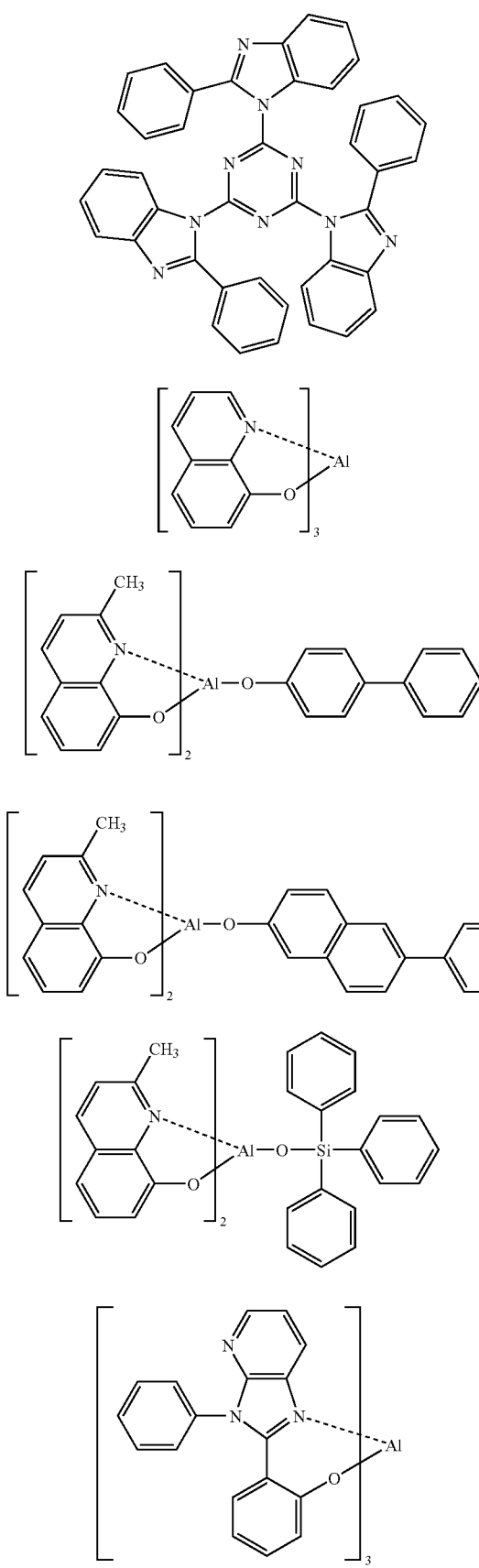

-continued

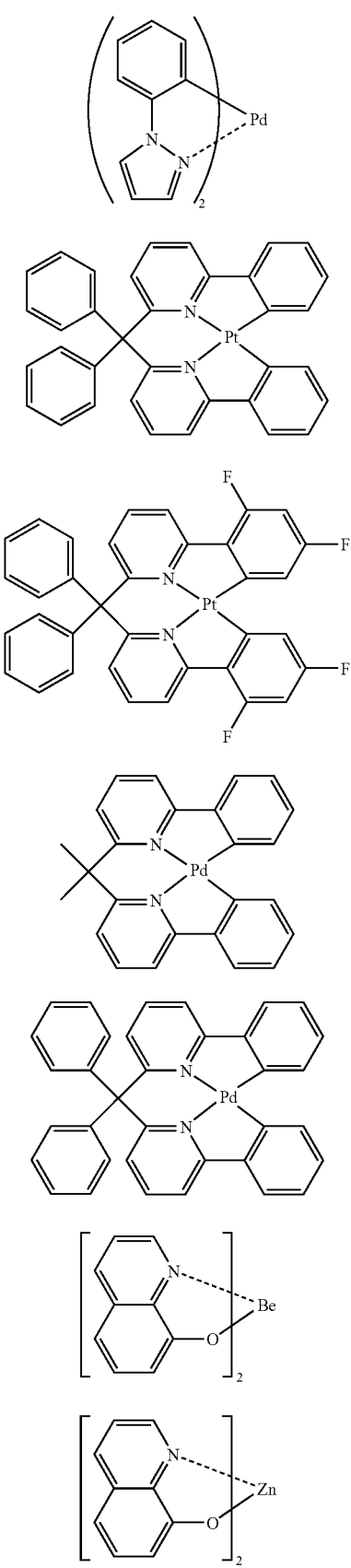

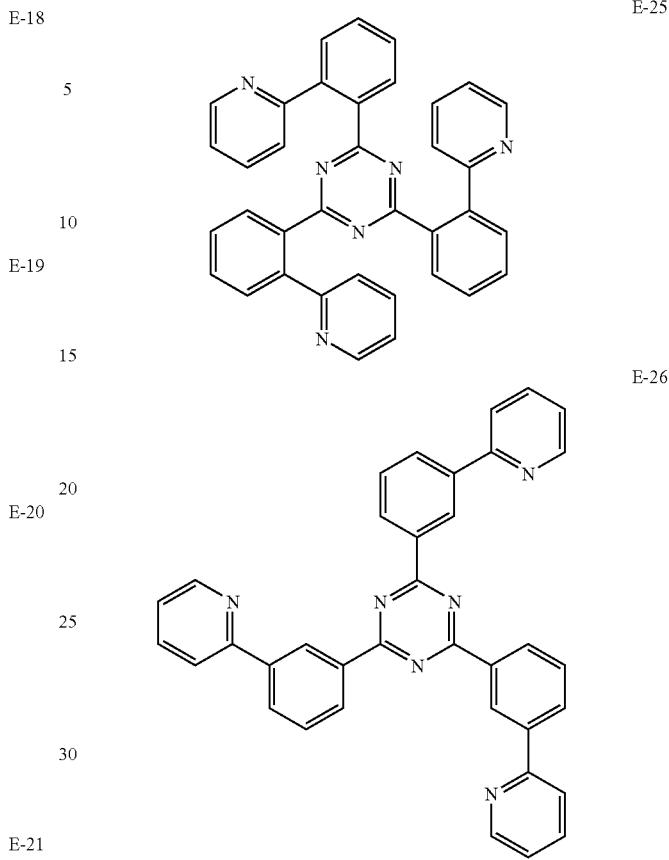

As the electron transporting host material, E-1 to E-6, E-8, E-9, E-10, E-21, or E-22 is preferred, E-3, E-4, E-6, E-8, E-9, E-10, E-21, or E-22 is more preferred, and E-3, E-4, E-8, E-9, E-21, or E-22 is even more preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H) min in the plural host compounds satisfy the relationship of T1(H) min>T1(D) in view of color purity, external quantum efficiency, and driving durability.

(Hole Transporting Host Material)

The hole transporting host material used for the light-emitting layer of the present invention preferably has an ionization potential Ip of from 5.1 eV to 6.4 eV, more preferably from 5.4 eV to 6.2 eV, and even more preferably from 5.6 eV to 6.0 eV in view of improvements in durability and decrease in driving voltage. Furthermore, it preferably has an electron affinity Ea of from 1.2 eV to 3.1 eV, more preferably from 1.4 eV to 3.0 eV, and even more preferably from 1.8 eV to 2.8 eV in view of improvements in durability and decrease in driving voltage.

Specific examples of such hole transporting host material include pyrrole, carbazole, indole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electric conductive high-molecular oligomers such as thiophene oligomers, polythiophenes and the like, organic silanes, carbon films, derivatives thereof, and the like.

Among these, carbazole derivatives, indole derivatives, aromatic tertiary amine compounds, and thiophene derivatives are preferable, and particularly, compounds containing a plurality of carbazole skeletons, indole skeletons and/or aromatic tertiary amine skeletons in the molecule are preferred. Further, the compounds containing carbazole skeletons and/or indole skeletons are more preferred.

As specific examples of the hole transporting host material described above, the following compounds may be listed, but the present invention is not limited thereto.

H-1

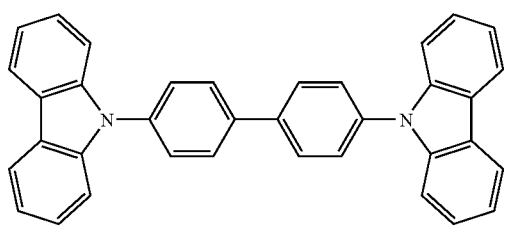

H-2

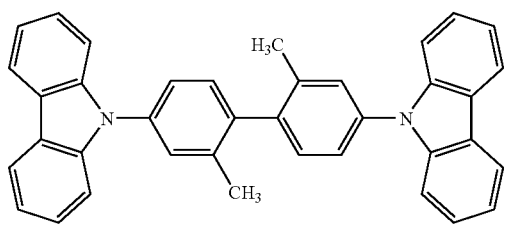

H-3

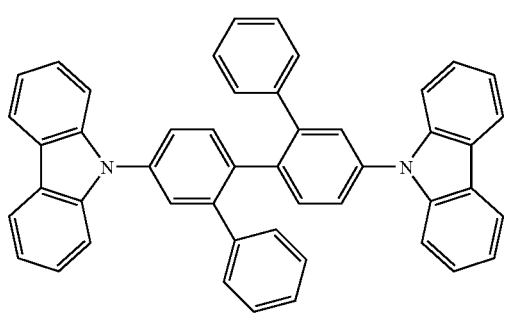

H-4

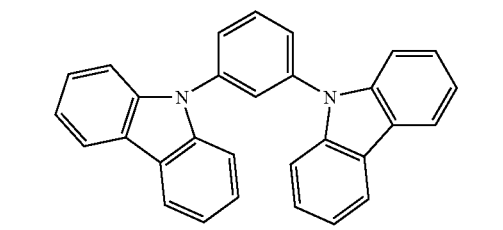

H-5

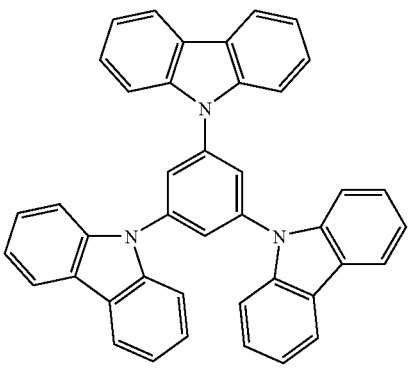

H-6

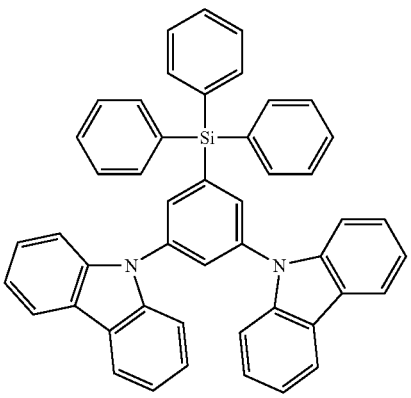

H-7

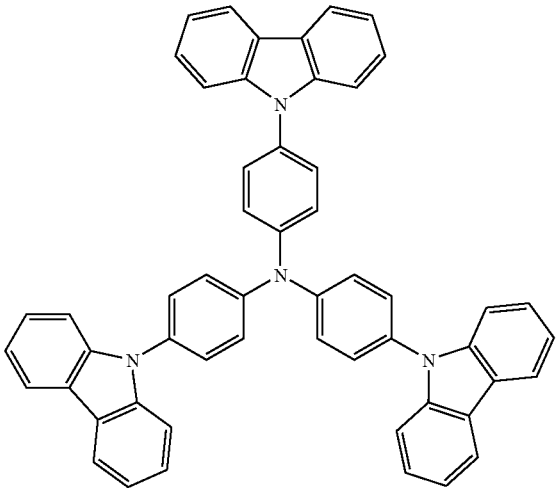

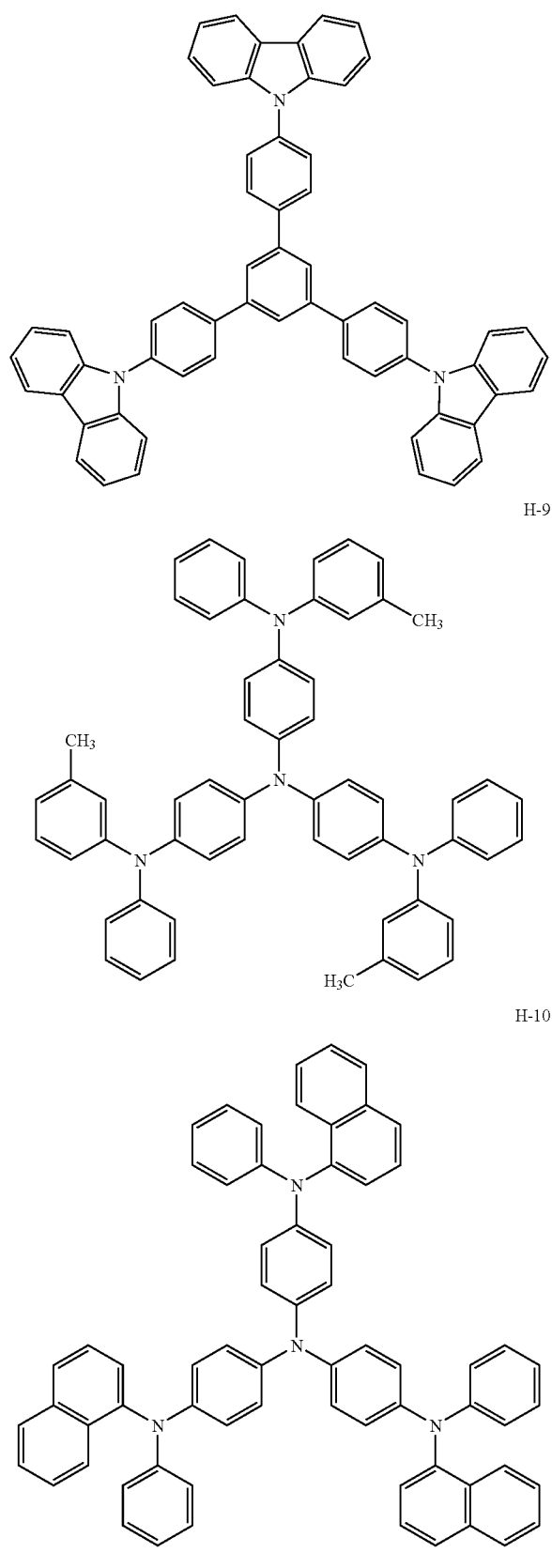

H-15
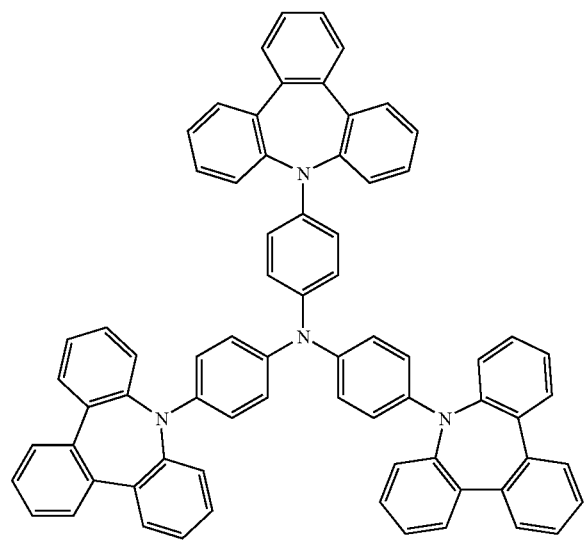
H-18
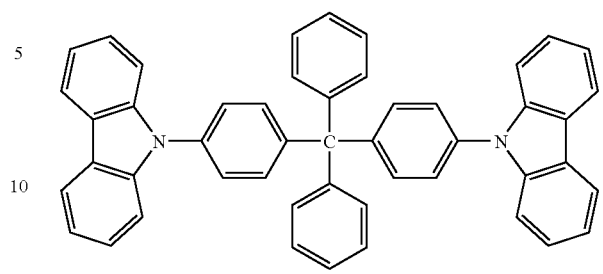
H-16
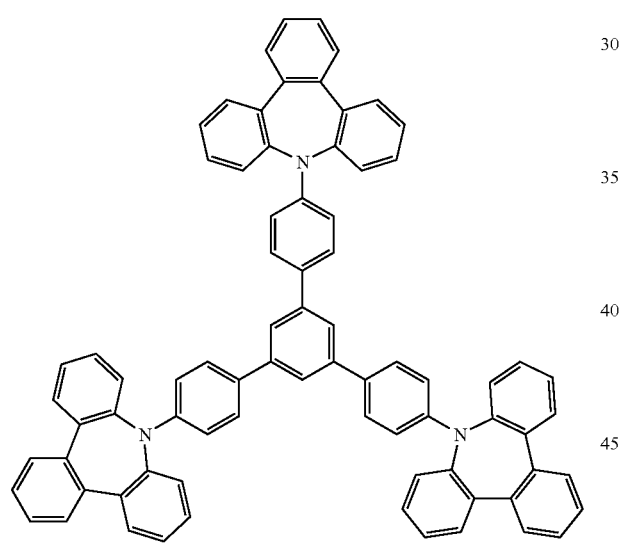
H-19
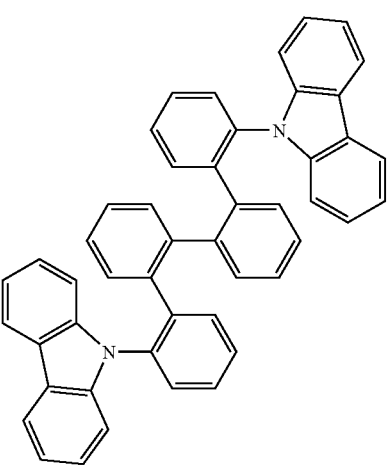
H-17
H-20
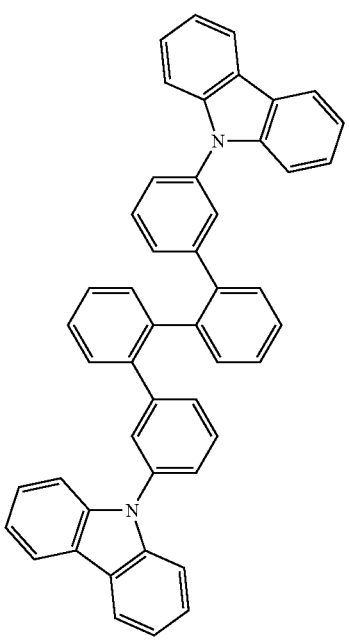

-continued

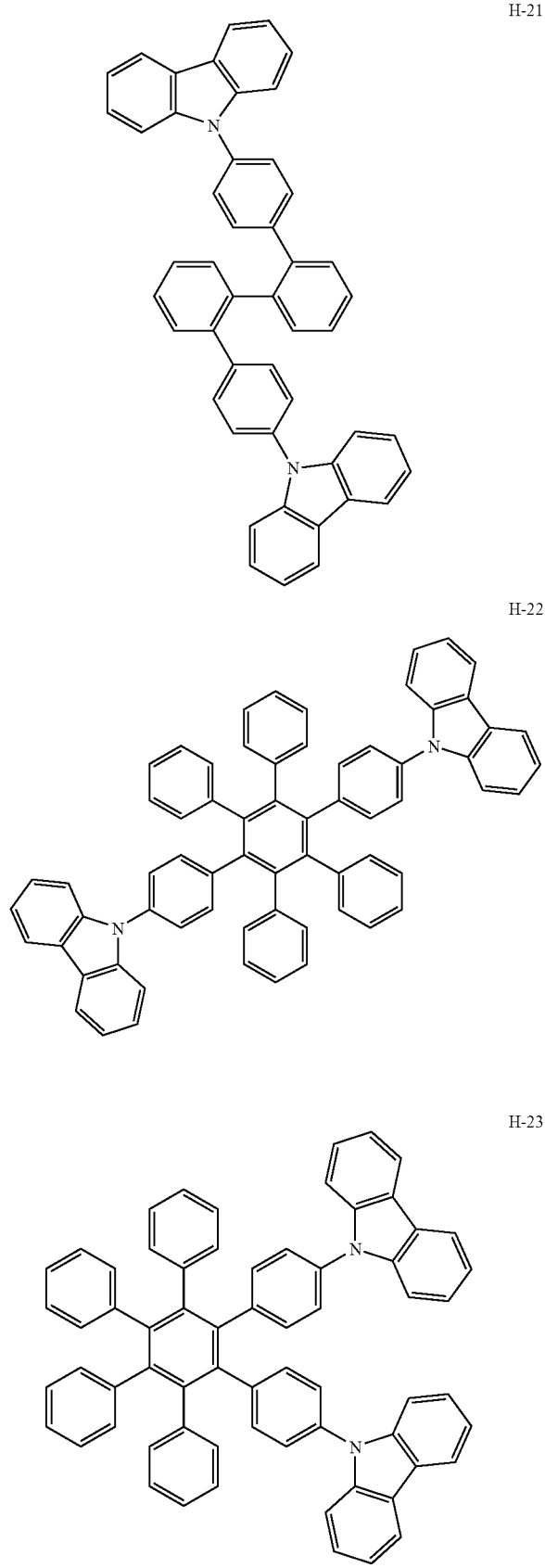

H-21

H-22

H-23

-continued

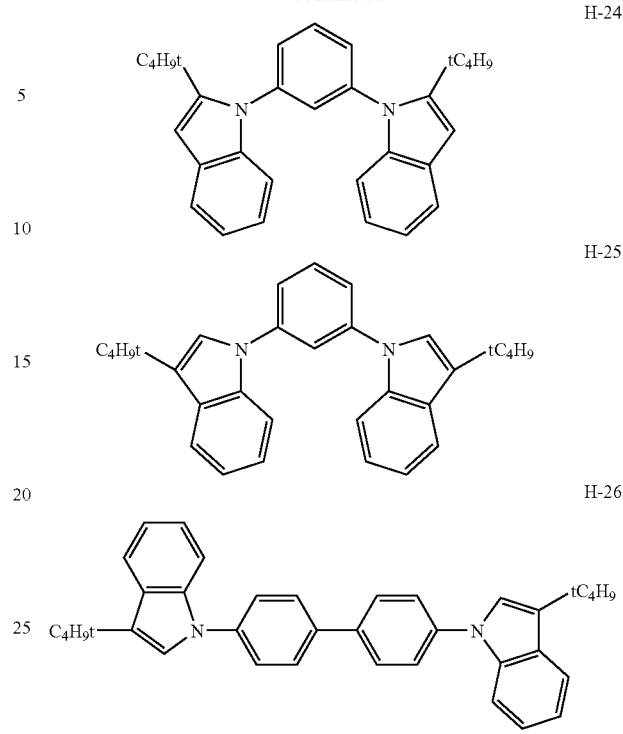

H-24

H-25

H-26

<Mixing Ratio of Hole Transporting Host Material to Electron Transporting Material>

The mixing ratio of the electron transporting material to the hole transporting host material in the light-emitting layer in the invention is from 4:1 to 1:4, and more preferably from 2:1 to 1:2, by weight ratio as the total in the light-emitting layer.

Further, 1% by weight to 70% by weight of the electron transporting material is the light-emitting material.

In the case where the mixing ratio of the electron transporting material to the hole transporting host material is less than the lower limit of the range from 4:1 to 1:4 by weight ratio, the electron transportability in the light-emitting layer is deteriorated, that is not preferred. On the other hand, In the case where the mixing ratio exceeds the upper limit of the range from 4:1 to 1:4, the hole transportability in the light-emitting layer is deteriorated, that is not preferred.

In the case where the light-emitting material in the electron transporting material is less than 1% by weight, light-emission efficiency is lowered, that is not preferred. On the other hand, in the case where it exceeds 70% by weight, color purity is deteriorated due to the occurrence of light-emission having different wavelengths attributed to the aggregate formation.

<Film Thickness>

The film thickness of the light-emitting layer is preferably from 10 nm to 600 nm, and more preferably 20 nm to 300 nm, from viewpoints of light-emission efficiency, driving voltage and brightness. In the case where the thickness of the light-emitting layer is too thin, while driving at high brightness and low voltage is possible, a passage of charges from the light-emitting layer to adjacent layers increases to result in lowering of light-emission efficiency. In the case where the thickness of the light-emitting layer is too thick, driving voltage increases to cause restriction for the application.

<Layer Configuration>

The light-emitting layer may be composed of a single layer or two or more layers, and the respective layers may emit light of different light-emitting colors. Also, in the case where the light-emitting layer has a laminate structure, though the film thickness of each of the layers configuring the laminate structure is not particularly limited, it is preferable that a total film thickness of each of the light-emitting layers falls within the foregoing range.

3. Hole Injection Layer and Hole Transport Layer

The hole injection layer and hole transport layer correspond to layers functioning to receive holes from an anode or from an anode side and to transport the holes to a cathode side.

As specific examples of a material for the hole injection layer and hole transport layer, it is preferred to contain pyrrole derivatives, carbazole derivatives, indole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, organosilane derivatives, carbon, or the like.

An electron-accepting dopant is preferably contained in the hole injection layer and/or the hole transport layer in the organic EL element of the present invention from viewpoints of reducing voltage and enhancing drive durability.

As the electron-accepting dopant to be introduced into the hole injection layer or the hole transport layer, either of an inorganic compound or an organic compound may be used as long as the compound has electron accepting property and a function for oxidizing an organic compound. Specifically, the inorganic compound includes metal halides, such as ferric chloride, aluminum chloride, gallium chloride, indium chloride, antimony pentachloride and the like, and metal oxides such as vanadium pentaoxide, molybdenum trioxide and the like.

In the case of employing the organic compounds, compounds having a substituent such as a nitro group, a halogen, a cyano group, a trifluoromethyl group or the like; quinone compounds; acid anhydride compounds; fullerenes; and the like may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70.

Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferable, and tetrafluorotetracyanoquinodimethane is particularly preferred.

These electron-accepting dopants may be used alone or in a combination of two or more of them. Although an applied amount of these electron-accepting dopants depends on the type of material, 0.01% by weight to 50% by weight is preferred with respect to a hole transport material, 0.05% by weight to 20% by weight is more preferable, and 0.1% by weight to 10% by weight is particularly preferred. When the amount applied is less than 0.01% by weight with respect to the hole transport material, it is not desirable because the advantageous effects of the present invention are insufficient, and when it exceeds 50% by weight, hole transportation ability is deteriorated, and thus, this is not preferred.

A thickness of the hole injection layer and a thickness of the hole transport layer are each preferably 500 nm or less in view of decreasing driving voltage.

The thickness of the hole transport layer is preferably from 1 nm to 500 nm, and more preferably from 5 nm to 100 nm. The thickness of the hole injection layer is preferably from 0.1 nm to 500 nm, and more preferably from 1.0 nm to 300 nm.

The hole injection layer and the hole transport layer may be composed of a monolayer structure comprising one or two or more of the above-mentioned materials, or a multilayer structure composed of plural layers of a homogeneous composition or a heterogeneous composition.

4. Electron Injection Layer and Electron Transport Layer

The electron injection layer and the electron transport layer are layers having functions for receiving electrons from a cathode or a cathode side, and transporting the electrons to an anode side. Specific examples of the materials applied for the electron injection layer and the electron transport layer include triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromacyclic tetracarboxylic anhydrides of perylene, naphthalene or the like, phthalocyanine derivatives, metal complexes represented by metal complexes of 8-quinolinol derivatives, metal phthalocyanine, and metal complexes containing benzoxazole, or benzothiazole as the ligand, organic silane derivatives, and the like.

The electron injection layer and/or the electron transport layer in the organic EL element in the present invention preferably contain an electron donating dopant from viewpoints of reducing voltage and enhancing drive durability.

As the electron donating dopant introduced in the electron injection layer or the electron transport layer, any material may be used as long as it has an electron-donating property and a property for reducing an organic compound, and an alkaline metal such as Li, an alkaline earth metal such as Mg, a transition metal including a rare-earth metal, or a reducing organic compound is preferably used.

As a metal, particularly, a metal having a work function of 4.2 V or less is preferably applied, and specific examples thereof include Li, Na, K, Be, Mg, Ca, Sr, Ba, Y, Cs, La, Sm, Gd, Yb, and the like.

Specific examples of the reducing organic compound include nitrogen-containing compounds, sulfur-containing compounds, phosphorus-containing compounds, and the like. In addition, materials described in JP-A Nos. 6-212153, 2000-196140, 2003-68468, 2003-229278 and 2004-342614 may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and particularly preferably from 2.0% by weight to 70% by weight. When the amount applied is less than 0.1% by weight with respect to the electron transport layer material, it is not desirable because the advantageous effects of the present invention are insufficient, and when it exceeds 99% by weight, electron transporting ability is deteriorated, and thus, this is not preferred.

A thickness of the electron injection layer and a thickness of the electron transport layer are each preferably 500 nm or less in view of decrease in driving voltage.

The thickness of the electron transport layer is preferably from 1 nm to 500 nm, more preferably from 10 nm to 1.00 nm. The thickness of the electron injection layer is preferably from 0.1 nm to 200 nm, and more preferably from 0.5 nm to 50 nm.

The electron injection layer and the electron-transport may be composed of a monolayere structure comprising one or two or more of the above-mentioned materials, or a multilayer structure composed of plural layers of a homogeneous composition or a heterogeneous composition.

In the case where the electron transport layer is an adjacent layer to the light-emitting layer, a material applied therein has preferably an ionization potential of 6.0 eV or less in view of improvement in durability.

5. Substrate

The substrate to be applied in the invention is preferably one which does not scatter or attenuate light emitted from the organic compound layer. Specific examples of materials for the substrate include inorganic materials such as zirconia-stabilized yttrium (YSZ) and glass; polyesters such as polyethylene terephthalate, polybutylene phthalate, and polyethylene naphthalate; and organic materials such as polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulation performance, and workability.

There is no particular limitation as to the shape, the structure, the size or the like of the substrate, but it may be suitably selected according to the application, purpose and the like of the light-emitting element. In general, a plate-like substrate is preferred as the shape of the substrate. A structure of the substrate may be a monolayer structure or a laminate structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hardcoat layer or an under-coat layer may be further provided as needed.

6. Electrode (Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the light-emitting element. As mentioned above, the anode is usually provided as a transparent anode.

Materials for the anode preferably include, for example, metals, alloys, metal oxides, electric conductive compounds, and mixtures thereof. Materials having a work function of 4.0 eV or more are preferable. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; -organic electric conductive materials such as polyaniline, polythiophene, and polypyrrole; and laminates of these inorganic or organic electron-conductive materials with ITO. Among these, the electric conductive metal oxides are preferred, and particularly, ITO is preferable in view of productivity, high electric conductivity, transparency and the like.

The anode may be formed on the substrate in accordance with a method which is appropriately selected from among wet methods such as printing methods, coating methods and the like; physical methods such as vacuum deposition methods, sputtering methods, ionplating methods and the like; and chemical methods such as CVD (chemical vapor deposition) and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ionplating method or the like.

In the organic electroluminescence element of the present invention, a position at which the anode is to be formed is not particularly limited, but it may be suitably selected according to the application and purpose of the light-emitting element. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 μm, and preferably from 50 nm to 20 μm.

A value of electric resistance of the anode is preferably $10^3$ Ω/□ or less, and more preferably $10^2$ Ω/□ or less. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electric conductive compounds, and mixtures thereof. Materials having a work function of 4.5 eV or more are preferable. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as printing methods, coating methods and the like; physical methods such as vacuum deposition methods, sputtering methods, ionplating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The dielectric material layer may be considered to be a kind of electron injection layer. The dielectric material layer may be formed in accordance with, for example, a vacuum deposition method, a sputtering method, an ionplating method or the like.

A thickness of the cathode may be suitably selected according to materials for constituting the cathode and is therefore not definitely decided, but it is usually in a range of from 10 nm to 5 µm, and preferably from 50 nm to 1 µm.

Moreover, the cathode may be transparent or opaque. A transparent cathode may be formed by preparing a material for the cathode with a small thickness of from 1 nm to 10 nm, and further laminating a transparent electric conductive material such as ITO or IZO thereon.

7. Protective Layer

A whole body of the organic EL element of the present invention may be protected by a protective layer.

Any materials may be applied in the protective layer as long as the materials have a function to protect a penetration of ingredients such as moisture, oxygen or the like which accelerates deterioration of the element into the element.

Specific examples of materials for the protective layer include metal such as In, Sn, Pb, Au, Cu, Ag, Al, Ti, Ni, and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ionplating method, a plasma polymerization method (high-frequency excitation ionplating method), a plasma CVD method, a laser CVD method, a thermal CVD method, a gas source CVD method, a coating method, a printing method, or a transfer method may be applied.

8. Sealing

The whole organic electroluminescence element of the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

9. Driving

In the organic electroluminescence element of the present invention, when a DC (AC components may be contained as needed) voltage (usually 2 volts to 15 volts) or DC is applied across the anode and the cathode, luminescence can be obtained.

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

10. Applications

An organic EL element according to the invention has such wide ranging applications as a mobile phone display, a personal digital assistant (PDA), a computer display, a car information display, a TV monitor, and general illumination.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the organic EL element of the present invention will be explained by examples thereof, but the invention is by no means limited by such examples.

Example 1

1. Preparation of Organic EL Element (Preparation of Comparative Organic EL Element No. 1)

A glass substrate (manufactured by Geomatec Co., Ltd., surface electric resistance: 10 Ω/□, size: 0.5 mm in thickness and 2.5 cm square) having a deposited layer of indium-tin oxide (which is hereinafter referred to as ITO) was placed in a cleaning vessel, subjected to an ultrasonic cleaning in 2-propanol and then subjected to an UV-ozone treatment for 30 minutes. On this transparent anode, the following layers were deposited in accordance with a vacuum deposition method. In the examples of the invention, the deposition rate is 0.2 nm/sec unless specified otherwise. The deposition rate was measured using a quartz-crystal oscillator. Also film thicknesses described in the following were measured using a quartz-crystal oscillator.

Hole Injection Layer:
4,4',4''-tris(2-naphthylphenylamino)triphenylamine (which is hereinafter referred to as 2-TNATA) and tetrafluorotetracyanoquinodimethane (which is hereinafter referred to as F4-TCNQ) were co-deposited so that F4-TCNQ was included in an amount of 1.0% by weight with respect to 2-TNATA. The thickness was 160 nm.

Hole Transport Layer:
N,N'-dinaphthyl-N,N'-diphenyl-[1,1'-biphenyl]-4,4'-diamine (which is hereinafter referred to as α-NPD), at a thickness of 10 nm.

Light-emitting layer: 1,3-bis(carbazol-9-yl)benzene (which is referred to as mCP), which is a hole transporting host material, and electron transporting light-emitting material Pt-1 were co-deposited so that Pt-1 was included in an amount of 13% by weight with respect to mCP. The thickness of the light-emitting layer was 60 nm.

Subsequently, on the light-emitting layer, the following electron transport layer and electron injection layer were provided.

Electron Transport Layer: Aluminium (III) bis(2-methyl-8-quinolinato)-4-phenylphenolate (which is hereinafter referred to as BAlq), at a thickness of 40 nm.

Further, lithium fluoride (LiF) was deposited at a thickness of 1 nm, and then, patterning was performed using a shadow mask to provide aluminum metal (Al) with a thickness of 100 nm as a cathode.

Each layer was provided by resistance heating vacuum deposition.

The lamination body thus produced was placed in a glove box substituted with nitrogen gas, and was sealed using a stainless-steel sealing cap and an ultraviolet-curable adhesive (XNR5516HV, manufactured by Nagase-Ciba Co., Ltd.).

(Preparation of Comparative Organic EL Element No. 2)

In the comparative organic EL element No. 1, co-deposition was performed so that Pt-1 was included in an amount of 26% by weight with respect to mCP. The thickness of the light-emitting layer was 60 nm.

(Preparation of Comparative Organic EL Element No. 3)

Preparation of comparative organic EL element No. 3 was conducted in a similar manner to the process in the preparation of the Comparative organic EL element No. 1, except that the light-emitting layer in the comparative organic EL element No. 1 was changed to the following layer.

Light-emitting layer: ternary element co-deposition with mCP, the electron transporting light-emitting material Pt-1 and electron transporting host material ETH-1 was performed so that Pt-1 was included in an amount of 13% by weight with respect to mCP, and ETH-1 was included in an amount of 30% by weight with respect to mCP. The thickness of the light-emitting layer was 60 nm.

(Preparation of Inventive Organic EL Element No. 1)

Preparation of inventive organic EL element No. 1 was conducted in a similar manner to the process in the preparation of the comparative organic EL element No. 3, except that, in the comparative organic EL element No. 3, the light-emitting layer was changed to the following layer.

Figure 1:
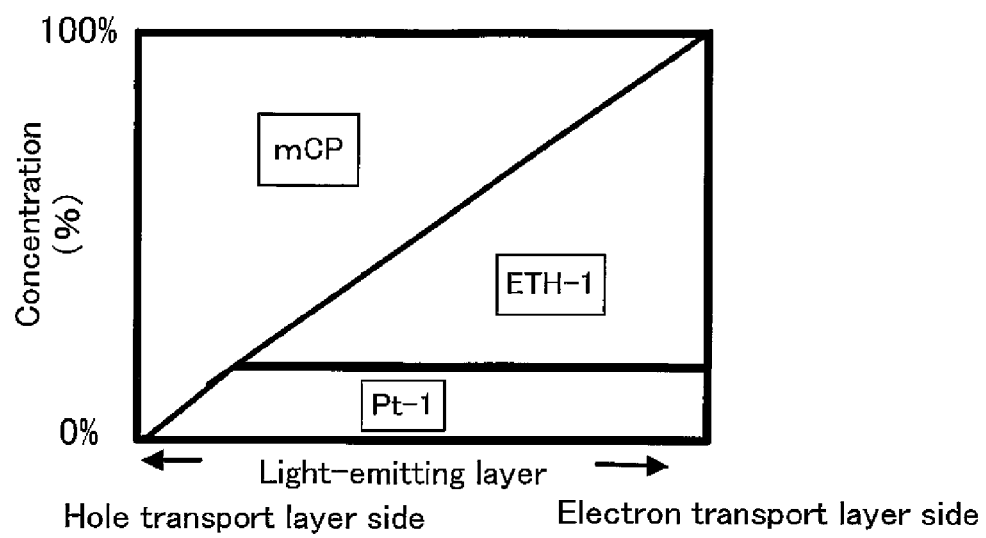
FIG. 1 is a conceptual view showing a concentration distribution of a light-emitting material and a host material in a light-emitting layer.

Light-emitting layer: a layer was formed by changing the co-deposition amounts of the electron transporting light-emitting material Pt-1 and the electron transporting host material ETH-1 with respect to mCP as the deposition was progressing, so that each material has a concentration distribution to the thickness direction of the light-emitting layer shown in FIG. 1. Specifically, the deposition rate of each component was controlled so that: at the interface on the anode side at the beginning of the deposition, the mixing ratio of mCP in the light-emitting layer was 100% by weight and both of the mixing ratios of the electron transporting light-emitting material Pt-1 and the electron transporting host material ETH-1 in the light-emitting layer were 0% by weight; as the deposition progressing, only the mixing ratio of the electron transporting light-emitting material Pt-1 in the light-emitting layer was increased until it became 13% by weight; thereafter, the mixing ratio of the electron transporting host material ETH-1 in the light-emitting layer was increased while keeping the mixing ratio of the electron transporting light-emitting material Pt-1 to the constant value of 13% by weight; and at the-interface on the cathode side at the end of the deposition, the mixing ratio of mCP in the light-emitting layer was 0% by weight, the mixing ratio of the electron transporting light-emitting material Pt-1 in the light-emitting layer was 13% by weight, and the mixing ratio of the electron transporting host material ETH-1 in the light-emitting layer was 87% by weight. The mixing ratio of each component was continuously changed between these interfaces. In the interface region on the anode side, the concentration of each material was as follows: Pt-1 of 5% by weight, mCP of 95% by weight, and ETH-1 of 0% by weight. In the interface region on the cathode side, the concentration of each material was as follows: Pt-1 of 13% by weight, mCP of 5% by weight, and ETH-1 of 82% by weight. Therefore, the ratio of the total concentration of the electron transporting light-emitting material Pt-1 and the electron transporting host material ETH-1 in the anode region relative to the total concentration of the electron transporting light-emitting material Pt-1 and the electron transporting host material ETH-1 in the cathode region (total concentration of electron transporting light-emitting material Pt-1 and electron transporting host material ETH-1 in anode region/total concentration of electron transporting light-emitting material Pt-1 and electron transporting host material ETH-1 in cathode region) was 5.3%.

(Preparation of Inventive Organic EL Element No. 2)

In the inventive organic EL element No. 1, the light-emitting layer was formed by changing the co-deposition amounts of the electron transporting light-emitting material Pt-1 and the electron transporting host material ETH-1 so that each material has a concentration distribution to the thickness direction of the light-emitting layer shown in FIG. 2. Specifically, the deposition rate of each component was controlled so that: at the interface on the anode side at the beginning of the deposition, the mixing ratio of mCP in the light-emitting layer was 100% by weight and both of the mixing ratios of the electron transporting light-emitting material Pt-1 and the electron transporting host material ETH-1 in the light-emitting layer were 0% by weight; and at the interface on the cathode side at the end of the deposition, the mixing ratio of mCP in the light-emitting layer was 0% by weight, the mixing ratio Of the electron transporting light-emitting material Pt-1 in the light-emitting layer was 26% by weight, and the mixing ratio of the electron transporting host material ETH-1 in the light-emitting layer was 74% by weight. The mixing ratio of each component was continuously changed between these interfaces. In the interface region on the anode side, the concentration of each material was as follows: Pt-1 of 1.3% by weight, mCP of 95% by weight, and ETH-1 of 3.7% by weight. In the interface region on the cathode side, the concentration of each material was as follows: Pt-1 of 24.7% by weight, mCP of 5% by weight, and ETH-1 of 70.3% by weight. Therefore, the ratio of the total concentration of the electron transporting light-emitting material Pt-1 and the electron transporting host material ETH-1 in the anode region relative to the total concentration of the electron transporting light-emitting material Pt-1 and the electron transporting host material ETH-1 in the cathode region (total concentration of electron transporting light-emitting material Pt-1 and electron transporting host material ETH-1 in anode region/total concentration of electron transporting light-emitting material Pt-1 and electron transporting host material ETH-1 in cathode region) was 5.3%.

Chemical structures of the compounds used in Examples are shown below.

-continued

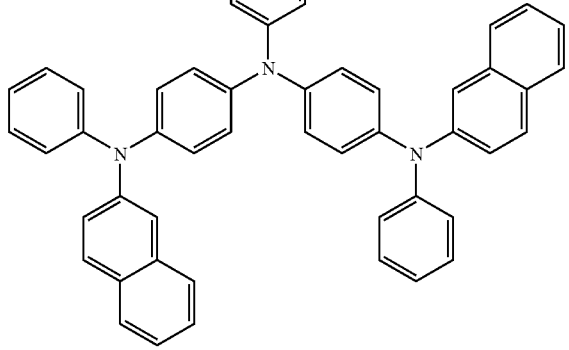

2-TNATA

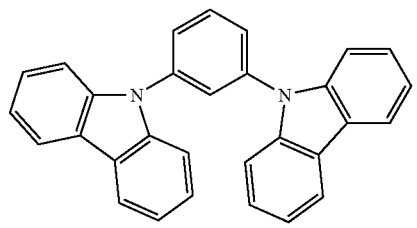

mCP

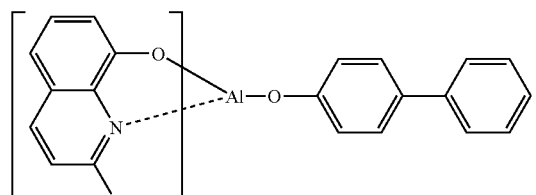

BAlq

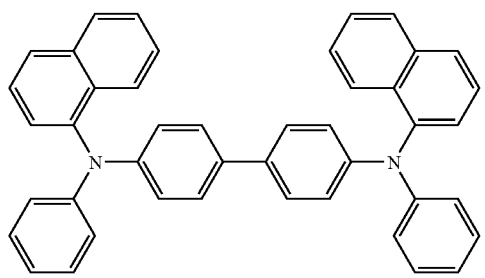

α-NPD

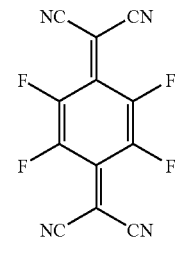

F4-TCNQ

-continued

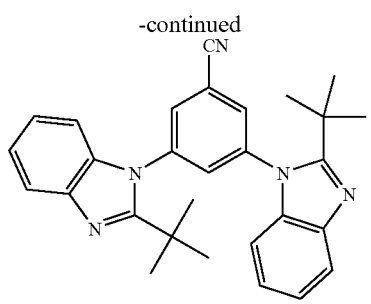

ETH-1

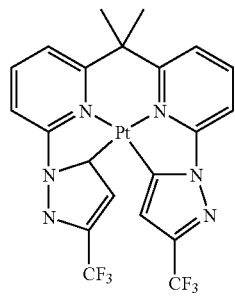

Pt-1

2. Performance Evaluation and Results

External quantum efficiency and drive durability of the obtained comparative organic EL elements and inventive organic EL elements were measured by the following means under the same conditions.

<<Driving Voltage>>

The driving voltage is expressed in terms of DC voltage at a brightness of 360 cd/m$^2$.

<<Method of Measuring External Quantum Efficiency>>

DC voltage was applied to the prepared light-emitting elements with a source measuring unit, model 2400, manufactured by KEITHLEY to emit light having a brightness of 360 cd/m$^2$, and as a high-brightness condition, to emit light having a brightness of 10,000 cd/m$^2$. All elements exhibit a blue-light emission with a peak wavelength of 457 nm. The emission spectrum and light quantity thereof were measured by using a brightness photometer (trade name: SR-3, manufactured by Topcon Corporation), and the external quantum efficiency was calculated from the emission spectrum, the light quantity, and the electric current at the time of measurement.

<<Method of Measuring Drive Durability>>

DC voltage was applied to each element to emit light having a brightness of 360 cd/m$^2$. While applying the current of this condition, each element was subjected to continuous driving, and a brightness half-value time which is the time until the brightness was reduced to 180 cd/m$^2$ was measured. Drive durability is expressed in terms of the brightness half-value time.

The obtained results are shown in Table 1. The inventive organic EL element Nos. 1 and 2 exhibit unexpectedly high external quantum efficiency and excellent drive durability, as compared with the comparative organic EL element Nos. 1 to 3. Particularly, the inventive organic EL element No. 2, in which the concentrations of the electron transporting light-emitting material Pt-1 and electron transporting host material ETH-1 in the light-emitting layer are inclined together, exhibits excellent performance.

Further, concerning the comparative element Nos. 1 to 3, the external quantum efficiency in high-brightness luminescence is low, such as 4.6%, 4.1%, or 5.0%, and decreases in an amount larger than the value in low-brightness luminescence; whereas, concerning the inventive element Nos. 1 and 2, the external quantum efficiency is 10.4% or 10.9% even in high-brightness luminescence, that is to say, the degree of decrease from the external quantum efficiency in low-brightness luminescence is small.

TABLE 1

| Element No. | Driving Voltage (V) | External Quantum Efficiency (%) (at Brightness of 360 cd/m$^2$) | External Quantum Efficiency (%) (at Brightness of 10,000 cd/m$^2$) | Brightness Half-value Time (hr) (at Initial Brightness of 360 cd/m$^2$) |
| --- | --- | --- | --- | --- |
| Comparative Element No. 1 | 11.8 | 6.3 | 4.6 | 500 |
| Comparative Element No. 2 | 10.5 | 5.3 | 4.1 | 520 |
| Comparative Element No. 3 | 9.7 | 7.1 | 5.0 | 700 |
| Inventive Element No. 1 | 8.4 | 11.3 | 10.4 | 1400 |
| Inventive Element No. 2 | 8.0 | 12.0 | 10.9 | 1500 |

Example 2

1. Preparation of Organic EL Element (Preparation of Comparative Organic EL Element No. 4)

Preparation of comparative organic EL element No. 4 was conducted in a similar manner to the process in the preparation of the comparative organic EL clement No. 1, except that, in the comparative organic EL element No. 1, mCP included in the light-emitting layer was changed to mCP derivative A.

(Preparation of Inventive Organic EL Element No. 3)

Preparation of inventive organic EL element No. 3 was conducted in a similar manner to the process in the preparation of the inventive organic EL element No. 2, except that, in the inventive organic EL element No. 2, mCP included in the light-emitting layer was changed to the mCP derivative A.

Chemical structure of the compound used in Examples is shown below.

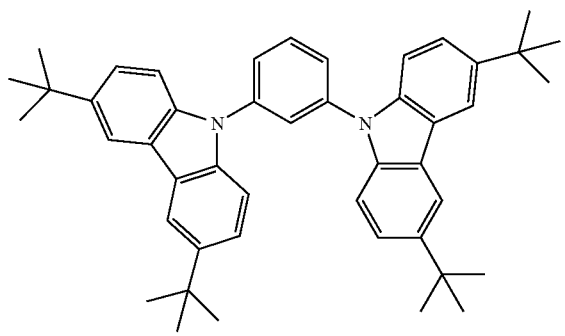

mCP Derivative A

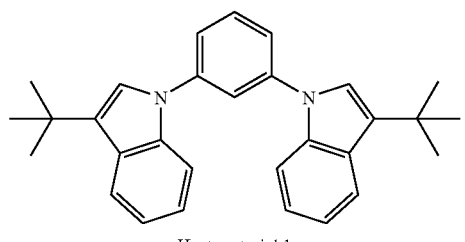

Host material 1

2. Performance Evaluation and Results

Driving voltage, external quantum efficiency and drive durability of the obtained comparative organic EL element and inventive organic EL element were measured by means similar to that in Example 1.

The obtained results are shown in Table 2. The inventive organic EL element No. 3 exhibits unexpectedly high external quantum efficiency and excellent drive durability, as compared with the comparative organic EL element No. 4. In the inventive element, the degree of decrease in external quantum efficiency at high brightness is small.

TABLE 2

| Element No. | Driving Voltage (V) | External Quantum Efficiency (%) (at Brightness of 360 cd/m$^2$) | External Quantum Efficiency (%) (at Brightness of 10,000 cd/m$^2$) | Brightness Half-value Time (hr) (at Initial Brightness of 360 cd/m$^2$) |
|---|---|---|---|---|
| Comparative Element No. 4 | 14.5 | 7.6 | 5.4 | 400 |
| Inventive Element No. 3 | 10.9 | 13.6 | 12.4 | 1350 |

2. Performance Evaluation and Results

Driving voltage, external quantum efficiency and drive durability of the obtained comparative organic EL element and inventive organic EL element were measured by means similar to that in Example 1.

The obtained results are shown in Table 3. The inventive organic EL element No. 4 exhibits unexpectedly high external quantum efficiency and excellent drive durability, as compared with the comparative organic EL element No. 5. Concerning the inventive element, the degree of decrease in external quantum efficiency at high brightness is small.

TABLE 3

| Element No. | Driving Voltage (V) | External Quantum Efficiency (%) (at Brightness of 360 cd/m$^2$) | External Quantum Efficiency (%) (at Brightness of 10,000 cd/m$^2$) | Brightness Half-value Time (hr) (at Initial Brightness of 360 cd/m$^2$) |
|---|---|---|---|---|
| Comparative Element No. 5 | 12.6 | 8.4 | 6.5 | 900 |
| Inventive Element No. 4 | 9.0 | 14.3 | 12.9 | 2500 |

Example 3

1. Preparation of Organic EL Element (Preparation of Comparative Organic EL Element No. 5)

Preparation of comparative organic EL element No. 5 was conducted in a similar manner to the process in the preparation of the comparative organic EL element No. 1, except that, in the comparative organic EL element No. 1, mCP included in the light-emitting layer was changed to host material 1.

(Preparation of Inventive Organic EL Element No. 4)

Preparation of inventive organic EL element No. 4 was conducted in a similar manner to the process in the preparation of the inventive organic EL element No. 2, except that, in the inventive organic EL element No. 2, mCP included in the light-emitting layer was changed to the host material 1.

Chemical structure of the compound used in Examples is shown below.

Example 4

1. Preparation of Organic EL Element (Preparation of Inventive Organic EL Element No. 5)

Preparation of inventive organic EL element No. 5 was conducted in a similar manner to the process in the preparation of the comparative organic EL element No. 1, except that, in the comparative organic EL element No. 1, the light-emitting layer was changed to the following layer.

Light-emitting layer: a layer was formed so that each material has a concentration distribution to the thickness direction of the light-emitting layer shown in FIG. 3 by stepwise increasing the co-deposition amounts of the electron transporting light-emitting material Pt-1 and the electron transporting host material ETH-1 with respect to mCP as the deposition was progressing. Specifically, the light-emitting layer (having a total thickness of 60 nm) was formed by ten stages, in which the thickness of one stage was 6 nm.

A dope ratio of the electron transporting light-emitting material Pt-1 in each stage, from the hole transport layer side (anode side) toward the electron transport layer side (cathode side), was as follows: 1% by weight/4% by weight/7% by weight/9% by weight/12% by weight/14% by weight/17% by weight/20% by weight/22% by weight/25% by weight; and a dope ratio of the electron transporting host material ETH-1 in each stage, from the hole transport layer side toward the electron transport layer side was as follows: 4% by weight/11% by weight/19% by weight/26% by weight/33% by weight/41% by weight/48% by weight/56% by weight/63% by weight/70% by weight.

2. Performance Evaluation and Results

Driving voltage, external quantum efficiency and drive durability of the obtained inventive organic EL element were measured by means similar to that in Example 1.

The obtained results are shown in Table 4. The inventive organic EL element No. 5 exhibits unexpectedly high external quantum efficiency and excellent drive durability, as compared with the comparative organic EL element No. 1 in Example 1. Concerning the inventive element, the degree of decrease in external quantum efficiency at high brightness is small.

TABLE 4

| Element No. | Driving Voltage (V) | External Quantum Efficiency (%) (at Brightness of 360 cd/m$^2$) | External Quantum Efficiency (%) (at Brightness of 10,000 cd/m$^2$) | Brightness Half-value Time (hr) (at Initial Brightness of 360 cd/m$^2$) |
|---|---|---|---|---|
| Comparative Element No. 1 | 11.8 | 6.3 | 4.6 | 500 |
| Inventive Element No. 5 | 8.3 | 11.7 | 10.5 | 1400 |

What is claimed is:

1. An organic electroluminescence element comprising at least a light-emitting layer disposed between a pair of electrodes, wherein the light-emitting layer comprises at least two electron transporting materials and a hole transporting host material, with at least one of the electron transporting materials being an electron transporting light-emitting material, each of the at least two electron transporting materials is present over the entire region of the light-emitting layer, and a concentration of each of the at least two electron transporting materials in the light-emitting layer decreases from a cathode side toward an anode side; and wherein the total concentration of the at least two electron transporting materials is 20% by weight or less in an interface region of the light-emitting layer on the anode side and the total concentration of the at least two electron transporting materials is 80% by weight or more in an interface region of the light-emitting layer on the cathode side.

2. The organic electroluminescence element according to claim 1, wherein the electron transporting light-emitting material is a phosphorescent light-emitting material.

3. The organic electroluminescence element according to claim 2, wherein the phosphorescent light-emitting material is a metal complex having a tri- or higher-dentate ligand.

4. The organic electroluminescence element according to claim 1, wherein the hole transporting host material is a carbazole derivative or an indole derivative.

5. The organic electroluminescence element according to claim 4, wherein the hole transporting host material is 1,3-bis(carbazole-9-yl)benzene or a derivative thereof.

6. The organic electroluminescence element according to claim 1, wherein the at least two electron transporting materials comprise the electron transporting light-emitting material and an electron transporting host material; and wherein the electron transporting host material is an azole derivative or an azine derivative.

7. The organic electroluminescence element according to claim 1, wherein a peak wavelength of an emission spectrum is 430 nm or more, and less than 480 nm.

8. The organic electroluminescence element according to claim 1, wherein the total concentration of the at least two electron transporting materials in the light-emitting layer decreases stepwise from the cathode side toward the anode side.

* * * * *